US012570868B2

(12) United States Patent
Jung et al.

(10) Patent No.: US 12,570,868 B2
(45) Date of Patent: Mar. 10, 2026

(54) LIGHT-EMITTING ELEMENT SOLVENT, PHOTODEGRADABLE THICKENER, LIGHT-EMITTING ELEMENT INK, AND METHOD FOR MANUFACTURING DISPLAY DEVICE

(71) Applicant: Samsung Display Co., Ltd., Yongin-si (KR)

(72) Inventors: Jae Hoon Jung, Seoul (KR); Hee Yeon Yoo, Hwaseong-si (KR); Hye Jung Hong, Cheonan-si (KR); Hyo Jin Ko, Seoul (KR); Duk Ki Kim, Suwon-si (KR); Jun Bo Sim, Seongnam-si (KR); Sung Chan Jo, Seoul (KR); Jong Hyuk Kang, Suwon-si (KR); Keun Kyu Song, Seongnam-si (KR); Hyun Min Cho, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 1200 days.

(21) Appl. No.: 17/593,438

(22) PCT Filed: Mar. 3, 2020

(86) PCT No.: PCT/KR2020/003010

§ 371 (c)(1),
(2) Date: Sep. 17, 2021

(87) PCT Pub. No.: WO2020/189924

PCT Pub. Date: Sep. 24, 2020

(65) Prior Publication Data

US 2022/0204796 A1 Jun. 30, 2022

(30) Foreign Application Priority Data

Mar. 18, 2019 (KR) ........................ 10-2019-0030502
Jan. 23, 2020 (KR) ........................ 10-2020-0009463

(51) Int. Cl.
*C09D 11/50* (2014.01)
*H01L 25/075* (2006.01)
(Continued)

(52) U.S. Cl.
CPC .......... *C09D 11/50* (2013.01); *H01L 25/0753* (2013.01); *H10H 20/01* (2025.01); *H10K 71/441* (2023.02)

(58) Field of Classification Search
None
See application file for complete search history.

(56) References Cited

U.S. PATENT DOCUMENTS 10,442,994 B2 10/2019 Eckert et al.
10,947,403 B2 3/2021 Isonaka et al.
(Continued)

FOREIGN PATENT DOCUMENTS

CN 106009930 A 10/2016
CN 106029836 A 10/2016
(Continued)

OTHER PUBLICATIONS

International Search Report for corresponding Application No. PCT/KR2020/003010 dated Jun. 18, 2020 (4 pages).
(Continued)

*Primary Examiner* — Alexander M Weddle
(74) *Attorney, Agent, or Firm* — Womble Bond Dickinson (US) LLP

(57) ABSTRACT

A method for manufacturing a display device comprises the steps of: spraying, on a target substrate having a first electrode and a second electrode formed thereon, an element ink comprising a first element solvent and light-emitting elements dispersed in the first element solvent; forming a second element solvent in which at least some bonds of the first element solvent are decomposed by irradiating light to
(Continued)

the first element solvent and mounting the light-emitting elements on the first electrode and the second electrode; and removing the second element solvent.

11 Claims, 39 Drawing Sheets

(51) Int. Cl.

| | |
|---|---|
| ***H01L 33/00*** | (2010.01) |
| ***H10H 20/01*** | (2025.01) |
| *H10K 71/40* | (2023.01) |

(56) References Cited

U.S. PATENT DOCUMENTS

| | | | |
|---|---|---|---|
| 2004/0051817 A1* | 3/2004 | Takahashi ............ | B41J 2/04588 349/1 |
| 2006/0280879 A1 | 12/2006 | Park | |
| 2007/0153371 A1 | 7/2007 | Cha et al. | |
| 2011/0177304 A1 | 7/2011 | Rokuhara | |
| 2012/0001124 A1 | 1/2012 | Ishino et al. | |
| 2016/0115383 A1 | 4/2016 | Kuzumoto et al. | |
| 2021/0139730 A1 | 5/2021 | Isonaka et al. | |

FOREIGN PATENT DOCUMENTS

| | | | |
|---|---|---|---|
| JP | 2010206115 | A * | 9/2010 |
| JP | 2015090427 | A | 5/2015 |
| JP | 2019-052240 | A | 4/2019 |
| KR | 10-2006-0130388 | A | 12/2006 |
| KR | 10-2007-0072296 | A | 7/2007 |
| KR | 10-0768706 | B1 | 10/2007 |
| KR | 10-2011-0056383 | A | 5/2011 |
| KR | 10-2013-0044116 | A | 5/2013 |
| KR | 10-2013-0108575 | A | 10/2013 |
| KR | 10-2014-0044263 | A | 4/2014 |
| KR | 10-2014-0060222 | A | 5/2014 |
| KR | 10-2018-0024308 | A | 3/2018 |
| KR | 10-1869631 | B1 | 6/2018 |
| KR | 10-2020-0050000 | A | 5/2020 |
| WO | 2012-031096 | A2 | 3/2012 |
| WO | 2018123821 | A1 | 7/2018 |

OTHER PUBLICATIONS

Extended European Search Report issued Oct. 21, 2022, in corresponding EP Patent Application No. EP 20773528.3 (7 pages).

Iese J et al., "Thermal [2 + 2] Cycloreversion of a Cyclobutane Moiety Via a Biradical Reaction", J. Phys. Chem. A (2011), 115, pp. 2927-2932 (6 pages).

Notice of Allowance issued Aug. 26, 2024, in corresponding Korean Patent Application No. KR 10-2020-0009463 (3 pages).

Chinese Office Action issued Feb. 27, 2025, in corresponding Chinese Patent Application No. CN 202080022254.7 (9 pages).

* cited by examiner

150: 151, 152

150: 151, 152

LIGHT-EMITTING ELEMENT SOLVENT, PHOTODEGRADABLE THICKENER, LIGHT-EMITTING ELEMENT INK, AND METHOD FOR MANUFACTURING DISPLAY DEVICE

CROSS-REFERENCE TO RELATED APPLICATION

This application is a U.S. National Phase Patent Application of International Patent Application Number PCT/KR2020/003010, filed on Mar. 3, 2020, which claims priority to Korean Patent Application Number 10-2019-0030502, filed on Mar. 18, 2019, and Korean Patent Application Number 10-2020-0009463, filed on Jan. 23, 2020, the entire content of all of which is incorporated herein by reference.

BACKGROUND

1. Field

The disclosure relates to a light-emitting element solvent, a photodegradable thickener, a light-emitting element ink, and a method for manufacturing a display device.

2. Description of Related Art

The importance of display devices is increasing with the development of multimedia. Accordingly, various types (or kinds) of display devices such as organic light-emitting display (OLED) devices and/or liquid crystal display (LCD) devices are being used.

A display panel such as an OLED panel or an LCD panel is a device included in a display device to display an image. Among such display panels, a light-emitting element may be provided as a light-emitting display panel, and examples of a light-emitting diode (LED) include an organic LED (OLED) using an organic material as a fluorescent material and an inorganic LED using an inorganic material as a fluorescent material.

An inorganic LED using an inorganic semiconductor as a fluorescent material has durability even in a high-temperature environment and has higher efficiency in blue light compared to the organic LED. In a manufacturing process of a related art inorganic LED element, a transfer method using a dielectrophoresis (DEP) method has been developed. Accordingly, research is being continuously conducted on the inorganic light-emitting diode having higher durability and efficiency than the organic light-emitting diode.

A display device including inorganic LEDs may be manufactured through an inkjet printing process in which light-emitting elements having a small size are dispersed in an ink and then sprayed on electrodes. Each of the light-emitting elements may include semiconductor layers and thus may be made of materials having a relatively large specific gravity. The viscosity of the ink may determine the precipitation speed of the light-emitting elements and the likelihood of ejection through a nozzle.

For example, when the viscosity of the ink is low, the ink may be smoothly ejected through a nozzle, but the precipitation speed of the light-emitting elements dispersed in the ink may be high. On the other hand, when the viscosity of the ink is high, the precipitation speed of the light-emitting elements may be slowed down, but ejection through the nozzle may be impossible or difficult. Furthermore, a solvent other than the light-emitting elements must be removed from the ink sprayed on the electrodes. However, when the viscosity of the ink is high, the solvent is not smoothly (e.g., easily) removed.

SUMMARY

Aspects of embodiments of the present disclosure provide a light-emitting element solvent including a photodegradable functional group in which at least one chemical bond is decomposed by irradiated light, and a light-emitting element ink including the light-emitting element solvent.

Aspects of embodiments of the present disclosure also provide a photodegradable thickener in which a molecular chain is decomposed when light is irradiated.

Aspects of embodiments of the present disclosure also provide a method for manufacturing a display device using a light-emitting element ink which includes the light-emitting element solvent and light-emitting elements dispersed in the light-emitting element solvent.

Aspects of embodiments of the present disclosure also provide a light-emitting element ink whose viscosity is controlled by the photodegradable thickeners and light-emitting elements included therein, and a method for manufacturing a display device using the light-emitting element ink.

It should be noted that aspects of the disclosure are not limited thereto and other aspects, which are not mentioned herein, will be apparent to those of ordinary skill in the art from the following description.

According to one or more embodiments of the disclosure, a method for manufacturing a display device comprises spraying, on a target substrate having a first electrode and a second electrode formed thereon, an element ink comprising a first element solvent and light-emitting elements dispersed in the first element solvent, forming a second element solvent in which at least some bonds of the first element solvent are decomposed by irradiating light to the first element solvent and mounting the light-emitting elements on the first electrode and the second electrode, and removing the second element solvent.

The first element solvent may comprise a photodegradable functional group in which at least any one chemical bond is capable of being decomposed by irradiated light, and a first functional group and a second functional group which are bonded to the photodegradable functional group and are each independently represented by Chemical Formula 1 below, and the first element solvent may be at least one of compounds represented by Chemical Formulae 2 through 5 below:

Chemical Formula 1

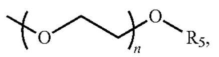

wherein n is an integer of 1 to 5, a sum of an n value of the first functional group and an n value of the second functional group is in a range of 2 to 6, and $R_5$ is any one selected from a C1-C5 alkyl group, a C2-C5 alkenyl group, a C2-C5 alkynyl group, a C1-C5 alkyl ether group, and a C2-C5 alkenyl ether group, and Chemical Formula 2

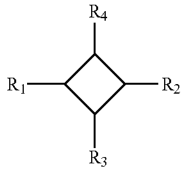

Chemical Formula 3

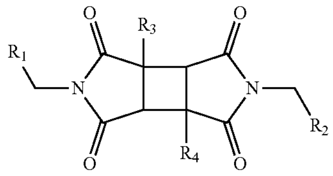

Chemical Formula 4

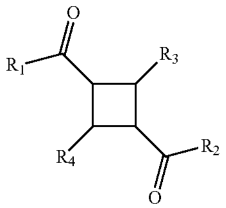

Chemical Formula 5

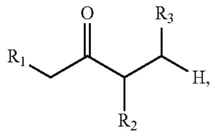

wherein $R_1$ and $R_2$ are represented by Chemical Formula 1, a sum of an n value in Chemical Formula 1 of $R_1$ and an n value in Chemical Formula 1 of $R_2$ is in a range of 2 to 6, and $R_3$ and $R_4$ are each independently any one selected from a C1-C10 alkyl group, a C2-C10 alkenyl group, a C2-C10 alkynyl group, a C1-C10 alkyl ether group, and a C2-C10 alkenyl ether group.

In the forming of the second element solvent, at least some bonds of the photodegradable functional group may be decomposed by the irradiated light to form at least one photodegraded fragment, and the second element solvent may comprise the at least one photodegraded fragment.

The photodegraded fragment may be bonded to at least one of the first functional group or the second functional group.

A molecular weight of the second element solvent may be 50% or less of a molecular weight of the first element solvent.

The first element solvent may have a viscosity of 7 to 15 cp, and the second element solvent may have a viscosity of 5 cp or less.

The mounting of the light-emitting elements may comprise forming an electric field on the second element solvent, and aligning orientation directions of the light-emitting elements by the electric field.

The light-emitting elements may extend in one direction, and an acute angle formed by the one direction in which the light-emitting elements extend and a direction perpendicular to a direction in which the first electrode and second electrode extend may be in a range of 88 to 90 degrees.

According to one or more embodiments of the disclosure, a light-emitting element solvent dispersing semiconductor crystals comprises a photodegradable functional group in which at least one chemical bond is capable of being decomposed by irradiated light, and a first functional group and a second functional group different from each other and bonded to the photodegradable functional group, the light-emitting element solvent being represented by Formula 1 below, wherein the at least one chemical bond of the photodegradable functional group is decomposed by the irradiated light to form at least one photodegraded fragment:

X1-P-X2, Formula 1 wherein P is the photodegradable functional group, X1 is the first functional group, and X2 is the second functional group.

The first functional group and the second functional group may be represented by Chemical Formula 1 below, and the light-emitting element solvent may be any one of compounds represented by Chemical Formulae 2 through 5 above.

The light-emitting element solvent may be a compound represented by Chemical Formula 6 below:

Chemical Formula 6

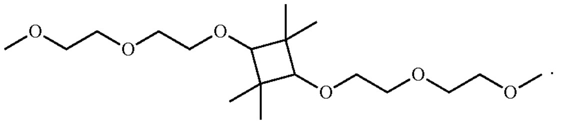

The light-emitting element solvent may form a first element solvent represented by Formula 1 above, wherein when irradiated with the light, the first element solvent may form a second element solvent comprising the photodegraded fragment.

The photodegraded fragment may be bonded to at least one selected from the first functional group and the second functional group.

A molecular weight of the second element solvent may be 50% or less of a molecular weight of the first element solvent.

The first element solvent may have a viscosity of 7 to 15 cp, and the second element solvent may have a viscosity of 5 cp or less.

According to one or more embodiments of the disclosure, a light-emitting element ink comprises a light-emitting element which comprises a semiconductor crystal and an insulating film around an outer peripheral surface of the semiconductor crystal, and a light-emitting element solvent in which one or more light-emitting elements are dispersed, wherein the light-emitting element solvent comprises a photodegradable functional group in which at least any one chemical bond is capable of being decomposed by irradiated light; and a first functional group and a second functional group which are bonded to the photodegradable functional group and each independently are represented by Chemical Formula 1 below, and the light-emitting element solvent is any one of compounds represented by Chemical Formulae 2 through 5 above.

The light-emitting element solvent may be a compound represented by Chemical Formula 6 above.

The chemical bond of the photodegradable functional group of the light-emitting element solvent may be decomposed by the irradiated light to form at least one photodegraded fragment, and the photodegraded fragment may be bonded to at least one of the first functional group or the second functional group.

A viscosity of the light-emitting element solvent may be reduced as the chemical bond of the photodegradable functional group is decomposed by the irradiated light.

The semiconductor crystal may comprise a first semiconductor layer which is doped with a first conductivity type, a second semiconductor layer which is doped with a second conductivity type having a different polarity from the first conductivity type, and an active layer between the first semiconductor layer and the second semiconductor layer.

According to one or more embodiments of the disclosure, a method for manufacturing a display device, the method comprises preparing a light-emitting element ink which comprises a solvent and a plurality of light-emitting elements and photodegradable thickeners dispersed in the solvent, spraying the light-emitting element ink on a target substrate on which a first electrode and a second electrode are formed, and irradiating light to the light-emitting element ink and mounting the light-emitting elements on the first electrode and the second electrode Each of the photodegradable thickeners may comprise a third functional group capable of forming a hydrogen bond, and a photodegradable functional group which is bonded to the third functional group and in which a bond is capable of being decomposed by irradiated light, the photodegradable functional group being represented by any one of Formulae 2 through 5 below:

Formula 2

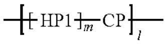

Formula 3

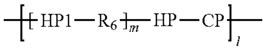

Formula 4

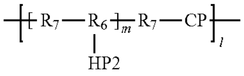

Formula 5

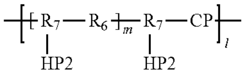

, wherein 'HP1' and 'HP2' are third functional groups, 'HP1' is any one selected from an amine group (—NH—), an amino group (—CONH—), a urea group (—NHCONH—) and a urethane group (—NHCOO—), 'HP2' is a hydroxyl group (—OH) or an amine group (—$NH_2$), 'CP' is a photodegradable functional group, '$R_6$' is any one selected from a C1-C5 alkyl group, a C2-C5 alkenyl group, a C2-C5 alkynyl group, a C1-C5 alkyl ether group, and a C2-C5 alkenyl ether group, $R_7$ is any one selected from an acryl group, a methacryl group, an ester group, and a carbonate group, m is an integer of 1 to 3, and I is an integer of 10 to 100.

Each of the photodegradable thickeners may be represented by any one of Chemical Formulae 7 through 11 below:

Formula 7

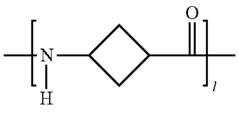

-continued

Formula 8

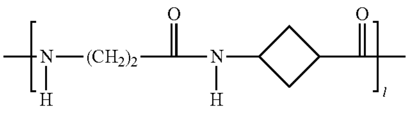

Formula 9

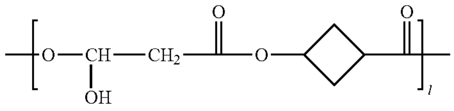

Formula 10

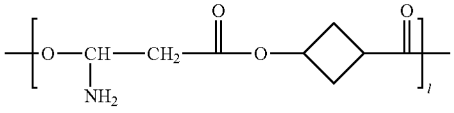

Formula 11

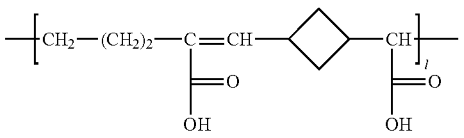

, wherein I is an integer of 10 to 100.

In the preparing of the light-emitting element ink, the photodegradable thickeners may form a network structure as the third functional groups form intermolecular hydrogen bonds.

The light-emitting element ink may have a viscosity of 30 to 70 cP when shear stress is not applied.

In the spraying of the light-emitting element ink, the hydrogen bond of the third functional group in each of the photodegradable thickeners may be decomposed.

the light-emitting element ink may have a viscosity of 5 to 15 cP when shear stress is applied.

When irradiated with the light, each of the photodegradable thickeners may form a plurality of fragment molecules as the photodegradable functional group is decomposed.

The mounting of the light-emitting elements may comprise forming an electric field on the first electrode and the second electrode, aligning orientation directions of the light-emitting elements by the electric field, and removing the solvent and the fragment molecules.

The removing of the solvent and the fragment molecules may be performed through a heat treatment process at 200 to 400° C.

The light-emitting elements may extend in one direction, and an acute angle formed by the one direction in which the light-emitting elements extend and a direction in which the first electrode and second electrode extend may be in a range of 88 to 90 degrees.

According to one or more embodiments of the disclosure, a light-emitting element ink comprises a solvent, light-emitting elements which are dispersed in the solvent and each comprise a plurality of semiconductor layers and an insulating film partially around outer surfaces of the semiconductor layers, and photodegradable thickeners which are dispersed in the solvent, wherein each of the photodegradable thickeners comprises a third functional group capable of forming a hydrogen bond and a photodegradable functional group which is bonded to the third functional group and in which a bond is capable of being decomposed by irradiated light, and the photodegradable thickener is represented by any one of Formulae 2 through 5 above.

The photodegradable functional group may comprise any one selected from a cyclobutyl group, a maleic imide dimer, an acrylate dimer, and a carbonyl group.

Each of the photodegradable thickeners is represented by any one of Chemical Formulae 7 through 11 above.

When shear stress is not applied, the photodegradable thickeners may form a network structure as the third functional groups form intermolecular hydrogen bonds.

The light-emitting element ink may have a viscosity of 30 to 70 cP when shear stress is not applied.

When shear stress is applied, the intermolecular hydrogen bonds of the third functional groups of the photodegradable thickeners may be decomposed.

The light-emitting element ink may have a viscosity of 5 to 15 cP when shear stress is applied.

The semiconductor layers of each of the light-emitting elements may comprise a first semiconductor layer, a second semiconductor layer and an active layer between the first semiconductor layer and the second semiconductor layer, and the insulating film may be around an outer surface of at least the active layer.

According to one or more embodiments of the disclosure, a photodegradable thickener comprises a third functional group capable of forming a hydrogen bond, and a photodegradable functional group which is bonded to the third functional group and in which a bond is capable of being decomposed by irradiated light, the photodegradable thickener being represented by any one of Formulae 2 through 5 above.

Further details of other embodiments are included in the detailed description and the accompanying drawings.

A light-emitting element solvent according to one or more embodiments includes a photodegradable functional group and a first functional group and a second functional group bonded to the photodegradable functional group. As a chemical bond of the photodegradable functional group is partially decomposed by irradiated light, viscosity may be reduced. Accordingly, light-emitting elements included in a light-emitting element ink may be dispersed in the light-emitting element solvent having the reduced viscosity.

In addition, in a method for manufacturing a display device according to one or more embodiments, a process of aligning light-emitting elements is performed using a light-emitting element solvent with a reduced viscosity in which the light-emitting elements are dispersed. Therefore, a display device having an improved degree of alignment of the light-emitting elements on electrodes can be manufactured.

A photodegradable thickener according to one or more embodiments may include a functional group which can form a hydrogen bond and a photodegradable functional group in which a bond is decomposed by light irradiation. When there is no flow, the photodegradable thickener may have a high viscosity due to the hydrogen bond formed by the polymerizable group. However, when shear stress is applied to the photodegradable thickener, the photodegradable thickener may have a low viscosity without forming the hydrogen bond.

A light-emitting element ink according to one or more embodiments may include a solvent, light-emitting elements, and the photodegradable thickeners. Therefore, when there is no flow of the ink, the solvent may have a high viscosity due to the photodegradable thickeners, and the light-emitting elements can be kept dispersed for a long time. When the ink is ejected through a nozzle, shear stress is applied to the solvent and the photodegradable thickeners. Accordingly, the viscosity of the solvent may be reduced, and the light-emitting elements may be ejected from the nozzle in a state in which they are dispersed in the solvent. In addition, when light is irradiated to (e.g., on) the ink sprayed on a target substrate, photodegradable functional groups of the thickeners may be decomposed, and the ink can be easily removed at a certain temperature as its viscosity is reduced.

Accordingly, according to one or more embodiments, a display device including light-emitting elements can be manufactured through an inkjet printing method by using a light-emitting element ink including the light-emitting elements and photodegradable thickeners.

The effects according to the embodiments are not limited by the contents described above, and more various effects are included in this disclosure.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

The disclosure will now be described more fully hereinafter with reference to the accompanying drawings, in which embodiments of the present disclosure are shown. This present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments will be described with reference to the accompanying drawings.

Figure 1:
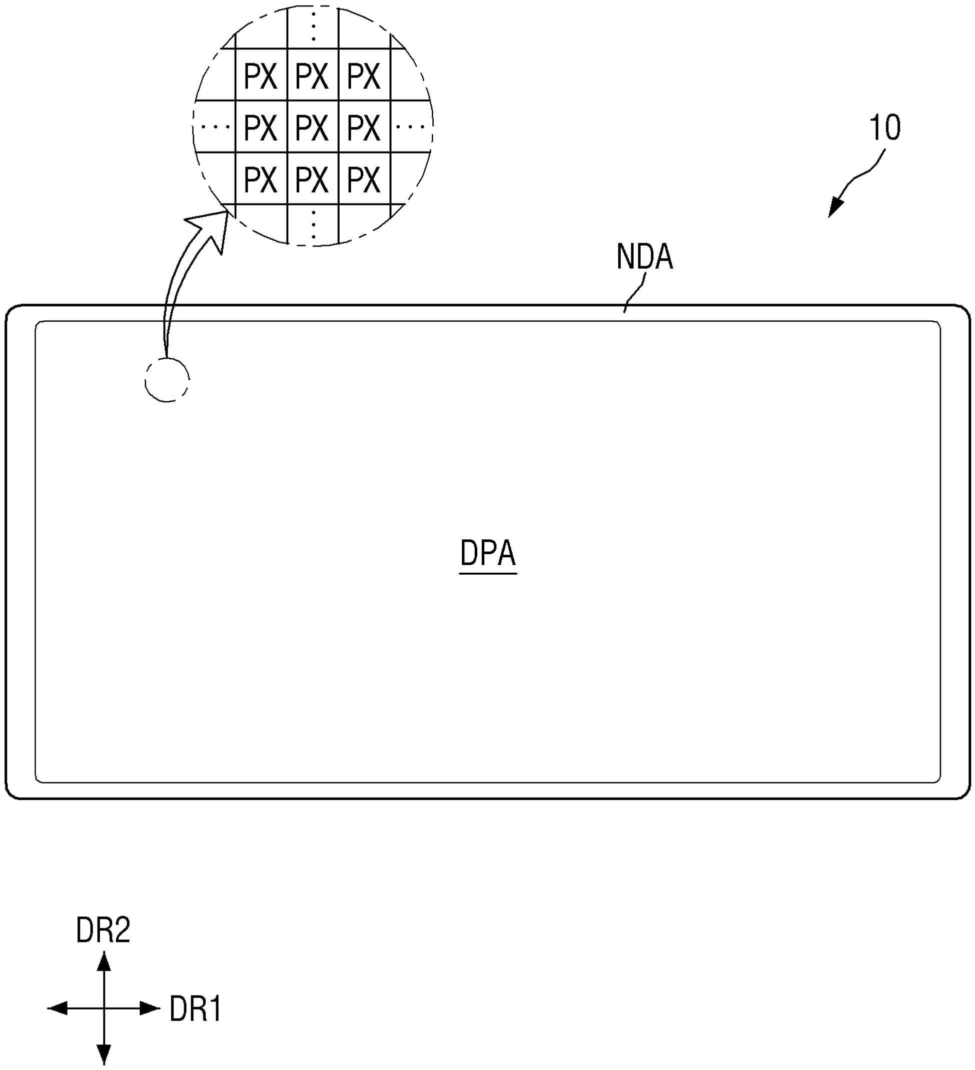
FIG. 1 is a plan view of a display device according to one or more embodiments.

FIG. 1 is a plan view of a display device according to one or more embodiments.

Referring to FIG. 1, the display device 10 displays moving images or still images. The display device 10 may refer to any suitable electronic device that provides a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders, all of which provide a display screen.

The display device 10 includes a display panel that provides a display screen. Examples of the display panel include inorganic light emitting diode display panels, organic light emitting display panels, quantum dot light emitting display panels, plasma display panels, and field emission display panels. A case where an inorganic light emitting diode display panel is applied as an example of the display panel will be described below, but the disclosure is not limited to this case, and other suitable display panels can also be applied, as long as the same technical spirit is applicable.

The shape of the display device 10 can be variously suitably modified. For example, the display device 10 may have various suitable shapes such as a horizontally long (e.g., horizontally extended) rectangle, a vertically long (e.g., vertically extended) rectangle, a square, a quadrangle with rounded corners (vertices), other polygons, and a circle. The shape of a display area DPA of the display device 10 may also be similar to the overall shape of the display device 10. In FIG. 1, the display device 10 and the display area DPA having a horizontally long rectangular shape are illustrated.

The display device 10 may include the display area DPA and a non-display area NDA. The display area DPA may be an area where a screen (e.g., an image) can be displayed, and the non-display area NDA may be an area where no screen (e.g., no image) is displayed. The display area DPA may also be referred to as an active area, and the non-display area NDA may also be referred to as an inactive area. The display area DPA may generally occupy the center of the display device 10.

The display area DPA may include a plurality of pixels PX. The pixels PX may be arranged in a matrix direction (e.g., a matrix formation). Each of the pixels PX may be rectangular or square in plan view. However, the disclosure is not limited thereto, and each of the pixels PX may also have a rhombic planar shape having each side inclined with respect to a direction. The pixels PX may be alternately arranged in a stripe pattern or a PenTile®/PENTILE® pattern (PENTILE® is a registered trademark owned by Samsung Display Co., Ltd.). In one or more embodiments, each of the pixels PX may include one or more light-emitting elements 30 which emit light of a set or specific wavelength band to display a specific color.

The non-display area NDA may be around the display area DPA. The non-display area NDA may entirely or partially surround the display area DPA. The display area DPA may be rectangular, and the non-display area NDA may be adjacent to four sides of the display area DPA. The non-display area NDA may form a bezel of the display device 10. In the non-display area NDA, wirings and/or circuit drivers included in the display device 10 may be located, and/or external devices may be mounted.

Figure 2:
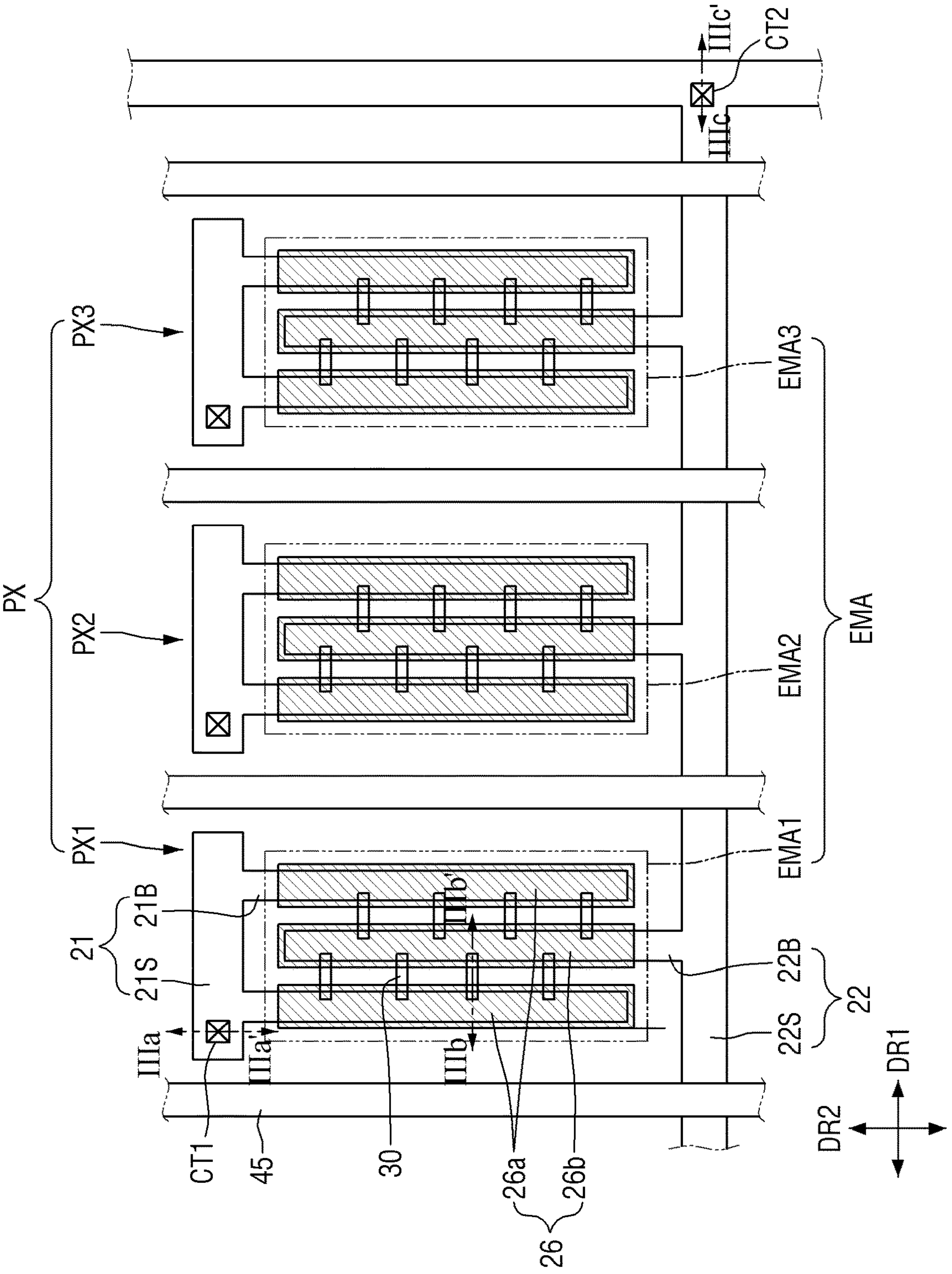
FIG. 2 is a plan view of a pixel of the display device according to one or more embodiments.
Figure 3:
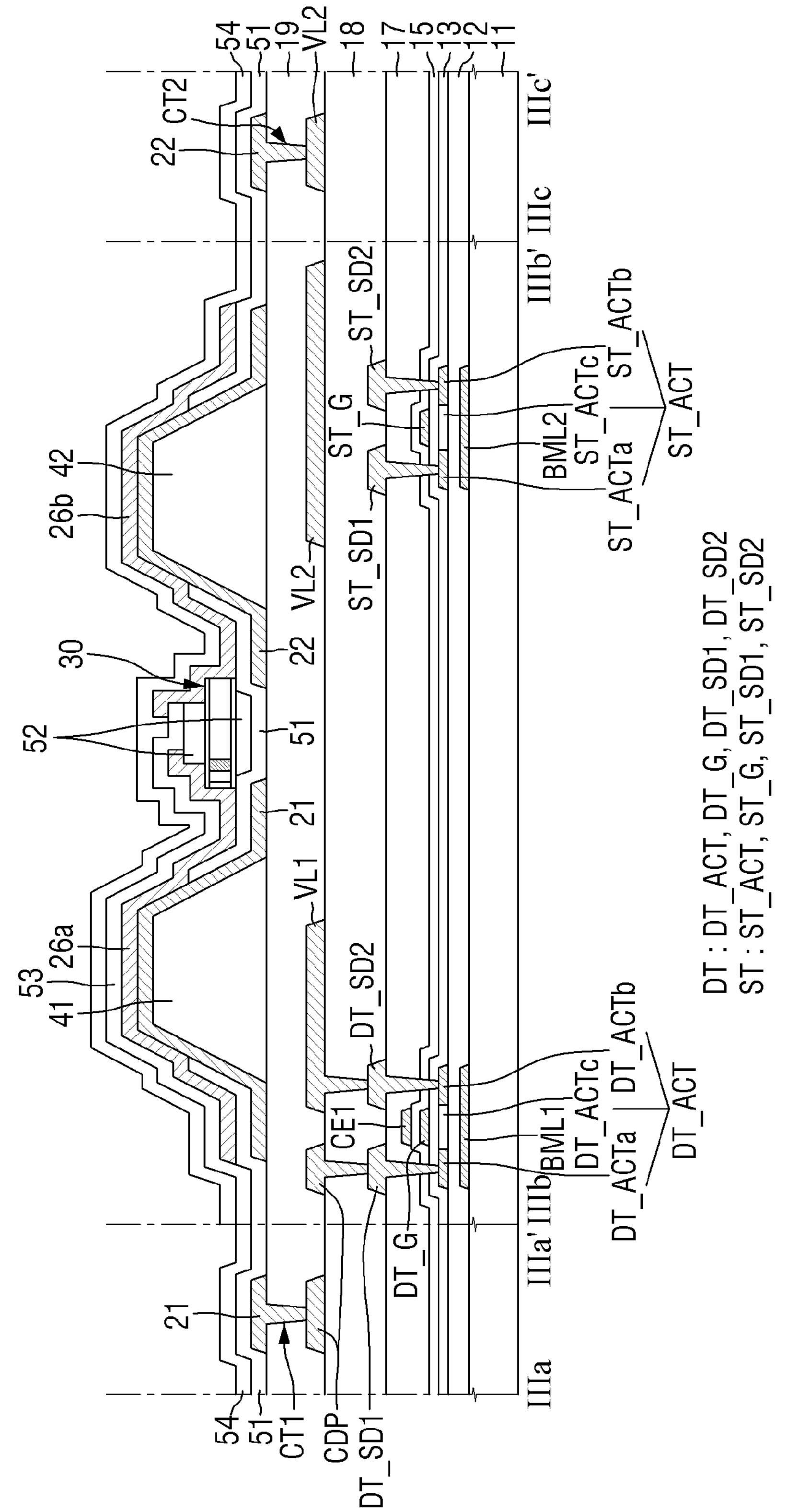
FIG. 3 is a cross-sectional view taken along lines IIIa-IIIa', IIIb-IIIb' and IIIc-IIIc' of FIG. 2.

FIG. 2 is a plan view of a pixel of the display device according to the embodiment. FIG. 3 is a cross-sectional view taken along lines IIIc-IIIa', IIIb-IIIb' and IIIc-IIIc' of FIG. 2.

Referring to FIG. 2, each of the pixels PX may include a plurality of subpixels PXn (where n is an integer of 1 to 3). For example, one pixel PX may include a first subpixel PX1, a second subpixel PX2, and a third subpixel PX3. The first subpixel PX1 may emit light of a first color, the second subpixel PX2 may emit light of a second color, and the third subpixel PX3 may emit light of a third color. The first color may be blue, the second color may be green, and the third color may be red. However, the disclosure is not limited thereto, and the subpixels PXn may also emit light of the same color. In one or more embodiments, although one pixel PX includes three subpixels PXn in FIG. 2, the disclosure is not limited thereto, and the pixel PX may also include more subpixels PXn.

Each subpixel PXn of the display device 10 may include an area defined as an emission area EMA. The first subpixel PX1 may include a first emission area EMA1, the second subpixel PX2 may include a second emission area EMA2, and the third subpixel PX3 may include a third emission area EMA3. The emission area EMA may be defined as an area where light-emitting elements 30 included in the display device 10 are located to emit light of a set or specific wavelength band. Each of the light-emitting elements 30 may include an active layer 36 (see FIG. 5), and the active layer 36 may emit light of a set or specific wavelength band without directionality. Light emitted from the active layer 36 of each light-emitting element 30 may be radiated toward both sides of the light-emitting element 30. The emission area EMA may include an area in which the light-emitting elements 30 are provided, and an area which is adjacent to the light-emitting elements 30 and to which light emitted from the light-emitting elements 30 is output.

However, the disclosure is not limited thereto, and the emission area EMA may also include an area from which light emitted from the light-emitting elements 30 is output after being reflected or refracted by other members. A plurality of light-emitting elements 30 may be located in each subpixel PXn, and an area where the light-emitting elements 30 are located and an area adjacent to this area may form the emission area EMA.

Although not illustrated in the drawing, each subpixel PXn of the display device 10 may include a non-emission area defined as an area other than the emission area EMA. The non-emission area may be an area in which the light-emitting elements 30 are not located and from which no light is output, because light emitted from the light-emitting elements 30 does not reach this area.

FIG. 3 illustrates a cross section of only the first subpixel PX1 of FIG. 2, but the same illustration may apply to other pixels PX or subpixels PXn. FIG. 3 illustrates a cross section across an end and the other end of a light-emitting element 30 in the first subpixel PX1.

Referring to FIG. 3 in connection with FIG. 2, the display device 10 may include a first substrate 11 and a circuit element layer and a display element layer on the first substrate 11. A semiconductor layer, a plurality of conductive layers, and a plurality of insulating layers may be on the first substrate 11 and may constitute the circuit element layer and the display element layer. The conductive layers may include a first gate conductive layer, a second gate conductive layer, a first data conductive layer and a second data conductive layer under a first planarization layer 19 to form the circuit element layer, and may include electrodes 21 and 22 and contact electrodes 26 on the first planarization layer 19 to form the display element layer. The insulating layers may include a buffer layer 12, a first gate insulating layer 13, a first protective layer 15, a first interlayer insulating layer 17, a second interlayer insulating layer 18, the first planarization layer 19, a first insulating layer 51, a second insulating layer 52, a third insulating layer 53, and a fourth insulating layer 54.

For example, the first substrate 11 may be an insulating substrate. The first substrate 11 may be made of an insulating material such as glass, quartz, and/or polymer resin. In one or more embodiments, the first substrate 11 may be a rigid substrate, but may also be a flexible substrate that can be bent, folded, rolled, etc.

Light blocking layers BML1 and BML2 may be provided on the first substrate 11. The light blocking layers BML1 and BML2 may include a first light blocking layer BML1 and a second light blocking layer BML2. The first light blocking layer BML1 and the second light blocking layer BML2 are overlapped by at least a first active material layer DT_ACT of a driving transistor DT and a second active material layer ST_ACT of a switching transistor ST, respectively. The light blocking layers BML1 and BML2 may include a light blocking material to prevent or reduce the penetration of light into the first and second active material layers DT_ACT and ST_ACT. For example, the first and second light blocking layers BML1 and BML2 may be made of an opaque metal material that blocks or reduces the transmission of light. However, the disclosure is not limited thereto. In some cases, the light blocking layers BML1 and BML2 may be omitted or may be formed only under the first active material layer DT_ACT.

The buffer layer 12 may be provided on the entire surface of the first substrate 11, as well as on the light blocking layers BML1 and BML2. The buffer layer 12 may be formed on the first substrate 11 to protect the transistors DT and ST of each pixel PX from moisture introduced through the first substrate 11, which is vulnerable to moisture penetration, and may perform a surface planarization function. The buffer layer 12 may be composed of a plurality of inorganic layers stacked alternately. For example, the buffer layer 12 may be a multilayer in which inorganic layers including at least any one of silicon oxide (SiOx), silicon nitride (SiNx), and/or silicon oxynitride (SiON) are alternately stacked.

The semiconductor layer is provided on the buffer layer 12. The semiconductor layer may include the first active material layer DT_ACT of the driving transistor DT and the second active material layer ST_ACT of the switching transistor ST. These layers may be partially overlapped by gate electrodes DT_G and ST_G of the first gate conductive layer which will be described herein below.

In one or more embodiments, the semiconductor layer may include polycrystalline silicon, monocrystalline silicon, an oxide semiconductor, and/or the like. The polycrystalline silicon may be formed by crystalizing amorphous silicon. When the semiconductor layer includes polycrystalline silicon, the first active material layer DT_ACT may include a first doping region DT_ACTa, a second doping region DT_ACTb, and a first channel region DT_ACTc. The first channel region DT_ACTc may be between the first doping region DT_ACTa and the second doping region DT_ACTb. The second active material layer ST_ACT may include a third doping region ST_ACTa, a fourth doping region ST_ACTb, and a second channel region ST_ACTc. The second channel region ST_ACTc may be between the third doping region ST_ACTa and the fourth doping region ST_ACTb. The first doping region DT_ACTa, the second doping region DT_ACTb, the third doping region ST_ACTa, and the fourth doping region ST_ACTb may be regions of the first active material layer DT_ACT and the second active material layer ST_ACT which are doped with impurities.

In one or more embodiments, the first active material layer DT_ACT and the second active material layer ST_ACT may include an oxide semiconductor. In this case, the doping regions of the first active material layer DT_ACT and the second active material layer ST_ACT may be conducting regions. The oxide semiconductor may be an oxide semiconductor containing indium (In). In some embodiments, the oxide semiconductor may be indium-tin oxide (ITO), indium-zinc oxide (IZO), indium-gallium oxide (IGO), indium-zinc-tin oxide (IZTO), indium-gallium-tin oxide (IGTO), and/or indium-gallium-zinc-tin oxide (IGZTO). However, the disclosure is not limited thereto.

The first gate insulating layer 13 is provided on the semiconductor layer and the buffer layer 12. The first gate insulating layer 13 may be on the buffer layer 12 as well as on the semiconductor layer. The first gate insulating layer 13 may function as a gate insulating film of each of the driving transistor DT and the switching transistor ST. The first gate insulating layer 13 may be an inorganic layer including an inorganic material such as silicon oxide (SiOx), silicon nitride (SiNx), and/or silicon oxynitride (SiON), or may have a structure in which the above materials are stacked.

The first gate conductive layer is provided on the first gate insulating layer 13. The first gate conductive layer may include a first gate electrode DT_G of the driving transistor DT and a second gate electrode ST_G of the switching transistor ST. The first gate electrode DT_G may overlap the first channel region DT_ACTc of the first active material layer DT_ACT in a thickness direction, and the second gate electrode ST_G may overlap the second channel region ST_ACTc of the second active material layer ST_ACT in the thickness direction.

The first gate conductive layer may be, but is not limited to, a single layer or a multilayer made of any one or more selected from molybdenum (Mo), aluminum (Al), chromium (Cr), gold (Au), titanium (Ti), nickel (Ni), neodymium (Nd), copper (Cu), and alloys of the same.

The first protective layer 15 is provided on the first gate conductive layer. The first protective layer 15 may cover the first gate conductive layer to protect the first gate conductive layer. The first protective layer 15 may be an inorganic layer including an inorganic material such as silicon oxide (SiOx), silicon nitride (SiNx), and/or silicon oxynitride (SiON), or may have a structure in which the above materials are stacked.

The second gate conductive layer is provided on the first protective layer 15. The second gate conductive layer may include a first capacitive electrode CE1 of a storage capacitor, at least a part of which overlaps the first gate electrode DT_G in the thickness direction. The first capacitive electrode CE1 may overlap the first gate electrode DT_G in the thickness direction with the first protective layer 15 interposed between them, and the storage capacitor may be formed between them. The second gate conductive layer may be, but is not limited to, a single layer or a multilayer made of any one or more selected from molybdenum (Mo), aluminum (Al), chromium (Cr), gold (Au), titanium (Ti), nickel (Ni), neodymium (Nd), copper (Cu), and alloys of the same.

The first interlayer insulating layer 17 is provided on the second gate conductive layer. The first interlayer insulating layer 17 may function as an insulating film between the second gate conductive layer and other layers on the second gate conductive layer. The first interlayer insulating layer 17 may be an inorganic layer including an inorganic material such as silicon oxide (SiOx), silicon nitride (SiNx), and/or silicon oxynitride (SiON), or may have a structure in which the above materials are stacked.

The first data conductive layer is provided on the first interlayer insulating layer 17. The first gate conductive layer may include a first source/drain electrode DT_SD1 and a second source/drain electrode DT_SD2 of the driving transistor DT and a first source/drain electrode ST_SD1 and a second source/drain electrode ST_SD2 of the switching transistor ST.

The first source/drain electrode DT_SD1 and the second source/drain electrode DT_SD2 of the driving transistor DT may respectively contact the first doping region DT_ACTa and the second doping region DT_ACTb of the first active material layer DT_ACT through contact holes penetrating the first interlayer insulating layer 17 and the first gate insulating layer 13. The first source/drain electrode ST_SD1 and the second source/drain electrode ST_SD2 of the switching transistor ST may respectively contact the third doping region ST_ACTa and the fourth doping region ST_ACTb of the second active material layer ST_ACT through contact holes penetrating the first interlayer insulating layer 17 and the first gate insulating layer 13. In one or more embodiments, the first source/drain electrode DT_SD1 of the driving transistor DT and the first source/drain electrode ST_SD1 of the switching transistor ST may be electrically connected (e.g., electrically coupled) to the first light blocking layer BML1 and the second light blocking layer BML2 through other contact holes, respectively. When any one of the first source/drain electrode DT_SD1 or ST_SD1 and the second source/drain electrode DT_SD2 or ST_SD2 of each of the driving transistor DT and the switching transistor ST is a source electrode, the other electrode may be a drain electrode. However, the disclosure is not limited thereto, and when any one of the first source/drain electrode DT_SD1 or ST_SD1 and the second source/drain electrode DT_SD2 or ST_SD2 is a drain electrode, the other electrode may be a source electrode.

The first data conductive layer may be, but is not limited to, a single layer or a multilayer made of any one or more selected from molybdenum (Mo), aluminum (Al), chromium (Cr), gold (Au), titanium (Ti), nickel (Ni), neodymium (Nd), copper (Cu), and alloys of the same.

The second interlayer insulating layer 18 may be provided on the first data conductive layer. The second interlayer insulating layer 18 may be located on the entire surface of the first interlayer insulating layer 17 to cover the first data conductive layer and protect the first data conductive layer. The second interlayer insulating layer 18 may be an inorganic layer including an inorganic material such as silicon oxide (SiOx), silicon nitride (SiNx), and/or silicon oxynitride (SiON), or may have a structure in which the above materials are stacked.

The second data conductive layer is provided on the second interlayer insulating layer 18. The second data conductive layer may include a first voltage line VL1, a second voltage line VL2, and a first conductive pattern CDP. A high-potential voltage (or a first power supply voltage VDD) supplied to the driving transistor DT may be applied to the first voltage line VL1, and a low-potential voltage (or a second power supply voltage VSS) supplied to a second electrode 22 may be applied to the second voltage line VL2. As will be described herein below, the first power supply voltage may be applied to a first electrode 21 through the driving transistor DT, and the second power supply voltage may be applied to the second electrode 22 connected to the second voltage line VL2 through a contact hole. An alignment signal needed to align the light-emitting elements 30 may be transmitted to the second voltage line VL2 during a process of manufacturing the display device 10.

The first conductive pattern CDP may be electrically connected (e.g., electrically coupled) to the first source/drain electrode DT_SD1 of the driving transistor DT through a contact hole formed in the second interlayer insulating layer 18. The first conductive pattern CDP may also contact the first electrode 21 to be described herein below, and the driving transistor DT may transfer the first power supply voltage VDD received from the first voltage line VL1 to the first electrode 21 through the first conductive pattern CDP. Although the second data conductive layer includes one second voltage line VL2 and one first voltage line VL1 in the drawings, the disclosure is not limited thereto. The second data conductive layer may also include more first voltage lines VL1 and/or more second voltage lines VL2.

The second data conductive layer may be, but is not limited to, a single layer or a multilayer made of any one or more selected from molybdenum (Mo), aluminum (Al), chromium (Cr), gold (Au), titanium (Ti), nickel (Ni), neodymium (Nd), copper (Cu), and alloys of the same.

The first planarization layer 19 is provided on the second data conductive layer. The first planarization layer 19 may include an organic insulating material such as polyimide (PI) and may perform a surface planarization function.

Inner banks 41 and 42, a plurality of electrodes 21 and 22, an outer bank 45, a plurality of contact electrodes 26, and the light-emitting elements 30 are provided on the first planarization layer 19. In one or more embodiments, a plurality of insulating layers 51 through 54 may be further provided on the first planarization layer 19.

The inner banks 41 and 42 may be directly on the first planarization layer 19. The inner banks 41 and 42 may include a first inner bank 41 and a second inner bank 42 adjacent to the center of each subpixel PXn.

The first inner bank 41 and the second inner bank 42 may be spaced apart in a first direction DR1 to face each other. The inner banks 41 and 42 spaced apart to face each other may form an area in which the light emitting elements 30 are located between them. In one or more embodiments, the first inner bank 41 and the second inner bank 42 may extend in a second direction DR2 but may end at a position spaced apart from a boundary between the subpixels PXn so as not to extend to another subpixel PXn neighboring in the second direction DR2. Accordingly, the first inner bank 41 and the second inner bank 42 may be located in each subpixel PXn to form linear patterns on the entire surface of the display device 10. Although only one first inner bank 41 and one second inner bank 42 are illustrated in FIG. 3, the disclosure is not limited thereto. More inner banks 41 and/or 42 may be further provided, depending on the number of electrodes 21 and 22 to be described herein below.

At least a part of each of the first inner bank 41 and the second inner bank 42 may protrude from an upper surface of the first planarization layer 19. The protruding part of each of the first inner bank 41 and the second inner bank 42 may have inclined side surfaces, and light emitted from the light-emitting elements 30 may travel toward the inclined side surfaces of the inner banks 41 and 42. As will be described herein below, the electrodes 21 and 22 on the inner banks 41 and 42 may include a material having high reflectivity, and light emitted from the light-emitting elements 30 may be reflected by the electrodes 21 and 22 located on the side surfaces of the inner banks 41 and 42 to travel upward above the first planarization layer 19. For example, the inner banks 41 and 42 may provide an area where the light-emitting elements 30 are located, while functioning as reflective barriers that reflect light emitted from the light-emitting elements 30 in an upward direction. In one or more embodiments, the inner banks 41 and 42 may include an organic insulating material such as polyimide (PI), but the disclosure is not limited thereto.

The electrodes 21 and 22 are provided on the inner banks 41 and 42 and the first planarization layer 19. The electrodes 21 and 22 may be electrically connected (e.g., electrically coupled) to the light-emitting elements 30, and a set or predetermined voltage may be applied to the electrodes 21 and 22 so that the light-emitting elements 30 can emit light of a set or specific wavelength band. In one or more embodiments, at least a part of each of the electrodes 21 and 22 may be utilized to form an electric field in the subpixel PXn to align the light-emitting elements 30.

The electrodes 21 and 22 may include the first electrode 21 on the first inner bank 41 and the second electrode 22 on the second inner bank 42.

Each of the first electrode 21 and the second electrode 22 may include an electrode stem part 21S or 22S extending in the first direction DR1 and at least one electrode branch part 21B or 22B extending and branching from the electrode stem part 21S or 22S in the second direction DR2 intersecting the first direction DR1.

The first electrode 21 may include a first electrode stem part 21S extending in the first direction DR1 and at least one first electrode branch part 21B branching from the first electrode stem part 21S and extending in the second direction DR2.

The first electrode stem part 21S may have both ends ending between subpixels PXn and spaced apart from ends of neighboring first electrode stem parts 21S, but may lie on substantially the same straight line as the first electrode stem parts 21S of neighboring pixels (e.g., adjacent in the first direction DR1) in the same row. Because both ends of the first electrode stem parts 21S respectively located in the subpixels PXn are spaced apart from each other, a different electrical signal may be transmitted to each first electrode branch part 21B, and each first electrode branch part 21B may be driven separately. The first electrode 21 may contact the first conductive pattern CDP through a first contact hole CT1 penetrating the first planarization layer 19 and thus may be electrically connected (e.g., electrically coupled) to the first source/drain electrode DT_SD1 of the driving transistor DT.

The first electrode branch part 21B may branch from at least a part of the first electrode stem part 21S and extend in the second direction DR2 to end at a position spaced apart from a second electrode stem part 22S facing the first electrode stem part 21S.

The second electrode 22 may include the second electrode stem part 22S extending in the first direction DR1 and spaced apart from the first electrode stem part 21S in the second direction DR2 to face the first electrode stem part 21S, and a second electrode branch part 22B branching from the second electrode stem part 22S and extending in the second direction DR2.

The second electrode stem part 22S may extend in the first direction DR1 beyond the boundaries with other adjacent subpixels PXn. The second electrode stem part 22S crossing a plurality of subpixels PXn may be connected to a peripheral part of the display area DPA or a part extending in a direction in the non-display area NDA. The second electrode 22 may contact the second voltage line VL2 through a second contact hole CT2 penetrating the first planarization layer 19. As illustrated in the drawings, the second electrodes 22 of subpixels PXn neighboring in the first direction DR1 may be connected (e.g., coupled) to one second electrode stem part 22S and thus electrically connected (e.g., electrically coupled) to the second voltage line VL2 through the second contact hole CT2. However, the disclosure is not limited thereto. In some cases, the second contact hole CT2 may also be formed in each subpixel PXn.

The second electrode branch part 22B may be spaced apart from the first electrode branch part 21B to face the first electrode branch part 21B and may end at a position spaced apart from the first electrode stem part 21S. The second electrode branch part 22B may be connected (e.g., coupled) to the second electrode stem part 22S, and an end in an extending direction thereof may be spaced apart from the first electrode stem part 21S in the subpixel PXn.

Although two first electrode branch parts 21B and one second electrode branch part 22B are illustrated in each subpixel PXn in the drawings, the disclosure is not limited thereto. In some embodiments, more first electrode branch parts 21B and/or more second electrode branch parts 22B may be provided in each subpixel PXn. In one or more embodiments, the first electrode 21 and the second electrode 22 in each subpixel PXn may not necessarily extend in one direction and may be provided in various suitable structures. For example, the first electrode 21 and the second electrode 22 may be partially curved or bent, or any one of the first electrode 21 and the second electrode 22 may surround the other electrode. The structure and/or shape of the first electrode 21 and the second electrode 22 are not particularly limited as long as the first electrode 21 and the second electrode 22 are at least partially spaced apart to face each other so that an area where the light-emitting elements 30 are to be located can be formed between the first electrode 21 and the second electrode 22.

The first electrode 21 and the second electrode 22 may be provided on the first inner bank 41 and the second inner bank 42, respectively, and may be spaced apart to face each other. The respective electrode branch parts 21B and 22B of the first electrode 21 and the second electrode 22 may be provided on the first inner bank 41 and the second inner bank 42, but at least a part of each of them may be directly on the first planarization layer 19. At least one end of each of the light-emitting elements 30 between the first inner bank 41 and the second inner bank 42 may be electrically connected (e.g., electrically coupled) to the first electrode 21 and the second electrode 22.

Each of the electrodes 21 and 22 may include a transparent conductive material. For example, each of the electrodes 21 and 22 may include a material such as indium-tin oxide (ITO), indium-zinc oxide (IZO), and/or indium-tin-zinc oxide (ITZO), but the disclosure is not limited thereto. In some embodiments, each of the electrodes 21 and 22 may include a conductive material having high reflectivity. For example, each of the electrodes 21 and 22 may include a metal such as silver (Ag), copper (Cu) and/or aluminum (Al) as a material having high reflectivity. In this case, each of the electrodes 21 and 22 may reflect incident light upward above each subpixel PXn.

In one or more embodiments, each of the electrodes 21 and 22 may have a structure in which a transparent conductive material and a metal layer having high reflectivity are each stacked in one or more layers, or may be formed as a single layer including them. In one or more embodiments, each of the electrodes 21 and 22 may have a stacked structure of ITO/Ag/ITO/IZO or may be an alloy containing aluminum (Al), nickel (Ni), lanthanum (La), etc., but the disclosure is not limited thereto.

The electrodes 21 and 22 may be electrically connected (e.g., electrically coupled) to the light-emitting elements 30, and a set or predetermined voltage may be applied to the electrodes 21 and 22 so that the light-emitting elements 30 can emit light. For example, the electrodes 21 and 22 may be electrically connected (e.g., electrically coupled) to the light-emitting elements 30 through the contact electrodes 26 to be described herein below and may transmit a received electrical signal to the light-emitting elements 30 through the contact electrodes 26.

In one or more embodiments, the first electrode 21 may be a pixel electrode separate for each subpixel PXn, and the second electrode 22 may be a common electrode commonly connected (e.g., commonly provided) along each subpixel PXn. Any one of the first electrode 21 and the second electrode 22 may be anodes of the light-emitting elements 30, and the other thereof may be cathodes of the light-emitting elements 30. However, the disclosure is not limited thereto, and the opposite case may also be true.

In one or more embodiments, each of the electrodes 21 and 22 may be utilized to form an electric field in the subpixel PXn so as to align the light-emitting elements 30. The light-emitting elements 30 may be placed between the first electrode 21 and the second electrode 22 through a process of forming an electric field between the first electrode 21 and the second electrode 22 by transmitting an alignment signal to the first electrode 21 and the second electrode 22. The light-emitting elements 30 may be sprayed on the first electrode 21 and the second electrode 22 through an inkjet process in a state in which they are dispersed in ink and may be aligned between the first electrode 21 and the second electrode 22 through a method of applying a dielectrophoretic force to the light-emitting elements 30 by transmitting an alignment signal between the first electrode 21 and the second electrode 22.

The first insulating layer 51 is provided on the first planarization layer 19, the first electrode 21 and the second electrode 22. The first insulating layer 51 partially covers the first electrode 21 and the second electrode 22. The first insulating layer 51 may cover most of an upper surface of each of the first electrode 21 and the second electrode 22 but may expose a part of each of the first electrode 21 and the second electrode 22. The first insulating layer 51 may partially expose the upper surface of each of the first electrode 21 and the second electrode 22, for example, may partially expose an upper surface of the first electrode branch part 21B on the first inner bank 41 and an upper surface of the second electrode branch part 22B on the second inner bank 42. The first insulating layer 51 may be formed on substantially the entire surface of the first planarization layer 19 but may include openings partially exposing the first electrode 21 and the second electrode 22.

In one or more embodiments, the first insulating layer 51 may be stepped such that a part of an upper surface of the first insulating layer 51 is depressed between the first electrode 21 and the second electrode 22. In some embodiments, the first insulating layer 51 may include an inorganic insulating material, and a part of the upper surface of the first insulating layer 51 covering the first electrode 21 and the second electrode 22 may be depressed due to a step formed by the members located under the first insulating layer 51. The light-emitting elements 30 on the first insulating layer 51 between the first electrode 21 and the second electrode 22 may form an empty space with the depressed upper surface of the first insulating layer 51. The light-emitting elements 30 may be partially spaced apart from the upper surface of the first insulating layer 51, and the empty space may be filled with a material that forms the second insulating layer 52 to be described herein below. However, the disclosure is not limited thereto. The first insulating layer 51 may also form a flat upper surface so that the light-emitting elements 30 can be positioned on the flat upper surface.

The first insulating layer 51 may protect the first electrode 21 and the second electrode 22 while insulating them from each other. In one or more embodiments, the first insulating layer 51 may prevent or reduce direct contact between the light-emitting elements 30 on the first insulating layer 51 and other members, and thus may prevent or reduce damage to the light-emitting elements 30. However, the shape and structure of the first insulating layer 51 are not limited to the above example.

The outer bank 45 may be provided on the first insulating layer 51. In some embodiments, the outer bank 45 on the first insulating layer 51 may surround an area where the light-emitting elements 30 are located, as well as an area where the inner banks 41 and 42 and the electrodes 21 and 22 are located, and may be provided at each boundary between the subpixels PXn. The outer bank 45 may extend in the first direction DR1 and the second direction DR2 to form a lattice pattern over the entire display area DPA.

According to one or more embodiments, a height of the outer bank 45 may be greater than a height of each of the inner banks 41 and 42. Unlike the inner banks 41 and 42, the outer bank 45 may separate neighboring subpixels PXn while preventing or reducing the overflow of ink to adjacent subpixels PXn in an inkjet printing process for placing the light-emitting elements 30 during the process of manufacturing the display device 10 as will be described herein below. The outer bank 45 may separate inks in which different light-emitting elements 30 are dispersed for different subpixels PXn, so that the inks are not mixed with each other. Like the inner banks 41 and 42, the outer bank 45 may include polyimide (PI), but the disclosure is not limited thereto.

The light-emitting elements 30 may be between the electrodes 21 and 22. For example, the light-emitting elements 30 may be between the electrode branch parts 21B and 22B. The light-emitting elements 30 may be spaced apart from each other and aligned substantially parallel to each other. A gap between the light-emitting elements 30 is not particularly limited. In some cases, a plurality of light-emitting elements 30 may be adjacent to each other to form a cluster, and a plurality of other light-emitting elements 30 may be positioned at regular intervals to form a cluster or may be positioned with uneven density (e.g., at irregular intervals). In one or more embodiments, the light-emitting elements 30 may extend in one direction, and the direction in which the electrodes 21 and 22 extend and the direction in which the light-emitting elements 30 extend may be substantially perpendicular to each other. However, the disclosure is not limited thereto, and the light-emitting elements 30 may also extend in a direction not perpendicular but oblique to the direction in which the electrodes 21 and 22 extend.

The light-emitting elements 30 according to one or more embodiments may include active layers 36 including different materials to emit light of different wavelength bands. The display device 10 may include the light-emitting elements 30 which emit light of different wavelength bands. For example, each light-emitting element 30 of the first subpixel PX1 may include an active layer 36 that emits light of the first color having a central wavelength band as a first wavelength, each light-emitting element 30 of the second subpixel PX2 may include an active layer 36 that emits light of the second color having a central wavelength band as a second wavelength, and each light-emitting element 30 of the third subpixel PX3 may include an active layer 36 that emits light of the third color having a central wavelength band as a third wavelength.

Accordingly, the light of the first color, the light of the second color, and the light of the third color may be output from the first subpixel PX1, the second subpixel PX2, and the third subpixel PX3, respectively. In some embodiments, the light of the first color may be blue light having a central wavelength band in a range of 450 to 495 nm, the light of the second color may be green light having a central wavelength band in a range of 495 to 570 nm, and the light of the third color may be red light having a central wavelength band in a range of 620 to 752 nm. However, the disclosure is not limited thereto. In some cases, the first subpixel PX1, the second subpixel PX2, and the third subpixel PX3 may include the same type (or kind) of light-emitting elements 30 to emit light of substantially the same color.

The light-emitting elements 30 may be provided on the first insulating layer 51 between the inner banks 41 and 42 and/or between the electrodes 21 and 22. For example, the light-emitting elements 30 may be on the first insulating layer 51 between the inner banks 41 and 42. At the same time, a part of each light-emitting element 30 may overlap each of the electrodes 21 and 22 in the thickness direction. One end of each light-emitting element 30 may be on the first electrode 21 to overlap the first electrode 21 in the thickness direction, and the other end of each light-emitting element 30 may be on the second electrode 22 to overlap the second electrode 22 in the thickness direction. However, the disclosure is not limited thereto. Although not illustrated in the drawings, at least some of the light-emitting elements 30 in each subpixel PXn may be in an area other than the area formed between the inner banks 41 and 42, for example, may be in an area other than the area between the electrode branch parts 21B and 22B, or may be between the inner banks 41 and 42 and the outer bank 45.

Each of the light-emitting elements 30 may include a plurality of layers stacked in a direction perpendicular (e.g., substantially perpendicular) to an upper surface of the first substrate 11 and/or the first planarization layer 19. According to one or more embodiments, each of the light-emitting elements 30 may extend in a direction and have a structure in which a plurality of semiconductor layers are sequentially stacked along the direction. The direction in which the light-emitting elements 30 of the display device 10 extend may be parallel (e.g., substantially parallel) to the first planarization layer 19, and the semiconductor layers included in each of the light-emitting elements 30 may be sequentially stacked along the direction parallel (e.g., substantially parallel) to the upper surface of the first planarization layer 19. However, the disclosure is not limited thereto. In some cases, when the light-emitting elements 30 have a different structure, the layers may be stacked in a direction perpendicular (e.g., substantially perpendicular) to the first planarization layer 19.

In one or more embodiments, an end of each light-emitting element 30 may contact a first contact electrode 26*a*, and the other end may contact a second contact electrode 26*b*. According to one or more embodiments, an insulating film 38 (see FIG. 5) may not be formed on end surfaces of each light-emitting element 30 in the extending direction of the light-emitting element 30, thereby exposing some of the semiconductor layers. Thus, the exposed semiconductor layers may contact the first contact electrode 26*a* and the second contact electrode 26*b* to be described herein below. However, the disclosure is not limited thereto. In some cases, at least a part of the insulating film 38 of each light-emitting element 30 may be removed to partially expose side surfaces of both ends of the semiconductor layers.

The second insulating layer 52 may be on a part of each light-emitting element 30 between the first electrode 21 and the second electrode 22. The second insulating layer 52 may partially cover an outer surface of each light-emitting element 30. A part of the second insulating layer 52 which is on the light-emitting elements 30 may extend in the second direction DR2 between the first electrode 21 and the second electrode 22 in plan view. For example, the second insulating layer 52 may form a stripe or island pattern in each subpixel PXn.

The second insulating layer 52 may be on the light-emitting elements 30 but may expose an end and the other end of each light-emitting element 30. The exposed ends of each light-emitting element 30 may contact the contact electrodes 26 to be described herein below. This shape of the second insulating layer 52 may be formed by performing a patterning process using the material that forms the second insulating layer 52 using a conventional mask process. A mask for forming the second insulating layer 52 may have a width smaller than a length of each light-emitting element 30, and the material that forms the second insulating layer 52 may be patterned to expose both ends of each light-emitting element 30. However, the disclosure is not limited thereto.

The second insulating layer 52 may protect the light-emitting elements 30 while fixing the light-emitting elements 30 in the process of manufacturing the display device 10. In one or more embodiments, a part of the material of the second insulating layer 52 may be between lower surfaces of the light-emitting elements 30 and the first insulating layer 51. As described above, the second insulating layer 52 may be formed to fill the space between the first insulating layer 51 and the light-emitting elements 30 formed during the process of manufacturing the display device 10. Accordingly, the second insulating layer 52 may cover the outer surface of each light-emitting element 30 to protect the light-emitting elements 30 while fixing the light-emitting elements 30 during the process of manufacturing the display device 10.

The contact electrodes 26 are provided on the first electrode 21, the second electrode 22, and the second insulating layer 52. In one or more embodiments, the third insulating layer 53 may be provided on any one contact electrode 26.

The contact electrodes 26 may extend in a direction. The contact electrodes 26 may contact the light-emitting elements 30 and the electrodes 21 and 22, respectively, and the light-emitting elements 30 may receive an electrical signal from the first electrode 21 and the second electrode 22 through the contact electrodes 26.

The contact electrodes 26 may include the first contact electrode 26*a* and the second contact electrode 26*b*. The first contact electrode 26*a* and the second contact electrode 26*b* may be on the first electrode 21 and the second electrode 22, respectively. Each of the first contact electrode 26*a* and the second contact electrode 26*b* may extend in the second direction DR2. The first contact electrode 26*a* and the second contact electrode 26*b* may be spaced apart from each other in the first direction DR1 and may form stripe patterns in the emission area EMA of each subpixel PXn.

In some embodiments, widths of the first contact electrode 26*a* and the second contact electrode 26*b* measured in a direction may be equal to or greater than widths of the first electrode 21 and the second electrode 22 measured in the direction, respectively. The first contact electrode 26*a* and the second contact electrode 26*b* may respectively contact an end and the other end of each light-emitting element 30 and cover both side surfaces of the first electrode 21 and the second electrode 22. In one or more embodiments, at least a part of each of the first contact electrode 26*a* and the second contact electrode 26*b* may be on the first insulating layer 51. In one or more embodiments, at least a part of each of the first contact electrode 26*a* and the second contact electrode 26*b* may be on the second insulating layer 52. The first contact electrode 26*a* may be directly on the second insulating layer 52, and the second contact electrode 26*b* may be directly on the third insulating layer 53 provided on the first contact electrode 26*a* and may overlap the second insulating layer 52. However, the disclosure is not limited thereto, and the third insulating layer 53 may also be omitted so that the second contact electrode 26*b* is directly on the second insulating layer 52.

As described above, the upper surfaces of the first electrode 21 and the second electrode 22 may be partially exposed, and the first contact electrode 26*a* and the second contact electrode 26*b* may contact the exposed upper surfaces of the first electrode 21 and the second electrode 22. For example, the first contact electrode 26*a* may contact a part of the first electrode 21 which is located on the first inner bank 41, and the second contact electrode 26*b* may contact a part of the second electrode 22 which is located on the second inner bank 42. However, the disclosure is not limited thereto, and in some cases, the first contact electrode 26*a* and the second contact electrode 26*b* may have smaller widths than the first electrode 21 and the second electrode 22 to cover only the exposed parts of the upper surfaces of the first electrode 21 and the second electrode 22.

According to one or more embodiments, the semiconductor layers may be exposed on both end surfaces of each light-emitting element 30 in the extending direction thereof, and the first contact electrode 26*a* and the second contact electrode 26*b* may contact each light-emitting element 30 at the end surfaces where the semiconductor layers are exposed. However, the disclosure is not limited thereto. In some cases, the semiconductor layers may be exposed on the side surfaces of both ends of each light-emitting element 30, and the contact electrodes 26 may contact the exposed semiconductor layers, respectively. One end of each light-emitting element 30 may be electrically connected (e.g., electrically coupled) to the first electrode 21 through the first contact electrode 26*a*, and the other end may be electrically connected (e.g., electrically coupled) to the second electrode 22 through the second contact electrode 26*b*.

Although two first contact electrodes 26*a* and one second contact electrode 26*b* are illustrated in one subpixel PXn in the drawings, the disclosure is not limited thereto. The number of first contact electrodes 26*a* and second contact electrodes 26*b* may vary according to the number of first electrode branch parts 21B and second electrode branch parts 22B in each subpixel PXn.

The contact electrodes 26 may include a conductive material such as ITO, IZO, ITZO, and/or aluminum (Al). For example, the contact electrodes 26 may include a transparent conductive material, and light emitted from the light-emitting elements 30 may pass through the contact electrodes 26 and travel toward the electrodes 21 and 22. Each of the electrodes 21 and 22 may include a material having high reflectivity, and the electrodes 21 and 22 positioned on the inclined side surfaces of the inner banks 41 and 42 may reflect incident light upward above the first substrate 11. However, the disclosure is not limited thereto.

The third insulating layer 53 is provided on the first contact electrode 26*a*. The third insulating layer 53 may electrically insulate the first contact electrode 26*a* and the second contact electrode 26*b* from each other. The third insulating layer 53 may cover the first contact electrode 26*a* but may not be provided on the other end of each light-emitting element so that the light-emitting element 30 can contact the second contact electrode 26*b*. The third insulating layer 53 may be on an upper surface of the second insulating layer 52 to partially contact the first contact electrode 26*a* and the second insulating layer 52. A side surface of the third insulating layer 53 in a direction of the second electrode 22 may be aligned with a side surface of the second insulating layer 52 in the same direction. In one or more embodiments, the third insulating layer 53 may be in the non-emission area, for example, on the first insulating layer 51 on the first planarization layer 19. However, the disclosure is not limited thereto.

The fourth insulating layer 54 may be provided on the entire surface of the first substrate 11. The fourth insulating layer 54 may function to protect members positioned on the first substrate 11 from the external environment.

Each of the first insulating layer 51, the second insulating layer 52, the third insulating layer 53 and the fourth insulating layer 54 described above may include an inorganic insulating material or an organic insulating material. In one or more embodiments, the first insulating layer 51, the second insulating layer 52, the third insulating layer 53 and the fourth insulating layer 54 may each independently include an inorganic insulating material such as silicon oxide (SiOx), silicon nitride (SiNx), silicon oxynitride (SiOxNy), aluminum oxide ($Al_2O_3$), and/or aluminum nitride (AlN). In one or more embodiments, they may each independently include an organic insulating material such as acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, and/or polymethyl methacrylate-polycarbonate synthetic resin. However, the disclosure is not limited thereto.

Figure 4:
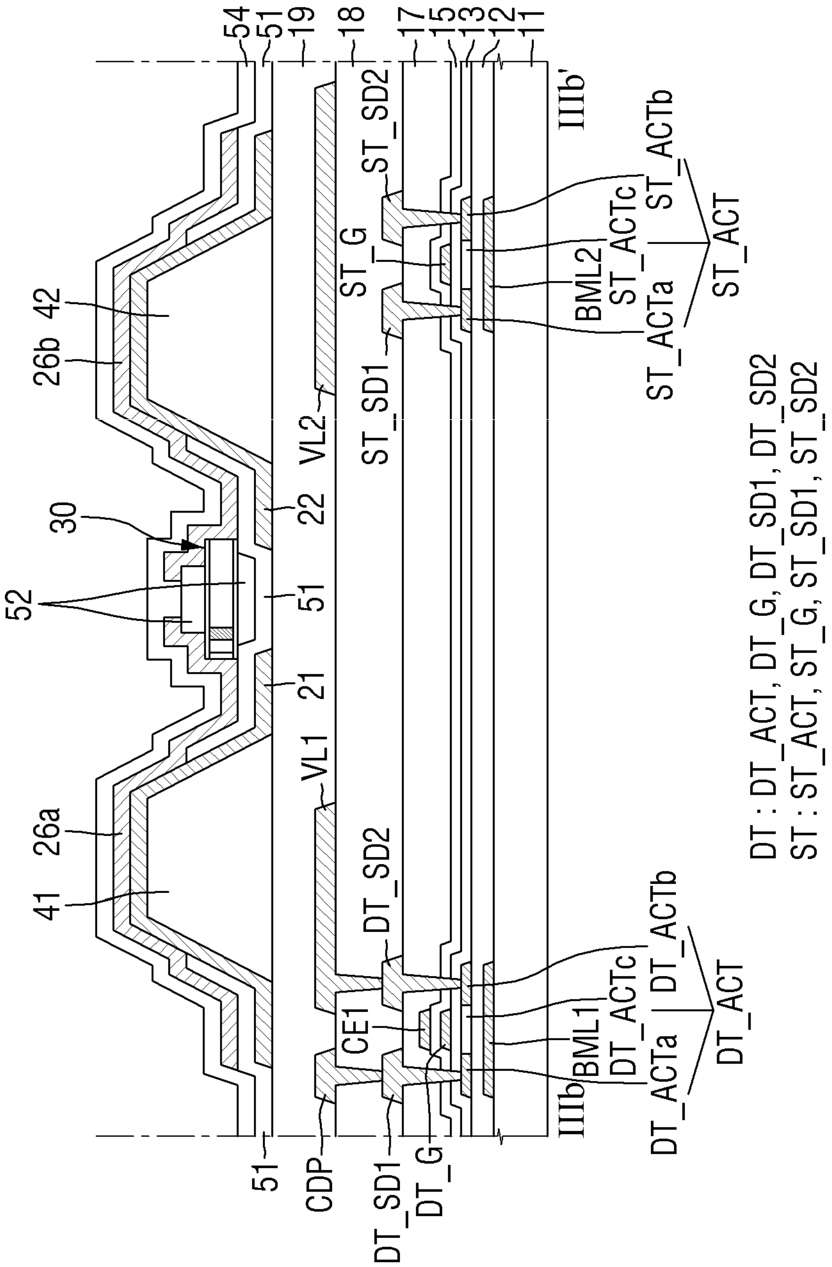
FIG. 4 is a cross-sectional view of a part of a display device according to one or more embodiments.

FIG. 4 is a cross-sectional view of a part of a display device according to one or more other embodiments.

Referring to FIG. 4, in the display device 10 according to the one or more other embodiments, a third insulating layer 53 may be omitted. A second contact electrode 26*b* may be directly on a second insulating layer 52, and a first contact electrode 26*a* and the second contact electrode 26*b* may be spaced apart from each other on the second insulating layer 52. The embodiment of FIG. 4 is the same as the embodiment of FIG. 3 except that the third insulating layer 53 is omitted. Thus, redundant descriptions will be omitted.

A light-emitting element 30 may be a light emitting diode. For example, the light-emitting element 30 may be an inorganic light emitting diode having a size of micrometers or nanometers and made of an inorganic material. When an electric field is formed in a set or specific direction between two electrodes facing each other, the inorganic light emitting diode may be aligned between the two electrodes in which polarity is formed.

Figure 5:
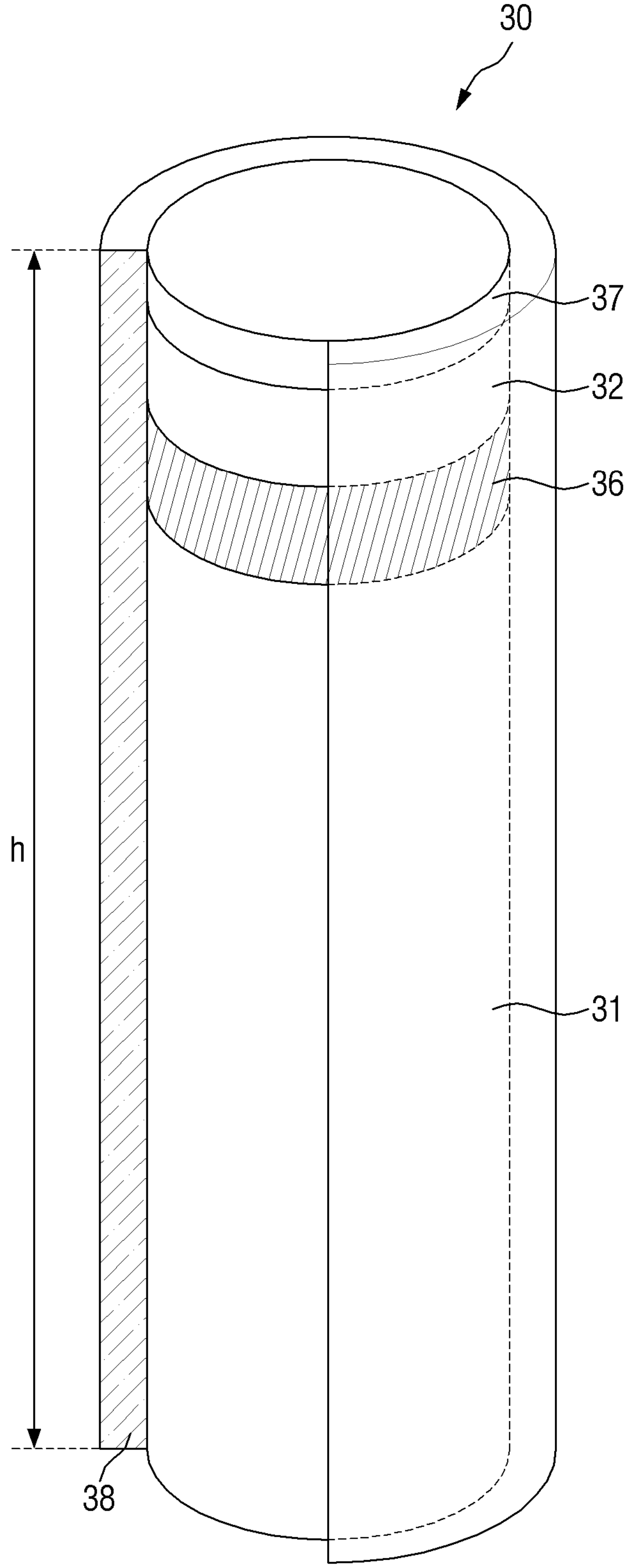
FIG. 5 is a schematic view of a light-emitting element according to one or more embodiments.

FIG. 5 is a schematic view of a light-emitting element according to one or more embodiments.

Referring to FIG. 5, the light-emitting element 30 according to the embodiments may extend in one direction. The light-emitting element 30 may be shaped like a rod, a wire, a tube, and/or the like. In one or more embodiments, the light-emitting element 30 may be shaped like a cylinder and/or a rod. However, the shape of the light-emitting element 30 is not limited thereto, and the light-emitting element 30 may also have various suitable shapes including polygonal prisms, such as a cube, a rectangular parallelepiped and a hexagonal prism, and/or a shape extending in a direction and having a partially inclined outer surface.

The light-emitting element 30 may include a semiconductor layer doped with impurities of any conductivity type (e.g., a p type or an n type). The semiconductor layer may receive an electrical signal from an external power source and emit light of a set or specific wavelength band. A plurality of semiconductors included in the light-emitting element 30 may be sequentially stacked along the one direction.

The light-emitting element 30 may include a first semiconductor layer 31, a second semiconductor layer 32, an active layer 36, an electrode layer 37, and an insulating film 38. To visually show each element of the light-emitting element 30, the insulating film 38 is illustrated in FIG. 5 as having been partially removed to expose the semiconductor layers 31, 32 and 36. However, as will be described herein below, the insulating film 38 may surround outer surfaces of the semiconductor layers 31, 32 and 36.

In one or more embodiments, the first semiconductor layer 31 may be an n-type semiconductor. In an example, when the light-emitting element 30 emits light in a blue wavelength band, the first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$), for example, may be any one or more selected from n-type doped AlGaInN, GaN, AlGaN, InGaN, AlN, and InN. The first semiconductor layer 31 may be doped with an n-type dopant, and the n-type dopant may be, for example, Si, Ge, and/or Sn. In one or more embodiments, the first semiconductor layer 31 may be n-GaN doped with n-type Si. A length of the first semiconductor layer 31 may be in a range of, but not limited to, 1.5 to 5 μm.

The second semiconductor layer 32 is provided on the active layer 36 to be described herein below. The second semiconductor layer 32 may be a p-type semiconductor. In an example, when the light-emitting element 30 emits light in a blue or green wavelength band, the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$), for example, may be any one or more selected from p-type doped AlGaInN, GaN, AlGaN, InGaN, AlN, and InN. The second semiconductor layer 32 may be doped with a p-type dopant, and the p-type dopant may be, for example, Mg, Zn, Ca, Se, and/or Ba. In one or more embodiments, the second semiconductor layer 32 may be p-GaN doped with p-type Mg. A length of the second semiconductor layer 32 may be in a range of, but not limited to, 0.05 to 0.10 μm.

Although each of the first semiconductor layer 31 and the second semiconductor layer 32 is composed of one layer in the drawing, the disclosure is not limited thereto. According to some embodiments, each of the first semiconductor layer 31 and the second semiconductor layer 32 may include more layers, for example, may further include a clad layer and/or a tensile strain barrier reducing (TSBR) layer depending on the material of the active layer 36.

The active layer 36 is provided between the first semiconductor layer 31 and the second semiconductor layer 32. The active layer 36 may include a material having a single or multiple quantum well structure. When the active layer 36 includes a material having a multiple quantum well structure, it may have a structure in which a plurality of quantum layers and a plurality of well layers are alternately stacked. The active layer 36 may emit light through combination of electron-hole pairs according to an electrical signal received through the first semiconductor layer 31 and the second semiconductor layer 32. For example, when the active layer 36 emits light in the blue wavelength band, it may include a material such as AlGaN and/or AlGaInN. For example, when the active layer 36 has a multiple quantum well structure in which a quantum layer and a well layer are alternately stacked, the quantum layer may include a material such as AlGaN and/or AlGaInN, and the well layer may include a material such as GaN and/or AlInN. In one or more embodiments, the active layer 36 may include AlGaInN as a quantum layer and AlInN as a well layer to emit blue light having a central wavelength band is in a range of 450 to 495 nm.

However, the disclosure is not limited thereto, and the active layer 36 may also have a structure in which a semiconductor material having a large band gap energy and a semiconductor material having a small band gap energy are alternately stacked, or may include different group 3 to 5 semiconductor materials depending on the wavelength band of light that it emits. Light emitted from the active layer 36 is not limited to light in the blue wavelength band. In some cases, the active layer 36 may emit light in a red or green wavelength band. A length of the active layer 36 may be in a range of, but not limited to, 0.05 to 0.10 μm.

Light emitted from the active layer 36 may be radiated not only to an outer surface of the light-emitting element 30 in a longitudinal direction, but also to both side surfaces. The direction of light emitted from the active layer 36 is not limited to one direction.

The electrode layer 37 may be an ohmic contact electrode. However, the disclosure is not limited thereto, and the electrode layer 37 may also be a Schottky contact electrode. The light-emitting element 30 may include at least one electrode layer 37. Although the light-emitting element 30 includes one electrode layer 37 in FIG. 5, the disclosure is not limited thereto. In some cases, the light-emitting element 30 may include more electrode layers 37, or the electrode layer 37 may be omitted. The following description of the light-emitting element 30 may apply equally even when the light-emitting element 30 includes a different number of electrode layers 37 or further includes another structure.

When the light-emitting element 30 is electrically connected (e.g., electrically coupled) to an electrode or a contact electrode in the display device 10 according to the embodiments, the electrode layer 37 may reduce the resistance between the light-emitting element 30 and the electrode or the contact electrode. The electrode layer 37 may include a conductive metal. For example, the electrode layer 37 may include at least any one of aluminum (Al), titanium (Ti), indium (In), gold (Au), silver (Ag), indium-tin oxide (ITO), indium-zinc oxide (IZO), and/or indium-tin-zinc oxide (ITZO). In one or more embodiments, the electrode layer 37 may include an n-type or p-type doped semiconductor material. The electrode layer 37 may include the same material or different materials. A length of the electrode layer 37 may be in a range of, but not limited to, 0.05 to 0.10 μm.

The insulating film 38 surrounds outer surfaces of the semiconductor layers and the electrode layers described above. In one or more embodiments, the insulating film 38 may surround an outer surface of at least the active layer 36 and extend in the direction in which the light-emitting element 30 extends. The insulating film 38 may protect the above members. For example, the insulating film 38 may surround side surfaces of the above members but may expose both ends of the light-emitting element 30 in the longitudinal direction.

In the drawing, the insulating film 38 extends in the longitudinal direction of the light-emitting element 30 to cover from side surfaces of the first semiconductor layer 31 to side surfaces of the electrode layer 37. However, the disclosure is not limited thereto, and the insulating film 38 may also cover outer surfaces of only some semiconductor layers as well as the active layer 36 or may cover only a part of an outer surface of the electrode layer 37 to partially expose the outer surface of each electrode layer 37. In one or more embodiments, an upper surface of the insulating film 38 may have a round cross section in an area adjacent to at least one end of the light-emitting element 30.

A thickness of the insulating film 38 may be in a range of, but not limited to, 10 nm to 1.0 μm. The thickness of the insulating film 38 may be about 40 nm.

The insulating film 38 may include a material having insulating properties, such as silicon oxide (SiOx), silicon nitride (SiNx), silicon oxynitride (SiOxNy), aluminum nitride (AlN), and/or aluminum oxide ($Al_2O_3$). Therefore, the insulating film 38 may prevent or reduce an electrical short circuit that may occur when the active layer 36 directly contacts an electrode through which an electrical signal is transmitted to the light-emitting element 30. In one or more embodiments, the insulating film 38 may prevent or reduce a reduction in luminous efficiency by protecting the outer surface of the light emitting element 30 including the active layer 36.

In some embodiments, an outer surface of the insulating film 38 may be treated. When the display device 10 is manufactured, a plurality of light emitting elements 30 may be sprayed on electrodes in a state in which they are dispersed in a set or predetermined ink and then may be aligned. Here, the surface of the insulating film 38 may be hydrophobic or hydrophilic-treated so that the light emitting element 30 remains separate from other adjacent light emitting elements 30 in the ink without being agglomerated with them.

A length h of the light-emitting element 30 may be in a range of 1 to 10 μm or 2 to 6 μm, and may, for example, be in a range of 3 to 5 μm. In one or more embodiments, a diameter of the light-emitting element 30 may be in a range of 30 to 700 nm, and an aspect ratio of the light-emitting element 30 may be 1.2 to 100. However, the disclosure is not limited thereto, and a plurality of light-emitting elements 30 included in the display device 10 may also have different diameters according to a difference in composition of the active layer 36. The diameter of the light-emitting element 30 may be about 500 nm.

The shape and material of the light-emitting element 30 are not limited to those of FIG. 5. In some embodiments, the light-emitting element 30 may include more layers and/or may have a different shape.

Figure 6:
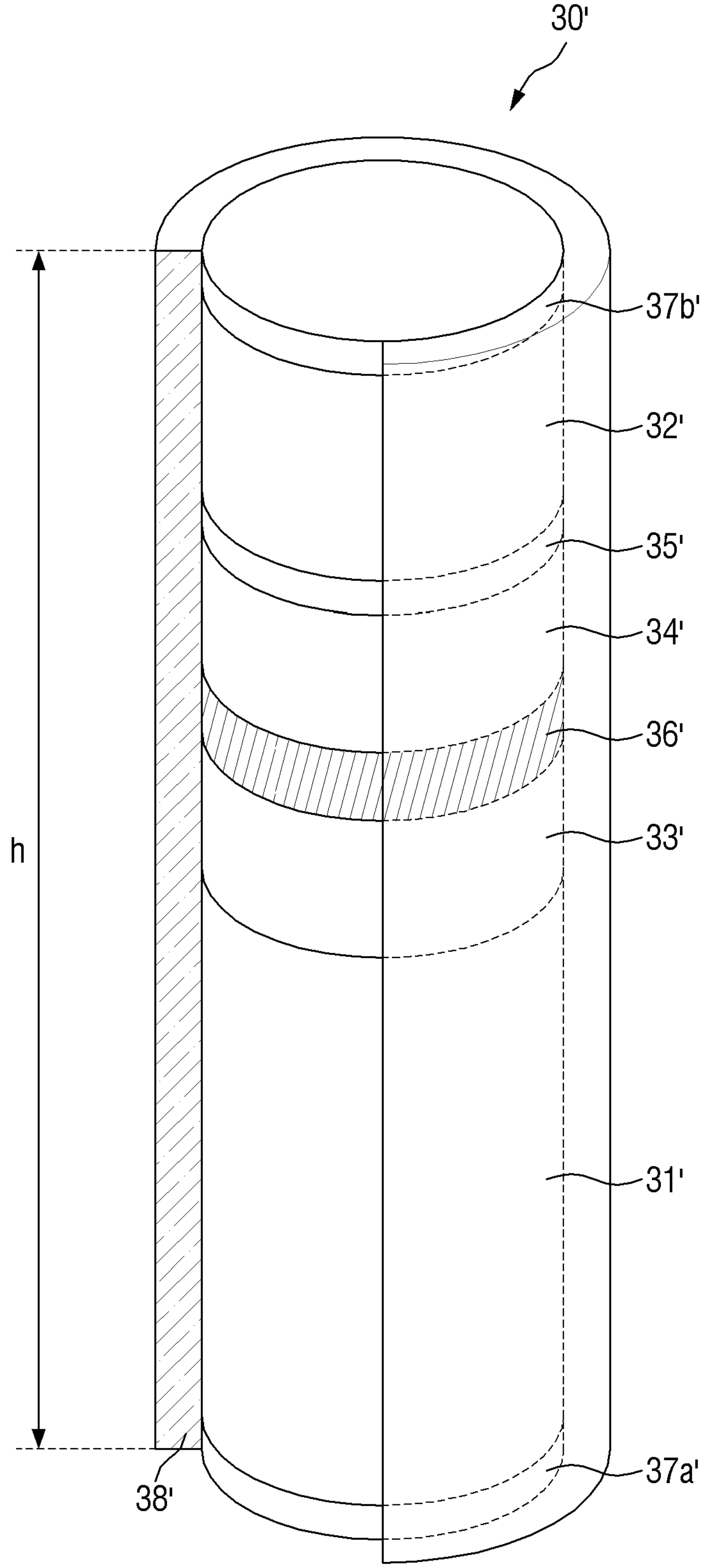
FIGS. 6 and 7 are schematic views of light-emitting elements according to one or more embodiments.
Figure 7:
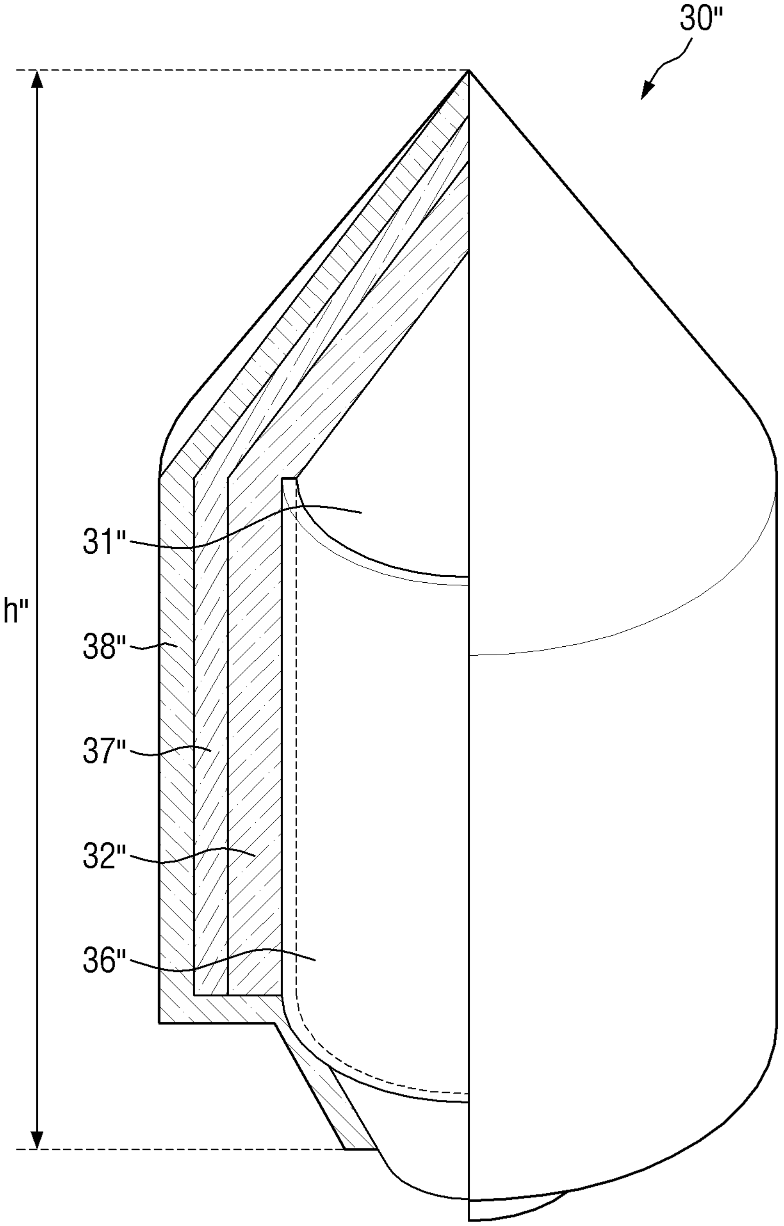

FIGS. 6 and 7 are schematic views of light-emitting elements according to one or more other embodiments.

First, referring to FIG. 6, a light-emitting element 30' according to one or more embodiments may further include a third semiconductor layer 33' between a first semiconductor layer 31' and an active layer 36', and a fourth semiconductor layer 34' and a fifth semiconductor layer 35' between the active layer 36' and a second semiconductor layer 32'. The light-emitting element 30' of FIG. 6 is different from the embodiment of FIG. 5 in that a plurality of semiconductor layers 33',34' and 35' and electrode layers **37*a*' and 37*b*' are further provided, and the active layer 36'** contains different elements. Thus, redundant descriptions will be omitted, and differences will be mainly described below.

As described above, the light-emitting element 30 of FIG. 5 may emit blue or green light because the active layer 36 includes nitrogen (N). In one or more embodiments, the light-emitting element 30' of FIG. 6 may be a semiconductor in which each of the active layer 36' and other semiconductor layers includes at least phosphorous (P). For example, the light-emitting element 30' according to the embodiments may emit red light having a central wavelength band in a range of 620 to 750 nm. However, the central wavelength band of the red light is not limited to the above range and should be understood to include all suitable wavelength ranges that can be recognized as red in the art to which the disclosure pertains.

In one or more embodiments, the first semiconductor layer 31' may be an n-type semiconductor layer and may include a semiconductor material having a chemical formula of $In_xAl_yGa_{1-x-y}P$ ($0 \leq x \leq 1$, $0 \leq y \leq 1$, $0 \leq x+y \leq 1$). For example, the first semiconductor layer 31' may be any one or more selected from n-type doped InAlGaP, GaP, AlGaP, InGaP, AlP, and InP. In one or more embodiments, the first semiconductor layer 31' may be n-AlGaInP doped with n-type Si.

The second semiconductor layer 32' may be a p-type semiconductor layer and may include a semiconductor material having a chemical formula of $In_xAl_yGa_{1-x-y}P$ ($0 \leq x \leq 1$, $0 \leq y \leq 1$, $0 \leq x+y \leq 1$). For example, the second semiconductor layer 32' may be any one or more selected from p-type doped InAlGaP, GaP, AlGaP, InGaP, AlP, and InP. In one or more embodiments, the second semiconductor layer 32' may be p-GaP doped with p-type Mg.

The active layer 36' may be between the first semiconductor layer 31' and the second semiconductor layer 32'. The active layer 36' may include a material having a single or multiple quantum well structure to emit light of a set or specific wavelength band. When the active layer 36' has a multiple quantum well structure in which a quantum layer and a well layer are alternately stacked, the quantum layer may include a material such as AlGaP and/or AlInGaP, and the well layer may include a material such as GaP and/or AlInP. In one or more embodiments, the active layer 36' may include AlGaInP as the quantum layer and AlInP as the well layer to emit red light having a central wavelength band of 620 to 750 nm.

The light-emitting element 30' of FIG. 6 may include a clad layer adjacent to the active layer 36'. As illustrated in the drawing, the third semiconductor layer 33' and the fourth semiconductor layer 34' respectively on and under the active layer 36' and between the first semiconductor layer 31' and the second semiconductor layer 32' may be clad layers.

The third semiconductor layer 33' may be between the first semiconductor layer 31' and the active layer 36'. Like the first semiconductor layer 31', the third semiconductor layer 33' may be an n-type semiconductor. For example, the third semiconductor layer 33' may include a semiconductor material having a chemical formula of $In_xAl_yGa_{1-x-y}P$ ($0 \leq x \leq 1$, $0 \leq y \leq 1$, $0 \leq x+y \leq 1$). In one or more embodiments, the first semiconductor layer 31' may be n-AlGaInP, and the third semiconductor layer 33' may be n-AlInP. However, the disclosure is not limited thereto.

The fourth semiconductor layer 34' may be between the active layer 36' and the second semiconductor layer 32'. Like the second semiconductor layer 32', the fourth semiconductor layer 34' may be an n-type semiconductor. For example, the fourth semiconductor layer 34' may include a semiconductor material having a chemical formula of $In_xAl_yGa_{1-x-y}P$ ($0 \leq x \leq 1$, $0 \leq y \leq 1$, $0 \leq x+y \leq 1$). In one or more embodiments, the second semiconductor layer 32' may be p-GaP, and the fourth semiconductor layer 34' may be p-AlInP.

The fifth semiconductor layer 35' may be between the fourth semiconductor layer 34' and the second semiconductor layer 32'. Like the second semiconductor layer 32' and the fourth semiconductor layer 34', the fifth semiconductor layer 35' may be a p-type doped semiconductor. In some embodiments, the fifth semiconductor layer 35' may reduce a difference in lattice constant between the fourth semiconductor layer 34' and the second semiconductor layer 32'. For example, the fifth semiconductor layer 35' may be a tensile strain barrier reducing (TSBR) layer. For example, the fifth semiconductor layer 35' may include, but is not limited to, p-GaInP, p-AlInP, and/or p-AlGaInP. In one or more embodiments, the third semiconductor layer 33', the fourth semiconductor layer 34' and the fifth semiconductor layer 35' may have a length of, but not limited to, 0.08 to 0.25 μm.

A first electrode layer **37*a*' and a second electrode layer 37*b*' may be provided on the first semiconductor layer 31' and the second semiconductor layer 32', respectively. The first electrode layer 37*a*' may be on a lower surface of the first semiconductor layer 31', and the second electrode layer 37*b*' may be on an upper surface of the second semiconductor layer 32'. However, the disclosure is not limited thereto, and at least any one of the first electrode layer 37*a*' and/or the second electrode layer 37*b*' may also be omitted. For example, in the light-emitting element 30', the first electrode layer 37*a*' may not be on the lower surface of the first semiconductor layer 31', and only one second electrode layer 37*b*' may be on the upper surface of the second semiconductor layer 32'**.

Next, referring to FIG. 7, a light-emitting element 30" may extend in a direction but may have partially inclined side surfaces. For example, the light-emitting element 30" according to one or more embodiments may have a partially conical shape.

In the semiconductor element 30", a plurality of layers may not be stacked in a direction, but each layer may be formed to surround an outer surface of another layer. The light-emitting element 30" may include a semiconductor core, at least a part of which extends in a direction, and an insulating film 38" which surrounds the semiconductor core. The semiconductor core may include a first semiconductor layer 31", an active layer 36", a second semiconductor layer 32", and an electrode layer 37".

The first semiconductor layer 31" may extend in a direction and have both ends inclined toward the center. The first semiconductor layer 31" may have a rod-shaped and/or cylindrical body and ends respectively formed on and under the body and having inclined side surfaces. An upper end of the body may have a steeper slope than a lower end thereof.

The active layer 36" surrounds an outer surface of the body of the first semiconductor layer 31". The active layer 36" may have a ring shape extending (e.g., elongated) in a direction. The active layer 36" may not be formed on the upper and lower ends of the first semiconductor layer 31". However, the disclosure is not limited thereto. Light emitted from the active layer 36" may be radiated not only to both ends of the light-emitting element 30" in the longitudinal direction thereof but also to both side surfaces in the longitudinal direction. The light-emitting element 30" of FIG. 7 may emit a larger amount of light than the light-emitting element 30 of FIG. 5 because its active layer 36" has a larger area.

The second semiconductor layer 32" surrounds an outer surface of the active layer 36" and the upper end of the first semiconductor layer 31". The second semiconductor layer 32" may include a ring-shaped body extending (e.g., elongated) in a direction and an upper end having inclined side surfaces. For example, the second semiconductor layer 32" may directly contact straight side surfaces of the active layer 36" and the inclined upper end of the first semiconductor layer 31". However, the second semiconductor layer 32" is not formed on the lower end of the first semiconductor layer 31".

The electrode layer 37" surrounds an outer surface of the second semiconductor layer 32". The shape of the electrode layer 37" may be substantially the same as that of the second semiconductor layer 32". The electrode layer 37" may contact the entire outer surface of the second semiconductor layer 32".

The insulating film 38" may surround outer surfaces of the electrode layer 37" and the first semiconductor layer 31". The insulating film 38" may directly contact not only the electrode layer 37" but also the lower end of the first semiconductor layer 31" and exposed lower ends of the active layer 36" and the second semiconductor layer 32".

As described above, the light-emitting elements 30 may be sprayed on the electrodes 21 and 22 in a state in which they are dispersed in an element solvent 100 (see FIG. 8) and may be placed between the electrodes 21 and 22 through a process of transmitting an alignment signal to the electrodes 21 and 22. In some embodiments, the light-emitting elements 30 may be prepared in a state in which they are dispersed in the solvent 100 and may be sprayed on each electrode 21 or 22 through an inkjet printing process. Then, when an alignment signal is transmitted to each electrode 21 or 22, an electric field may be formed between them, and the light-emitting elements 30 may be subjected to a dielectrophoretic force applied by the electric field. The light-emitting elements 30 subjected to the dielectrophoretic force may be placed between the first electrode 21 and the second electrode 22 as their orientation directions and positions change.

Figure 8:
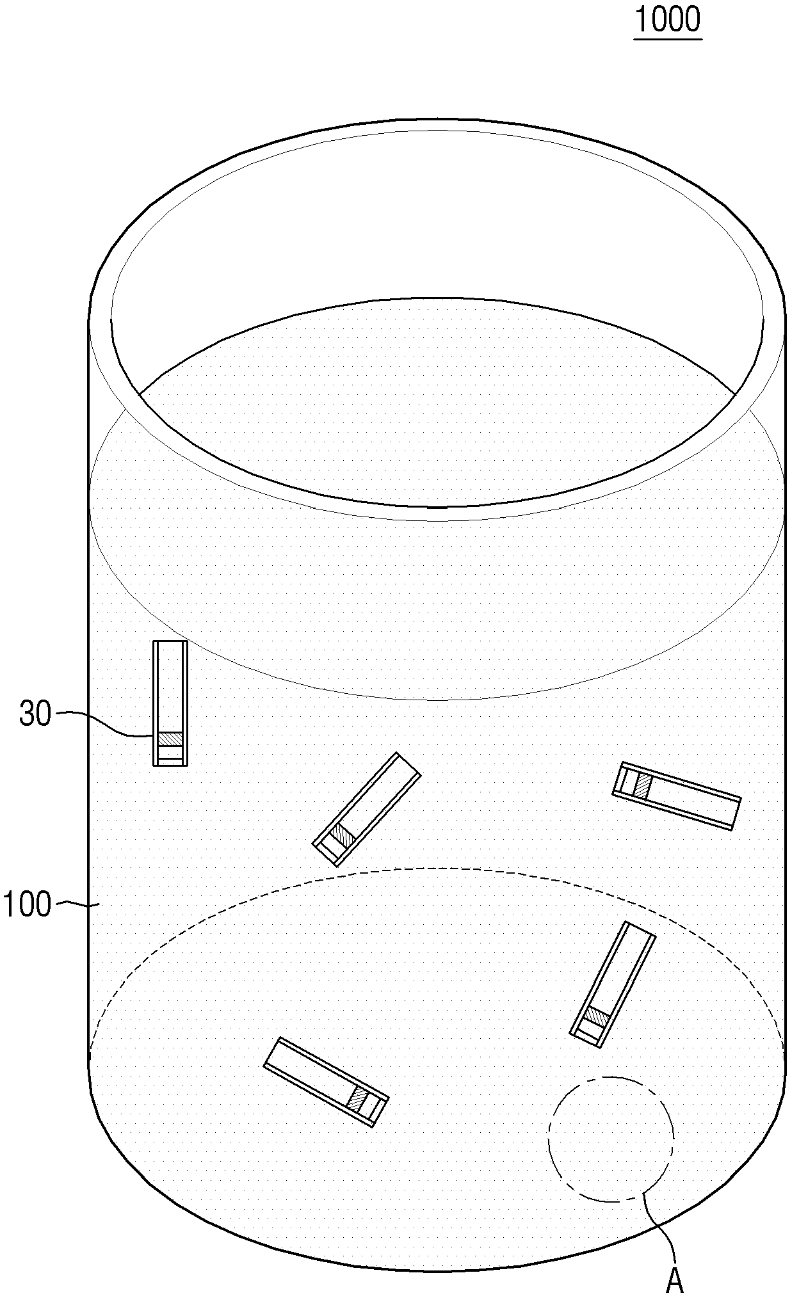
FIG. 8 is a schematic view of an element ink according to one or more embodiments.

FIG. 8 is a schematic view of an element ink according to one or more embodiments.

Referring to FIG. 8, the light-emitting element ink 1000 includes light-emitting elements 30 and an element solvent 100. The light-emitting elements 30 may be the light-emitting elements 30 of FIGS. 5 through 7 described above, and the light-emitting elements 30 of FIG. 5 are illustrated in the drawing. The light-emitting elements 30 may be prepared in a state in which they are dispersed in the element solvent 100. A detailed description of the light-emitting elements 30 is the same as the above description.

The light-emitting elements 30 have a relatively large specific gravity because they include semiconductor crystals. The element solvent 100 according to one or more embodiments may include a material having a high viscosity so that the light-emitting elements 30 can be dispersed therein. The light-emitting element ink 1000 may be sprayed on the electrodes 21 and 22 through an inkjet printing device, and the element solvent 100 may have a viscosity that can keep the light-emitting elements 30 dispersed for a certain period of time. In one or more embodiments, the viscosity of the element solvent 100 may be, but is not limited to, in a range of 7 to 15 cp. The element solvent 100 may include an organic solvent or an inorganic solvent, may be removed in a subsequent process as will be described herein below, and may include a material that does not damage the semiconductor crystals of the light-emitting elements 30.

When the light-emitting elements 30 are placed on the electrodes 21 and 22, the element solvent 100 in which the light-emitting elements 30 are dispersed may be removed by heating or a subsequent treatment process. Here, the element solvent 100 may have a high viscosity so that the light-emitting elements 30 having a relatively large specific gravity can be kept dispersed. The element solvent 100 may include a compound having a large molecular weight. Accordingly, the element solvent 100 may not be completely removed but may remain as a foreign substance on the electrodes 21 and 22 or the light-emitting elements 30. In one or more embodiments, when the element solvent 100 has a viscosity of a certain level or higher, a dielectrophoretic force applied by an electric field may not be sufficient. Therefore, the light-emitting elements 30 may not be smoothly aligned on the electrodes 21 and 22, or the alignment state of the light-emitting elements 30 may be changed in the process of removing the element solvent 100.

According to one or more embodiments, the element solvent 100 may include a photodegradable functional group 150 in which at least one chemical bond is decomposed when light is irradiated. The molecular weight and viscosity of the element solvent 100 may change according to the state of the photodegradable functional group 150 or whether a bond is formed. For example, the element solvent 100 may form a first element solvent 101 having a high molecular weight and viscosity in a state in which the bond of the photodegradable functional group 150 is not decomposed and may form a second element solvent 102 having a low molecular weight and viscosity when the bond of the photodegradable functional group 150 is decomposed.

Figure 9:
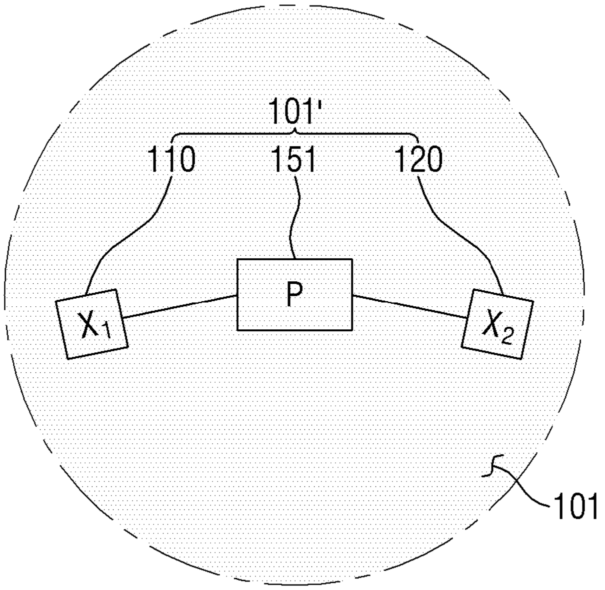
FIGS. 9 and 10 are enlarged views of part A of FIG. 8.
Figure 10:
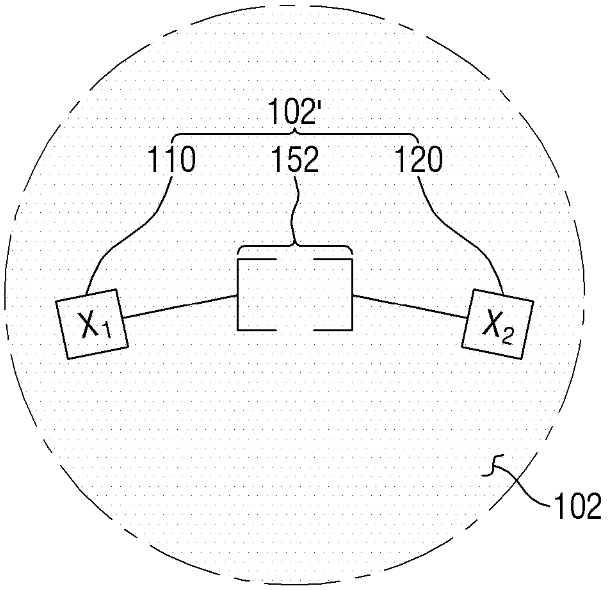

FIGS. 9 and 10 are enlarged views of part A of FIG. 8.

FIG. 9 illustrates the first element solvent 101 formed when the photodegradable functional group 150 of the element solvent 100 is not decomposed, and FIG. 10 illustrates the second element solvent 102 formed when a chemical bond of the photodegradable functional group 150 is decomposed.

In the specification, it may be understood that the 'element solvent 100' refers to a solvent in which the light-emitting elements 30 can be dispersed or a medium thereof, and 'element solvent molecules 100'' refer to chemical molecules constituting the element solvent 100. As will be described herein below, the 'element solvent 100' may form the 'first element solvent 101' or the 'second element solvent 102' depending on the state of the 'element solvent molecules 100'', and it may be understood that the first element solvent 101 is composed of 'first element solvent molecules 101' and the second element solvent 102 is composed of 'second element solvent molecules 102'.

For example, the element solvent 100 of FIG. 8 may be the first element solvent 101 composed of the first element solvent molecules 101' of FIG. 9, and the second element solvent molecules 102' of FIG. 10 may constitute the second element solvent 102. However, these terms may not necessarily be used separately. In some cases, the terms 'element solvent 100' and 'element solvent molecules 101" may be used interchangeably and may have substantially the same meaning. The element solvent molecules 100' of the element solvent 100 will now be described in more detail.

Referring to FIGS. 9 and 10, an element solvent molecule 100' may include a photodegradable functional group 150, a first functional group 110, and a second functional group 120.

The first functional group 110 (X1) and the second functional group 120 (X2) may be functional groups having a molecular weight of a certain level or higher so that the light-emitting elements 30 can be dispersed. The type (or kind) and structure of the first functional group 110 and the second functional group 120 are not particularly limited as long as the first functional group 110 and the second functional group 120 can disperse the light-emitting elements 30 without reacting with them and can be removed in a subsequent process. For example, each of the first functional group 110 and the second functional group 120 may be, but is not limited to, a non-polar functional group having a carbon chain or a polar functional group including oxygen (O) and/or nitrogen (N) atoms in a carbon chain.

In one or more embodiments, the first functional group 110 and the second functional group 120 may include a functional group having the same structure. The first functional group 110 and the second functional group 120 may have substantially the same molecular structure by including a functional group in which monomers of the same structure are repeatedly bonded. However, the disclosure is not limited thereto, and the first functional group 110 and the second functional group 120 may also be different in the number of repetitions of the monomer and, in some cases, may have opposite polarities. This will be described in more detail herein below.

The photodegradable functional group 150 (P) may be bonded to the first functional group 110 and the second functional group 120, and at least one bond may be decomposed by irradiated light to form at least one photodegraded fragment. The photodegradable functional group 150 may include a first photodegradable functional group 151 in which a bond is not decomposed and second photodegradable functional groups 152 which are photodegraded fragments formed by decomposition of a chemical bond of the first photodegradable functional group 151. The first photodegradable functional group 151 is illustrated in FIG. 9, and the second photodegradable functional groups 152 are illustrated in FIG. 10. As the first photodegradable functional group 151 absorbs irradiated light, some chemical bonds may be decomposed to form the second photodegradable functional groups 152.

The photodegradable functional group 150 may be structured to have a relatively weak bond. To form a stable structure in terms of energy by absorbing the energy of irradiated light, some bonds of the photodegradable functional group 150 may be decomposed. Here, the photodegradable functional group 150 may form photodegraded fragments having a small molecular weight when a bond is decomposed. For example, as the first photodegradable functional group 151 absorbs light, a bond of the first photodegradable functional group 151 may be decomposed to form the second photodegradable functional groups 152. Depending on the structure of the photodegradable functional group 150, the position of a bond that is decomposed, etc., a first element solvent molecule 101' may form a plurality of second element solvent molecules 102' having the same structure. However, the disclosure is not limited thereto. In some cases, the second element solvent molecules 102' having different structures may be formed according to the structure of the first element solvent molecule 101'.

The first functional group 110 and the second functional group 120 are included in one molecule in the first element solvent molecule 101'. When a bond of the first photodegradable functional group 151 is decomposed, they may be included in different second element solvent molecules 102', respectively. The first functional group 110 and the second functional group 120 bonded to the photodegradable functional group 150 may be bonded to opposite positions based on a bond of the photodegradable functional group 150 which is photodegraded. For example, the first functional group 110 and the second functional group 120 may be respectively bonded to the second photodegradable functional groups 152 in which a bond has been decomposed to form different second element solvent molecules 102'. In one or more embodiments, a second element solvent molecule 102' including a photodegraded fragment may include at least any one of the first functional group 110 and/or the second functional group 120. However, the disclosure is not limited thereto.

As the first element solvent 101 is irradiated with light, it may be formed into the second element solvent 102 having a low viscosity. In one or more embodiments, the first element solvent 101 may have a viscosity of 7 to 15 cp, and the second element solvent 102 may have a viscosity of 5 cp or less. For example, the first element solvent molecule 101' may have a greater molecular weight than the second element solvent molecules 102'.

As described above, when the display device 10 is manufactured, an operation of spraying the light-emitting element ink 1000, aligning the light-emitting elements 30 on the electrodes 21 and 22, and then removing the element solvent 100 may be performed. Here, if the element solvent 100 is the first element solvent 101 having a high viscosity by including the first element solvent molecules 101', when an electric field is formed in the light-emitting element ink 1000, a relatively weak dielectrophoretic force may be applied to the light-emitting elements 30. Accordingly, the light-emitting elements 30 may not be accurately aligned on the electrodes 21 and 22. In addition, the first element solvent 101 may remain as a foreign substance without being completely removed in the removing of the element solvent 100.

According to one or more embodiments, a method for manufacturing the display device 10 includes forming the second element solvent 102 having a low viscosity by irradiating light to the first element solvent 101. Because the element solvent 100 according to the embodiments includes the photodegradable functional group 150 in which a bond is decomposed by irradiated light, its molecular weight and viscosity may be reduced by the light.

The first element solvent molecule 101' is partially decomposed by irradiating light to the element solvent 100, i.e., the first element solvent 101 sprayed on the electrodes 21 and 22, thereby forming the second element solvent molecules 102'. The second element solvent molecules 102' may be structured to have a relatively low molecular weight, and thus the second element solvent 102 may have a low viscosity. When an electric field is formed in the light-emitting element ink 1000 after the second element solvent 102 is formed, a strong dielectrophoretic force may be applied to the light-emitting elements 30, and thus the light-emitting elements 30 may be placed on the electrodes 21 and 22 with a high degree of alignment. In addition, the second element solvent 102 including molecules having a relatively low molecular weight may be easily removed in a subsequent low-temperature heat treatment process, thereby minimizing or reducing a change in the alignment state of the light-emitting elements 30 positioned on the electrodes 21 and 22. For example, the element solvent 100 may have a viscosity that allows it to be sprayed from a nozzle while keeping the light-emitting elements 30 dispersed, but the viscosity of the element solvent 100 may be reduced in a subsequent process. This will be described in more detail herein below.

The element solvent molecule 100' according to one or more embodiments may have a structure of Formula 1 below:

$$X1\text{-}P\text{-}X2, \qquad \text{Formula 1}$$

where P is the photodegradable functional group 150, X1 is the first functional group 110, and X2 is the second functional group 120.

Referring to Formula 1, the element solvent molecule 100' of the element solvent 100 according to the embodiments may include the photodegradable functional group 150 (P) and at least one functional group bonded to the photodegradable functional group 150 (P), for example, the first functional group 110 (X1) and the second functional group 120 (X2). When some bonds of the photodegradable functional group 150 (P) are decomposed, one or more photodegraded fragments (or second photodegradable functional groups 152) may be formed, and each of the photodegradable functional groups 152 may be bonded to the first functional group 110 (X1) or the second functional group 120 (X2). The element solvent molecule 100' may be formed into element solvent molecules having a small molecular weight and a low viscosity, e.g., the second element solvent molecules 102', by decomposition of the photodegradable functional group 150 (P).

In one or more embodiments, the photodegradable functional group 150 may be, but is not limited to, any one of a cyclobutyl group, a maleic imide dimer, an acrylate dimer, and/or a carbonyl group.

A bond of the photodegradable functional group 150 implemented as the above functional groups may be decomposed by irradiated light to form photodegraded fragments as shown in Chemical Reaction Formulae 1 through 4 below. For example, as the first photodegradable functional group 151 absorbs light, a bond of the first photodegradable functional group 151 is decomposed to form the second photodegradable functional groups 152. The element solvent molecule 100' or the first element solvent molecule 101' having a high molecular weight and viscosity may form the second element solvent molecules 102' having a low molecular weight and viscosity:

Chemical Reaction Formula 1

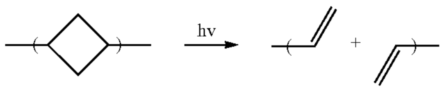

Chemical Reaction Formula 2

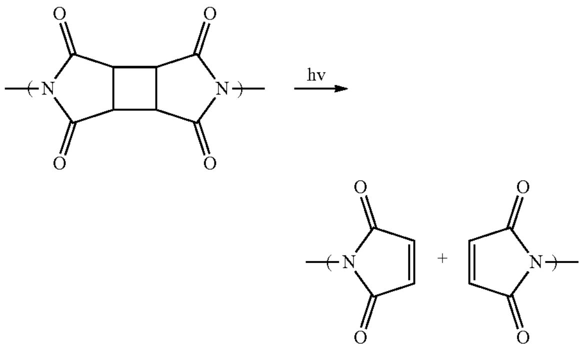

Chemical Reaction Formula 3

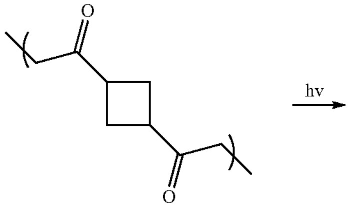

-continued

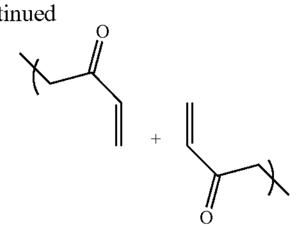

Chemical Reaction Formula 4

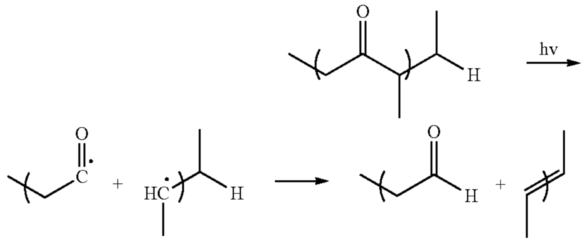

For example, as shown in Chemical Reaction Formula 1, when the photodegradable functional group 150 includes a cyclobutyl group, each carbon (C) of the cyclobutyl group may be separated into two alkene molecules through retro-[2+2]cycloaddition. Accordingly, the first photodegradable functional group 151 may be separated into two second photodegradable functional groups 152 (e.g., two alkene molecules) having a small molecular weight, and its molecular weight viscosity may be reduced. When the photodegradable functional group 150 is decomposed as shown in Chemical Reaction Formulae 1 through 4, the first functional group 110 and the second functional group 120 are bonded to different second photodegradable functional groups 152. Each second element solvent molecule 102' formed by light irradiation may be bonded to any one of the first functional group 110 and/or the second functional group 120 and may have a low molecular weight and viscosity. Chemical Reaction Formulae 2 through 4 may also be understood in the same way, and thus a detailed description thereof is omitted.

In one or more embodiments, each of the first functional group 110 and the second functional group 120 may be a compound represented by Chemical Formula 1 below:

Chemical Formula 1

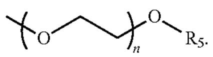

In Chemical Formula 1, n is an integer of 1 to 5, and $R_5$ is any one of a C1-C5 alkyl group, a C2-C5 alkenyl group, a C2-C5 alkynyl group, a C1-C5 alkyl ether group, and/or a C2-C5 alkenyl ether group.

Each of the first functional group 110 and the second functional group 120 may include at least one ethylene glycol ($-OCH_2CH_2O-$) monomer as shown in Chemical Formula 1 above. The first functional group 110 and the second functional group 120 may be bonded to the photodegradable functional group 150 and may have a molecular weight and viscosity sufficient for the element solvent 100 to disperse the light-emitting elements 30. The value of n of each of the first and second functional groups 110 and 120 means the number of repeating units of the ethylene glycol monomer and may be an integer of 1 to 5 although it is not particularly limited.

In the element solvent molecule 100', for example, in the first element solvent molecule 101' in which the photodegradable functional group 150 is not decomposed, the sum (n1+n2) of the value (n1) of n of the first functional group 110 and the value (n2) of n of the second functional group 120 may be in a range of 2 to 6. For example, in one element solvent molecule 100', the number of ethylene glycol monomers included in the first functional group 110 and the second functional group 120 may be in a range to 2 to 6. When the sum (n1+n2) of the value (n1) of n of the first functional group 110 and the value (n2) of n of the second functional group 120 is 2 or less, the first element solvent molecule 101' may not have a sufficient molecular weight and viscosity. Thus, the light-emitting elements 30 may not be kept dispersed. When the sum (n1+n2) of the value (n1) of n of the first functional group 110 and the value (n2) of n of the second functional group 120 is greater than 6, the molecular weight and viscosity of the second element solvent molecules 102' formed by decomposition of the photodegradable functional group 150 may have a large value, and the dielectrophoretic reactivity of the light-emitting elements 30 may be reduced.

In one or more embodiments, the element solvent molecule 100' may be any one of compounds represented by Chemical Formulae 2 through 5 below:

Chemical Formula 2

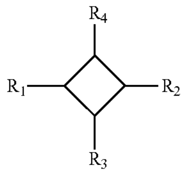

Chemical Formula 3

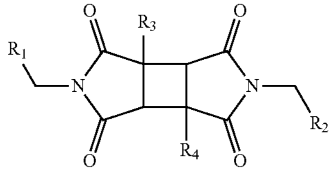

Chemical Formula 4

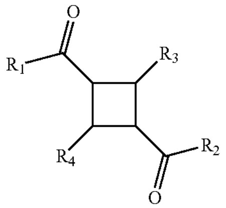

Chemical Formula 5

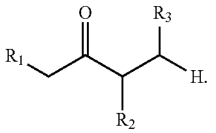

In Chemical Formulae 2 through 5, $R_1$ and $R_2$ are represented by Chemical Formula 1, the sum of an n value (n1) in Chemical Formula 1 of $R_1$ and an n value (n2) in Chemical Formula 1 of $R_2$ is in a range of 2 to 6, and each of $R_3$ and $R_4$ is independently any one of a C1-C10 alkyl group, a C2-C10 alkenyl group, a C2-C10 alkynyl group, a C1-C10 alkyl ether group, and/or a C2-C10 alkenyl ether group.

Referring to Chemical Formulae 2 through 5, the element solvent 100 includes at least one functional group represented by Chemical Formula 1 and a functional group in which a bond can be decomposed by light irradiation. In Chemical Formulae 2 through 5, $R_1$ and $R_2$ may include a compound represented by Chemical Formula 1 and may be the first functional group 110 and the second functional group 120 of the element solvent molecule 100', respectively. $R_1$ and $R_2$, for example, the first functional group 110 and the second functional group 120, are the same as described above.

$R_3$ and $R_4$ may be functional groups selected so that the element solvent 100 has a molecular weight sufficient to disperse the light-emitting elements 30. For example, each of $R_3$ and $R_4$ may independently be, but is not limited to, any one of a C1-C10 alkyl group, a C2-C10 alkenyl group, a C2-C10 alkynyl group, a C1-C10 alkyl ether group, and/or a C2-C10 alkenyl ether group.

For example, in the case of a compound of Chemical Formula 2, a cyclobutyl group may be included as a functional group in which a bond can be decomposed by light irradiation, and the first functional group 110 and the second functional group 120 may include a functional group in which ethylene glycol ($-OCH_2CH_2O-$) monomers are repeated.

In Chemical Formula 2, a cyclobutyl group may be decomposed into two alkene molecules through retro-[2+2] cycloaddition by light irradiation. Each of the two alkene molecules thus formed includes a functional group in which ethylene glycol ($-OCH_2CH_2O-$) monomers are repeated. For example, the first photodegradable functional group 151 of the first element solvent molecule 101' may be a cyclobutyl group, and the second photodegradable functional groups 152 formed by decomposition due to light irradiation may be alkene groups. The first functional group 110 and the second functional group 120 may each include an ethylene glycol ($-OCH_2CH_2O-$) monomer and may be bonded to one cyclobutyl group in the first element solvent molecule 101', but may be bonded to two different alkene groups in the second element solvent molecule 102'. The second element solvent molecules 102' are compounds having a smaller molecular weight than the first element solvent molecule 101' and thus have a low viscosity, thereby increasing the dielectrophoretic reactivity of the dispersed light-emitting elements 30. In one or more embodiments, the second element solvent molecules 102' can be easily removed by volatilization at a relatively low temperature in a subsequent process.

In one or more embodiments, the element solvent molecule 100' may include a compound represented by Chemical Formula 6 below:

Chemical Formula 6

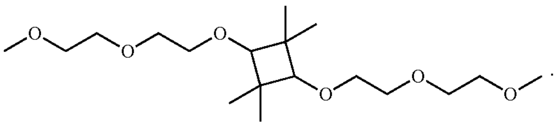

The element solvent molecule 100' may be represented by Chemical Formula 6 above because the photodegradable functional group 150 is a 1,1,3,3-tetramethyl-cyclobutyl group, and the first and second functional groups 110 and 120 have 2 as the n value and a methyl ($-CH3$) group as $R_5$ in Chemical Formula 1. The compound represented by Chemical Formula 6 may have a viscosity of 9 to 11 cp. Thus, the light-emitting elements 30 can be kept dispersed.

In one or more embodiments, by having a viscosity within the above range, the element ink 1000 can be sprayed on the electrodes 21 and 22 through a nozzle of the inkjet printing device.

When the element solvent molecule 100' is a compound represented by Chemical Formula 6, the photodegradable functional group 150 may be decomposed through a reaction in Chemical Reaction Formula 5 below:

Chemical Reaction Formula 5

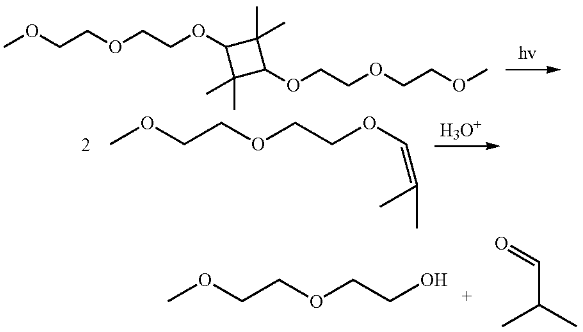

Referring to Chemical Reaction Formula 5, in the compound represented by Chemical Formula 6, a cyclobutyl group may be decomposed into two alkene molecules through retro-[2+2]cycloaddition by irradiation of light (hv). Each of the two alkene molecules includes an ethylene glycol monomer which may be decomposed into diethylene glycol monomethyl alcohol ($CH_3OCH_2CH_2OCH_2CH_2OH$) and isobutyl aldehyde ($(CH_3)_2CHO$) by hydrolysis ($H_3O^+$). For example, the element solvent molecule 100' may include the first element solvent molecule 101' represented by Chemical Formula 6, and the first photodegradable functional group 151 of the first element solvent molecule 101' may be decomposed to generate the second element solvent molecules 102' represented by diethylene glycol monomethyl alcohol ($CH_3OCH_2CH_2OCH_2CH_2OH$) and isobutyl aldehyde ($(CH_3)_2CHO$).

The first element solvent molecule 101' represented by Chemical Formula 6 has a relatively high molecular weight and viscosity. Because the second element solvent molecules 102' formed by decomposition of a cyclobutyl group have a low molecular weight and viscosity, the dielectrophoretic reactivity of the light-emitting elements 30 can be increased, and the second element solvent 102 can be easily removed in a subsequent process.

In one or more embodiments, in the element solvent 100, the first element solvent molecule 101' before the photodegradable functional group 150 is decomposed may have a molecular weight of 300 to 800 g/mol, and the first element solvent 101 may have a boiling point of 350 to 400° C. and a viscosity of 7 to 15 cp. The second element solvent molecules 102' formed by partial decomposition of a bond of the photodegradable functional group 150 may have a molecular weight of 50% or less of the molecular weight of the first element solvent molecule 101', and the second element solvent 102 may have a boiling point of 50 to 200° C. and a viscosity of 5 cp or less.

As the molecular weight of the first element solvent molecule 101' increases, the first element solvent 101 can keep the light-emitting elements 30 having a large specific gravity dispersed for a certain period of time. When the molecular weight of the first element solvent molecule 101' is 300 g/mol or less, the light-emitting elements 30 cannot be kept dispersed after the light-emitting element ink 1000 is made. Thus, the light-emitting element ink 1000 may be sprayed with non-uniform dispersion through the nozzle of the inkjet printing device. In one or more embodiments, when the molecular weight of the first element solvent molecule 101' has a large value of 800 g/mol or more, the second element solvent molecules 102' formed by decomposition of the photodegradable functional group 150 through light irradiation may also have a high molecular weight and viscosity, thus reducing the dielectrophoretic reactivity of the light-emitting elements 30.

When the first element solvent molecule 101' according to embodiments of the present disclosure has a molecular weight within the above range, the second element solvent molecules 102' formed by decomposition of the photodegradable functional group 150 may have a suitably low molecular weight and viscosity.

A method for manufacturing a display device 10 according to one or more embodiments will now be described.

Figure 11:
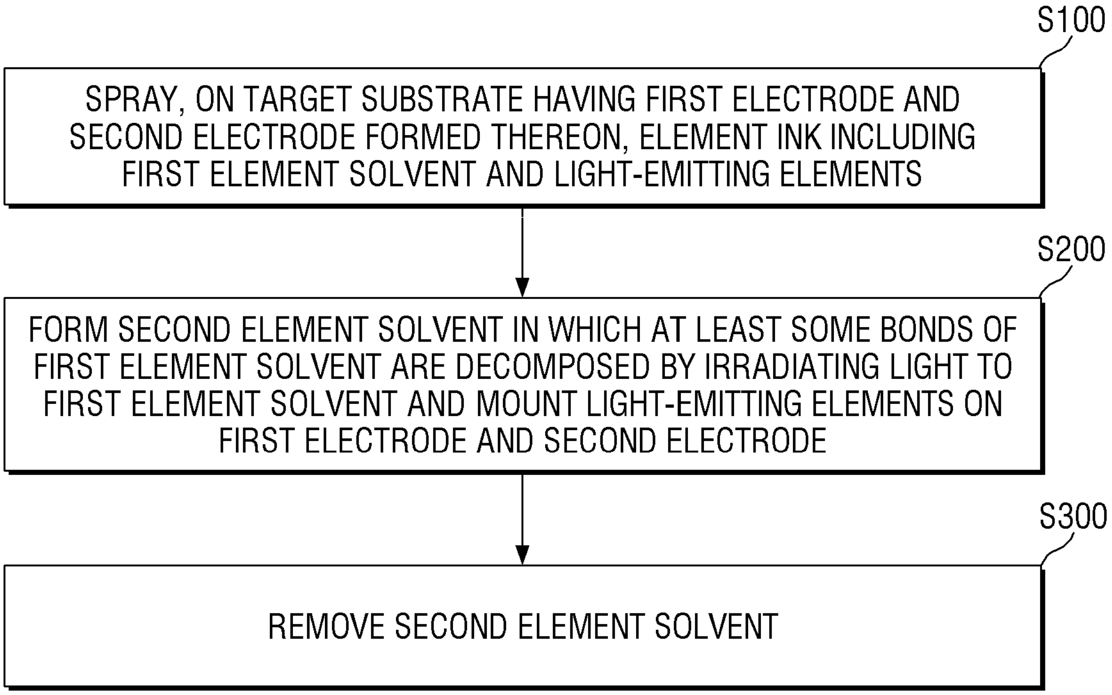
FIG. 11 is a flowchart illustrating a method for manufacturing a display device according to one or more embodiments.

FIG. 11 is a flowchart illustrating a method for manufacturing a display device according to one or more embodiments.

Referring to FIG. 11, the method for manufacturing the display device 10 includes preparing a target substrate SUB and a first electrode 21 and a second electrode 22 on the target substrate SUB, spraying, on the first electrode 21 and the second electrode 22, a light-emitting element ink 1000 including a first element solvent 100 in which light-emitting elements 30 are dispersed, forming a second element solvent 102 by removing at least one chemical bond included in the first element solvent 100, and mounting the light-emitting elements 30 on the first electrode 21 and the second electrode 22.

The method for manufacturing the display device 10 according to the embodiments may include spraying, on the target substrate SUB having the first electrode 21 and the second electrode 22 formed thereon, the light-emitting element ink 1000 including the first element solvent 101 and the light-emitting elements 30 dispersed in the first element solvent 101 (operation S100); forming the second element solvent 102 in which at least some bonds of the first element solvent 101 are decomposed by irradiating light (UV) to the first element solvent 101 and mounting the light-emitting elements 30 on the first electrode 21 and the second electrode 22 (operation S200); and removing the second element solvent 102 (operation S300).

As described above, the display device 10 may be manufactured by spraying the light-emitting element ink 1000 using an inkjet printing device and placing the light-emitting elements 30 on the electrodes 21 and 22. Here, the element solvent 100 in which the light-emitting elements 30 are dispersed may include the first element solvent 101 having a viscosity that can maintain the dispersed state. However, in order to improve the degree of alignment in the mounting of the light-emitting elements 30 (operation S200), the method for manufacturing the display device 10 according to the embodiments may include forming the second element solvent 102 by irradiating light to the first element solvent 101. The formation of the second element solvent 102 having a lower viscosity than the first element solvent 101 may improve the dielectrophoretic reactivity of the light-emitting elements 30 and minimize or reduce a change in the alignment state of the light-emitting elements 30 that may occur during the removal of the second element solvent 102.

The method for manufacturing the display device according to the embodiment will now be described in more detail with reference to FIGS. 12 through 23.

Figure 12:
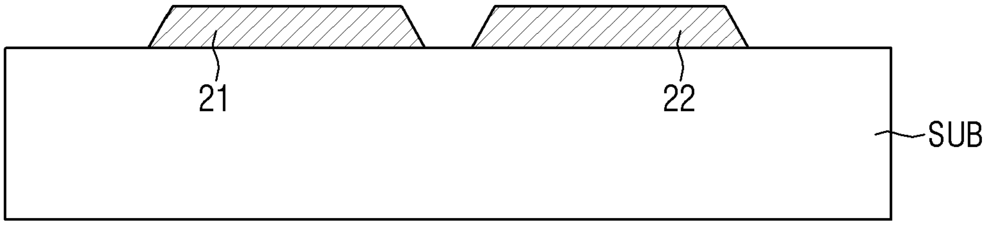
FIGS. 12 and 13 are cross-sectional views illustrating one or more acts of the method for manufacturing the display device according to one or more embodiments.
Figure 13:
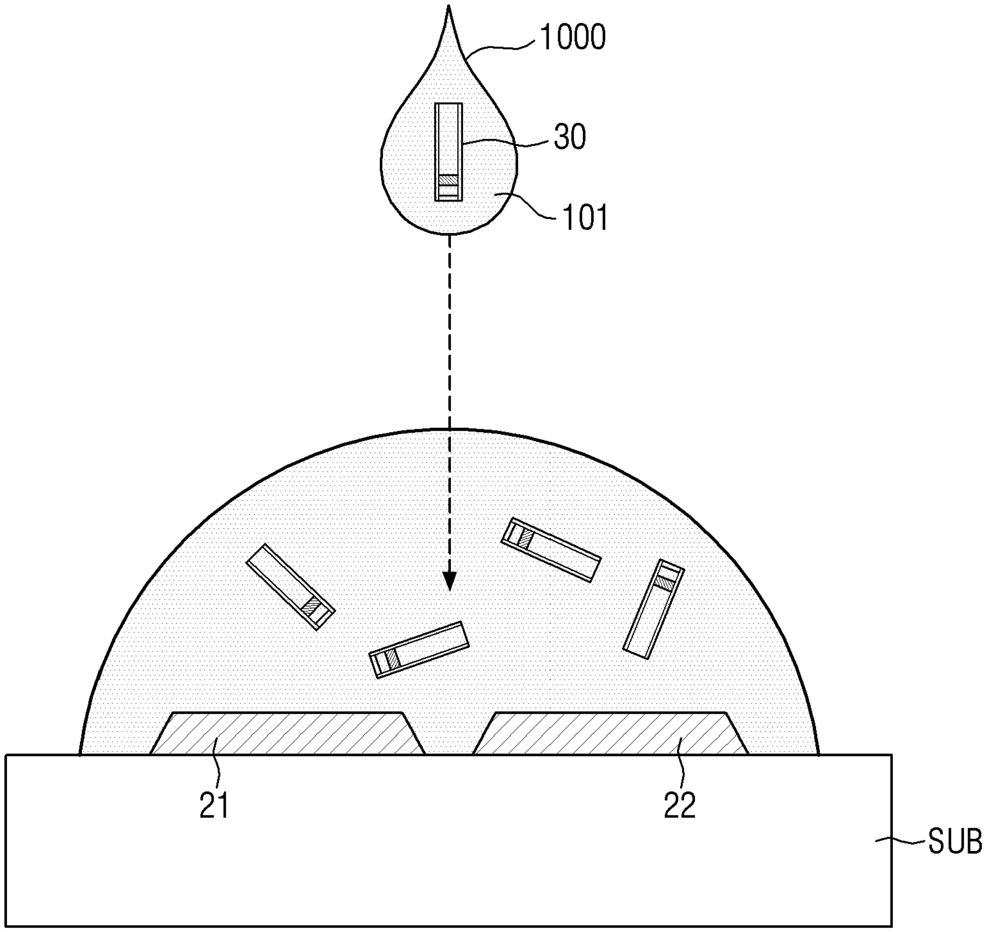

FIGS. 12 and 13 are cross-sectional views illustrating a part (e.g., one or more acts) of the method for manufacturing the display device according to one or more embodiments.

First, referring to FIG. 12, a target substrate SUB on which a first electrode 21 and a second electrode 22 are formed is prepared (operation S100). In the following drawings, only the electrodes 21 and 22 and light-emitting elements 30 on the target substrate SUB are illustrated for ease of description. However, the display device 10 is not limited thereto and may include more members such as inner banks 41 and 42, an outer bank 45 and/or contact electrodes 26 as described above.

Next, referring to FIG. 13, a light-emitting element ink 1000 including the light-emitting elements 30 is sprayed on the first electrode 21 and the second electrode 22. The light-emitting element ink 1000 may include an element solvent 100, and the light-emitting elements 30 may be dispersed in the element solvent 100. In one or more embodiments, the light-emitting element ink 1000 may be provided in a solution or colloid state. The element solvent 100 of the light-emitting element ink 1000 sprayed on the electrodes 21 and 22 may be a first element solvent 101 including a first photodegradable functional group 151 in which a bond is not decomposed as described above. The first element solvent 101 may have a relatively high molecular weight and viscosity and may be sprayed on the electrodes 21 and 22 while the light-emitting elements 30 are kept dispersed.

Next, the light-emitting elements 30 are mounted between the first electrode 21 and the second electrode 22 (operation S200). The mounting of the light-emitting elements 30 (operation S200) may include forming an electric field EL in the light-emitting element ink 1000 by transmitting an electrical signal to the first electrode 21 and the second electrode 22 and letting the light-emitting elements 30 be placed on the electrodes 21 and 22 by a dielectrophoretic force F applied by the electric field.

As illustrated in the drawing (e.g., in FIG. 14), when alternating current (AC) power is applied to the electrodes 21 and 22, the electric field EL may be formed in the light-emitting element ink 1000 sprayed on the electrodes 21 and 22. The electric field EL may apply a dielectrophoretic force to the light-emitting elements 30, and the light-emitting elements 30 to which the dielectrophoretic force has been applied may be placed on the first electrode 21 and the second electrode 22.

However, because the first element solvent 101 includes first element solvent molecules 101' having a large molecular weight, its viscosity has a large value. The light-emitting elements 30 may be subjected to a weak dielectrophoretic force F1 in the first element solvent 101 having a high viscosity and may be placed on the electrodes 21 and 22 with a non-uniform degree of alignment.

Figure 14:
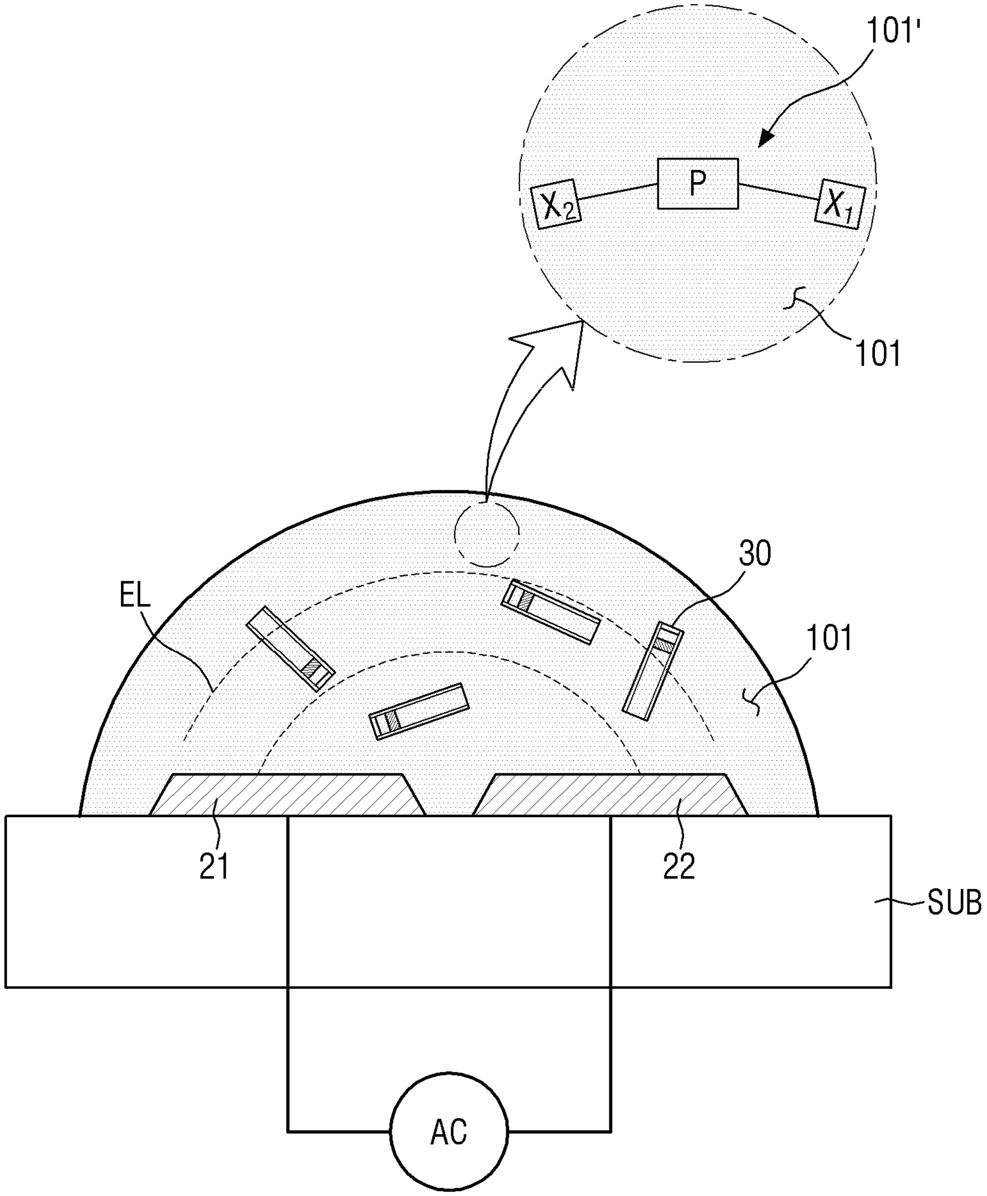
FIGS. 14 through 16 are schematic views illustrating a process in which light-emitting elements dispersed in an element solvent are placed on electrodes according to one or more embodiments.
Figure 15:
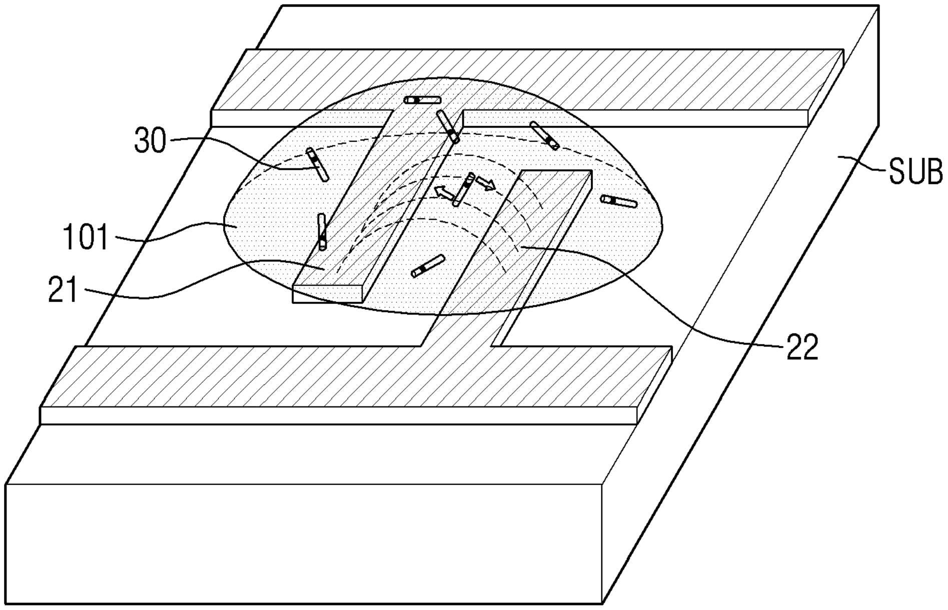
Figure 16:
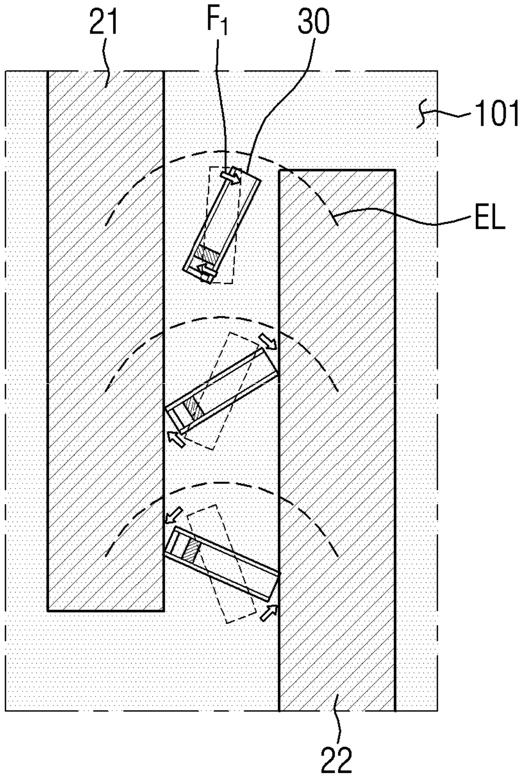

FIGS. 14 through 16 are schematic views illustrating a process in which light-emitting elements dispersed in an element solvent are placed on electrodes according to one or more embodiments.

Referring to FIGS. 14 and 15, the first element solvent 101 and the light-emitting elements 30 are sprayed on the electrodes 21 and 22, and the electric field EL is formed by applying AC power through the electrodes 21 and 22. The light-emitting elements 30 may receive the dielectrophoretic force $F_1$ applied by the electric field EL and move from their initially dispersed positions (indicated by dotted lines in FIG. 14) toward the electrodes 21 and 22. However, the light-emitting elements 30 may experience the resistance of the first element solvent 101 having a high viscosity, and thus a relatively weak dielectrophoretic force $F_1$ may be applied to the light-emitting elements 30.

Referring to FIG. 16, the electric field EL may be formed on the first element solvent 101 by the AC power applied to the first electrode 21 and the second electrode 22. The dielectrophoretic force $F_1$ due to the electric field EL may be applied to the light-emitting elements 30, thereby orienting the light-emitting elements 30 toward the electrodes 21 and 22. As described above, the first element solvent 101 may have a high viscosity by including the first element solvent molecules 101' having a relatively large molecular weight. Due to the resistance of the first element solvent 101 having a high viscosity, a relatively weak dielectrophoretic force $F_1$ is applied to the light-emitting elements 30.

As illustrated in the drawing, some light-emitting elements 30 may not be on the electrodes 21 and 22. In addition, even if both ends of the light-emitting elements 30 are on the electrodes 21 and 22, an acute angle formed by a direction in which each light-emitting element 30 extends and the electrodes 21 and 22 may not be constant. The dielectrophoretic force $F_1$ applied by the electric field EL may not have a sufficient intensity to cause the light-emitting elements 30 dispersed in the first element solvent 101 having a high viscosity to be oriented with a uniform (or substantially uniform) degree of alignment.

In addition, if the first element solvent 101 is directly volatilized and removed in a subsequent process, the orientation or alignment state of the light-emitting elements 30 may be changed by the first element solvent 101 having a high viscosity, or the first element solvent 101 may not be completely removed.

Figure 17:
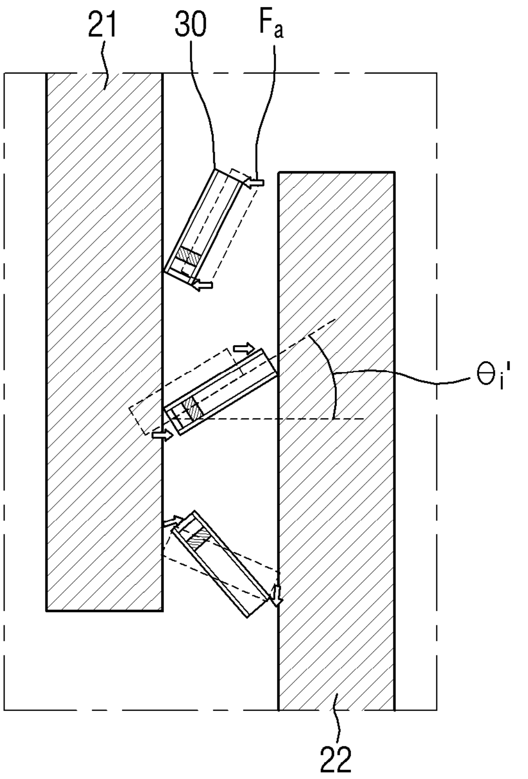
FIG. 17 is a plan view illustrating a state in which the element solvent has been removed according to one or more embodiments.
Figure 18:
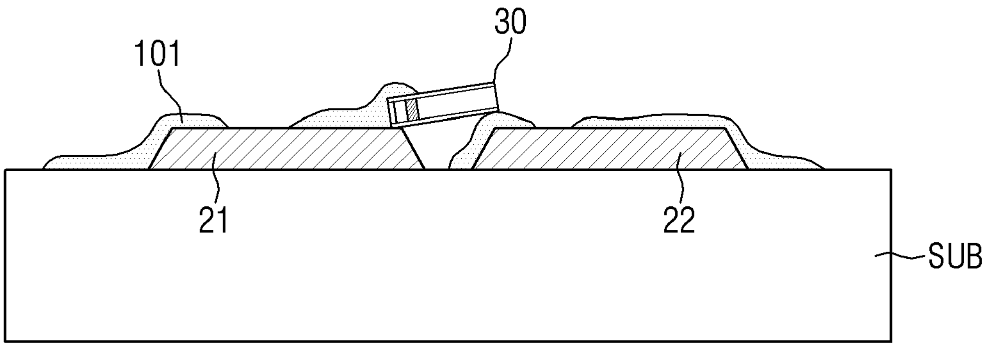
FIG. 18 is a cross-sectional view illustrating the state in which the element solvent has been removed according to one or more embodiments.

FIG. 17 is a plan view illustrating a state in which the element solvent has been removed according to one or more embodiments. FIG. 18 is a cross-sectional view illustrating the state in which the element solvent has been removed according to the one or more embodiments.

Referring to FIG. 17, as the first element solvent 101 is removed, a hydrodynamic force Fa may be applied in a direction to the light-emitting elements 30 in the first element solvent 101 landed on the electrodes 21 and 22. The first element solvent 101 having a high viscosity may apply a strong hydrodynamic force Fa to the light-emitting elements 30 as it is removed by volatilization, and the light-emitting elements 30 may move from their initial alignment positions (indicated by dotted lines in FIG. 17). Thus, the alignment state of the light-emitting elements 30 may be changed. Accordingly, an acute angle Θi' formed by the direction in which the light-emitting elements 30 that are finally positioned on the electrodes 21 and 22 extend and a direction perpendicular (e.g., substantially perpendicular) to the direction in which the electrodes 21 and 22 extend may have a large value. The acute angle Θi' may be 20 degrees or more. Accordingly, the acute angle formed by the direction in which the light-emitting elements 30 extend and the direction in which the electrodes 21 and 22 extend may be 80 degrees or less.

Referring to FIG. 18, the first element solvent 101 includes the first element solvent molecules 101' having a large molecular weight. Therefore, some residues may remain even if a process of removing the first element solvent 101 by volatilization is performed. The residues may become impurities in the display device 10 and cause a contact failure with the light-emitting elements 30 in a subsequent process of forming the contact electrodes 26.

In contrast, the method for manufacturing the display device 10 according to the embodiments of the present disclosure includes forming a second element solvent 102 by irradiating light UV to the first element solvent 101 before the mounting of the light-emitting elements 30 (operation S200). When the light UV is irradiated to the first element solvent 101, a chemical bond of the first photodegradable functional group 151 is decomposed to form photodegraded fragments, for example, second photodegradable functional groups 152. A first element solvent molecule 101' may form a second element solvent molecule 102' including a second photodegradable functional group 152 and a first functional group 110 and/or a second functional group 120 bonded to the second photodegradable functional group 152. The second element solvent molecules 102' may have a smaller molecular weight than the first element solvent molecules 101' and may form the second element solvent 102 having a low viscosity. The light-emitting elements 30 may be dispersed in the second element solvent 102 having a low viscosity, and their orientation directions may be aligned on the electrodes 21 and 22 by a strong dielectrophoretic force $F_2$ applied by the electric field EL.

Figure 19:
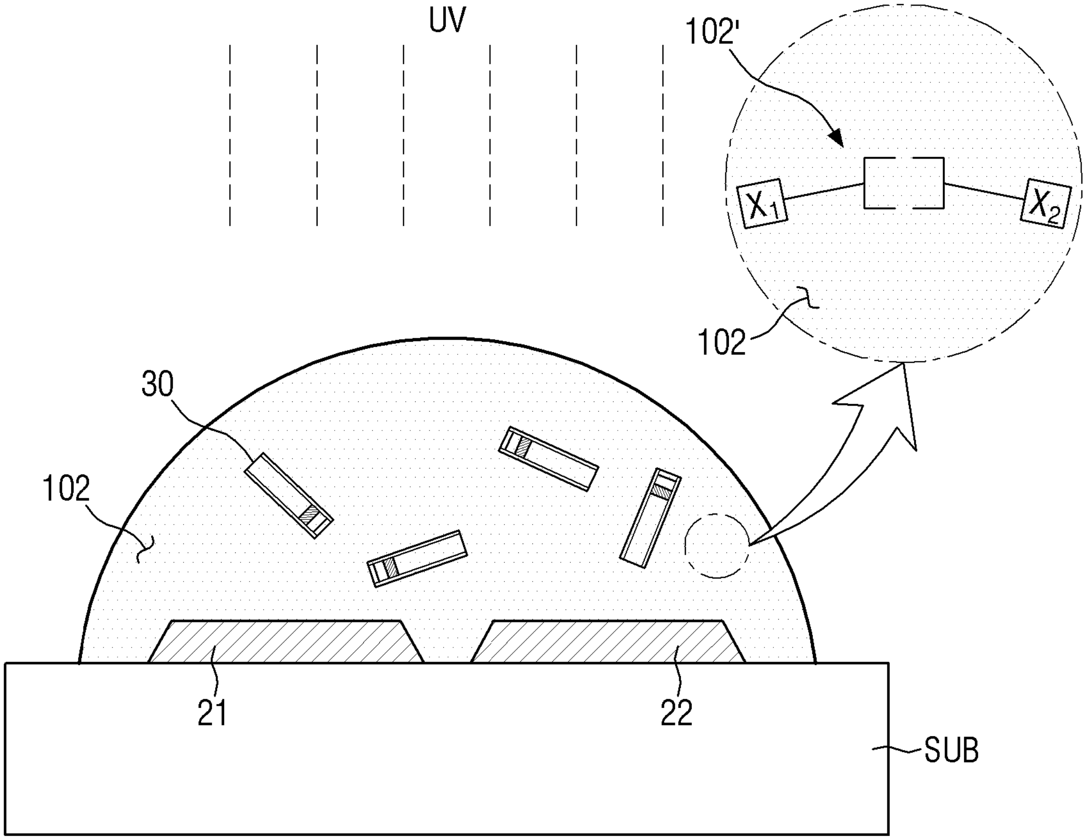
FIG. 19 is a schematic view illustrating an operation of forming a second element solvent according to one or more embodiments.

FIG. 19 is a schematic view illustrating an operation of forming a second element solvent according to one or more embodiments.

Referring to FIG. 19, the second element solvent 102 is formed by irradiating light UV to the first element solvent 101. The first element solvent 101 may include the first photodegradable functional group 151, and a bond of the first photodegradable functional group 151 may be decomposed by the irradiated light UV to form photodegraded fragments or the second photodegradable functional groups 152. The first element solvent molecules 101' may form the second element solvent molecules 102' having a small molecular weight. Accordingly, the light-emitting elements 30 may be dispersed in the second element solvent 102 having a relatively low viscosity, and a strong dielectrophoretic force $F_2$ may be applied to the light-emitting elements 30 by the electric field EL because the resistance of the solvent is reduced.

Figure 20:
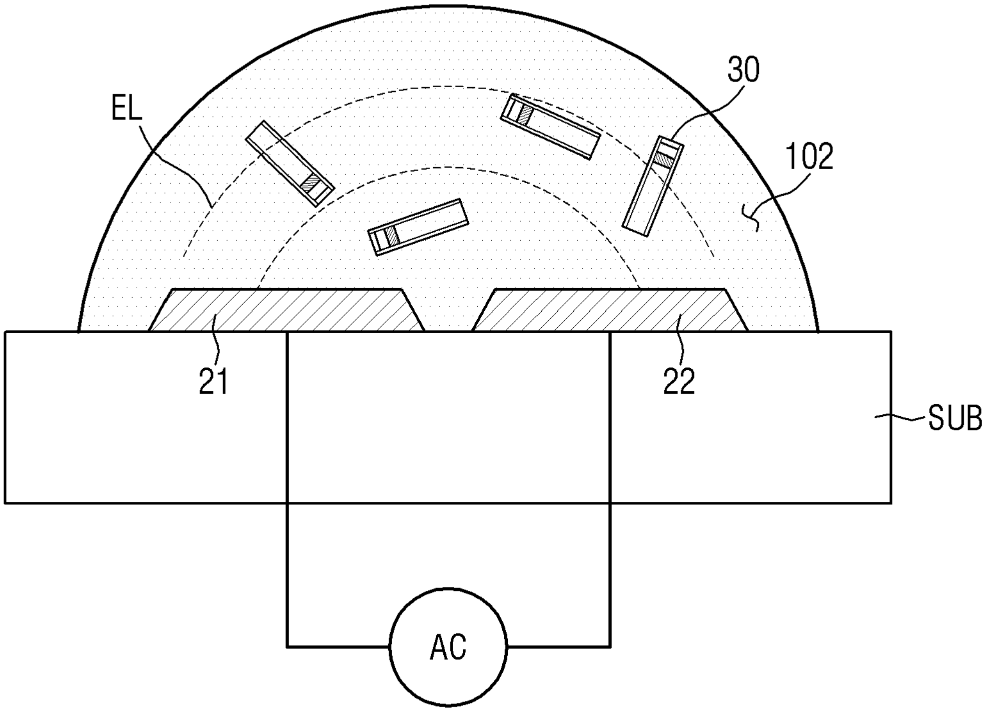
FIGS. 20 through 22 are schematic views illustrating a process in which light-emitting elements dispersed in an element solvent are placed on electrodes according to one or more embodiments.
Figure 21:
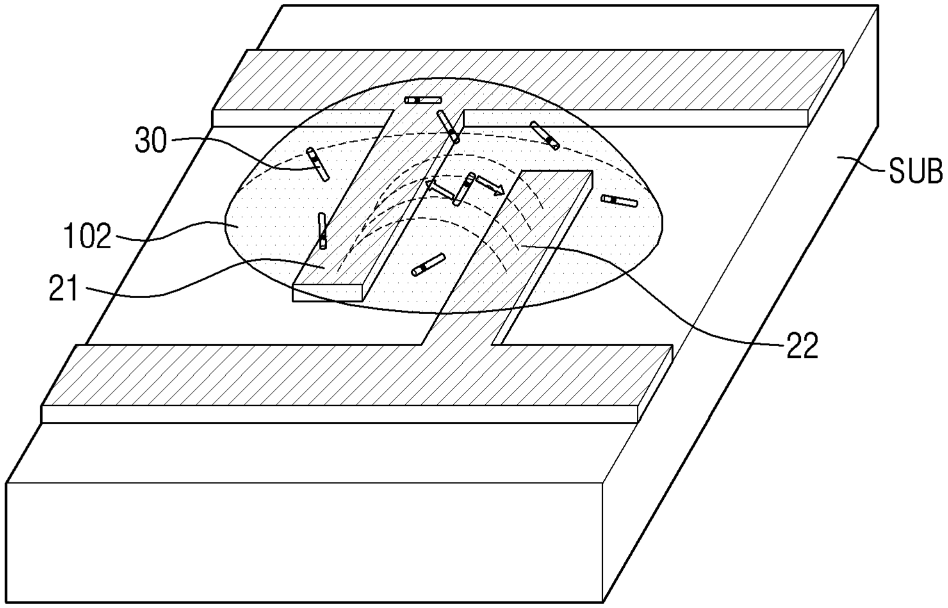
Figure 22:
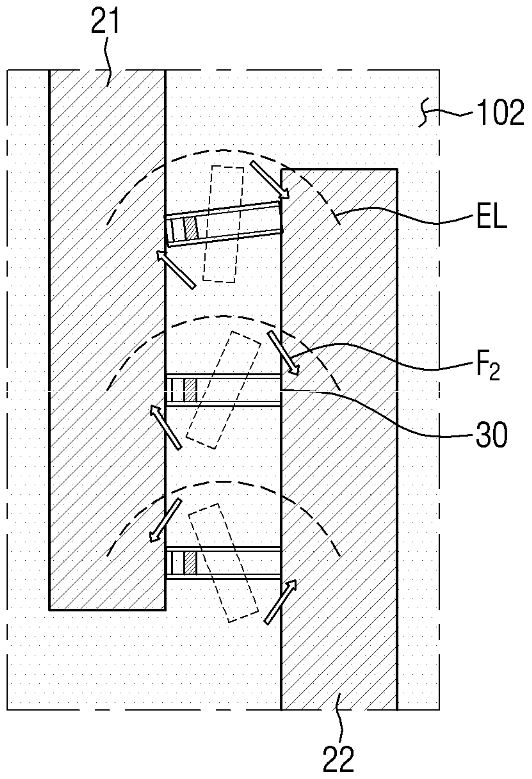

FIGS. 20 through 22 are schematic views illustrating a process in which light-emitting elements dispersed in an element solvent are placed on electrodes according to one or more embodiments.

Referring to FIGS. 20 through 22, because the second element solvent 102 has a low viscosity, the dielectrophoretic force $F_2$ applied to the light-emitting elements 30 by the electric field EL may have a strong intensity. The light-emitting elements 30 may have both ends moved from their initially sprayed positions (indicated by dotted lines in FIG. 20) toward the electrodes 21 and 22 and may be oriented with a relatively uniform (e.g., substantially uniform) degree of alignment. As illustrated in the drawings, both ends of most of the light-emitting elements 30 may be on the electrodes 21 and 22. For example, the acute angle formed by the direction in which the light-emitting elements 30 extend and the electrodes 21 and 22 may be constant. The method for manufacturing the display device 10 according to the embodiments may include forming the second element solvent 102 by irradiating light UV to the first element solvent 101, and the light-emitting elements 30 may be aligned in the second element solvent 102 having a low viscosity. For example, the display device 10 having the improved dielectrophoretic reactivity and improved degree of alignment of the light-emitting elements 30 can be manufactured.

Finally, when the light-emitting elements 30 are aligned on the electrodes 21 and 22, the element solvent 100, for example, the second element solvent 102 is removed.

Figure 23:
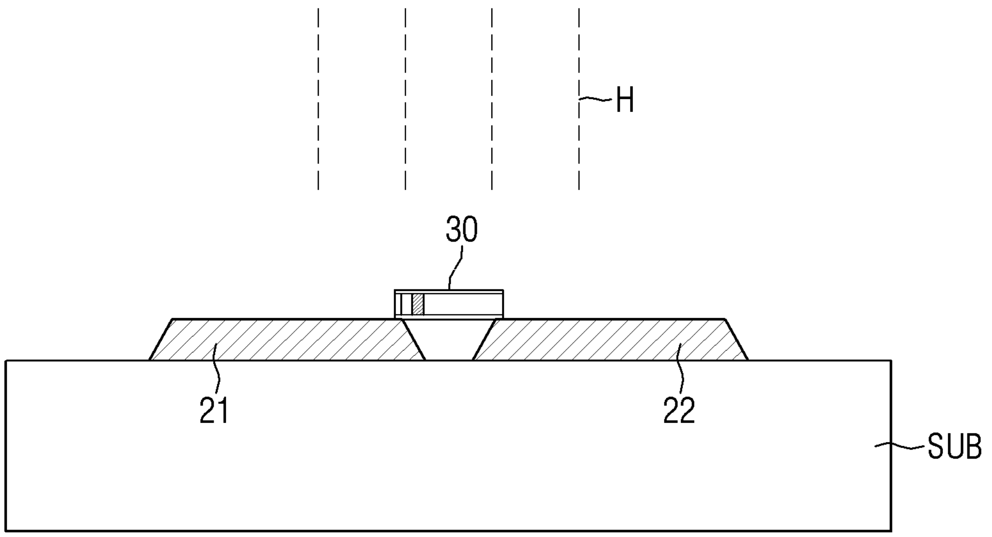
FIG. 23 is a cross-sectional view illustrating an operation of removing the second element solvent according to one or more embodiments.
Figure 24:
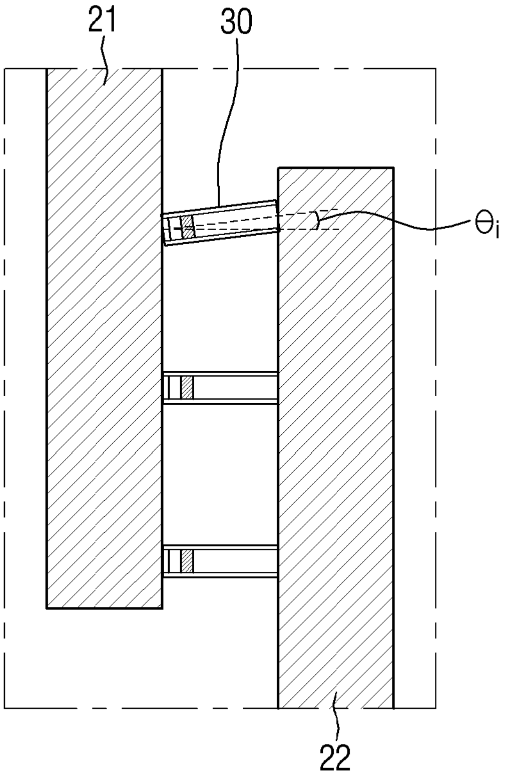
FIG. 24 is a plan view illustrating alignment of the light-emitting elements according to one or more embodiments.

FIG. 23 is a cross-sectional view illustrating an operation of removing the second element solvent according to one or more embodiments. FIG. 24 is a plan view illustrating the alignment of the light-emitting elements according to one or more embodiments.

Referring to FIGS. 23 and 24, the element solvent 100 may be removed by performing any suitable method. The second element solvent 102 may have a low viscosity by including a compound having a smaller molecular weight than the first element solvent 101 and may be removed by volatilization at a relatively low temperature. For example, the second element solvent 102 may be removed through a method such as heat treatment and/or infrared irradiation.

The light-emitting elements 30 in the second element solvent 102 having a low viscosity may be subjected to a strong dielectrophoretic force $F_2$ and thus may be oriented with a relatively uniform (e.g., substantially uniform) degree of alignment. In one or more embodiments, even if removed by volatilization, the second element solvent 102 may apply a weak hydrodynamic force to the aligned light-emitting elements 30. Accordingly, the acute angle Θi formed by the direction in which the light-emitting elements 30 finally positioned on the electrodes 21 and 22 extend and the direction perpendicular (e.g., substantially perpendicular) to the direction in which the electrodes 21 and 22 extend may have a very small value. The acute angle Θi may be 5 degrees or more. Accordingly, the acute angle formed by the direction in which the light-emitting elements 30 extend and the direction in which the electrodes 21 and 22 extend may be 85 degrees or more. For example, the acute angle formed by the direction in which the light-emitting elements 30 extend and the direction in which the electrodes 21 and 22 extend may be 88 to 90 degrees. However, the disclosure is not limited thereto.

Through the above process, the display device 10 including the light-emitting elements 30 may be manufactured. However, the method for manufacturing the display device 10 is not limited thereto. Because the display device 10 includes more members as described above, more processes may be performed, but a detailed description thereof will be omitted.

As described above, the light-emitting elements 30 may be sprayed on the electrodes 21 and 22 in a state in which they are dispersed in the element solvent 100 (see FIG. 8) and may be placed between the electrodes 21 and 22 through a process of transmitting an alignment signal to the electrodes 21 and 22.

However, because each of the light-emitting elements 30 includes a plurality of semiconductor layers, it may be made of materials having a greater specific gravity than the element solvent 100. The light-emitting elements 30 may remain dispersed in the element solvent 100 for a certain period of time and then may gradually precipitate. In order to prevent or reduce the risk of this occurrence, if the light-emitting elements 30 are kept dispersed for a long time by adjusting the viscosity of the element solvent 100, it may not be possible to eject the element solvent 100 through a nozzle in an inkjet printing process. A light-emitting element ink 1001 (see FIG. 25) according to one or more embodiments may include photodegradable thickeners 500 (see FIG. 25) capable of adjusting the viscosity of the light-emitting element ink 1001, in addition to an element solvent 103 and light-emitting elements 30 dispersed in the element solvent 103. The light-emitting element ink 1001 including the photodegradable thickeners 500 may have a high viscosity when stored in a container or when no shear stress is applied, and thus the light-emitting elements 30 can be dispersed for a long time. In one or more embodiments, the light-emitting element ink 1001 may have a low viscosity when shear stress is applied in an inkjet printing process and thus can be smoothly ejected from the nozzle.

Figure 25:
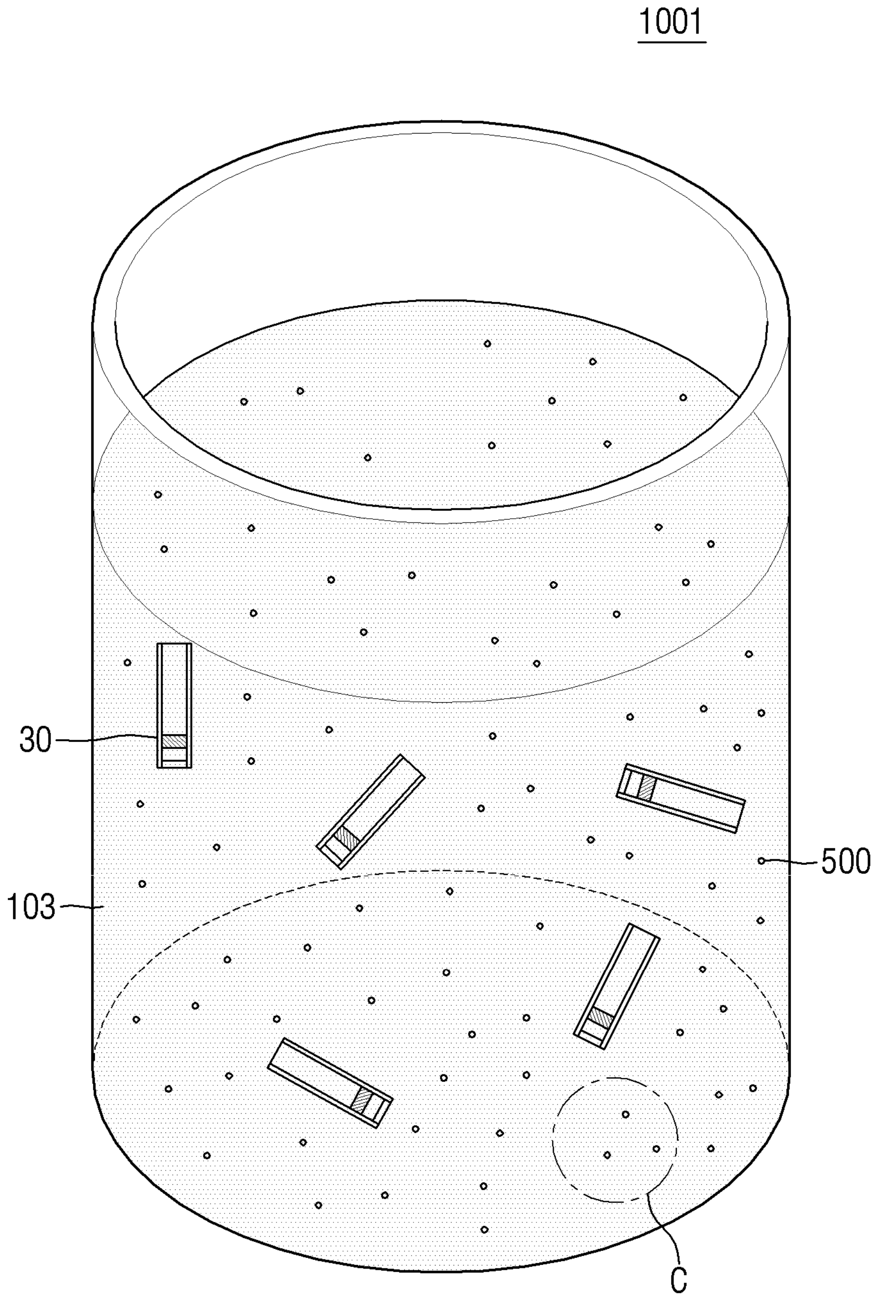
FIG. 25 is a schematic view of a light-emitting element ink according to one or more embodiments.

FIG. 25 is a schematic view of a light-emitting element ink according to one or more embodiments.

Referring to FIG. 25, the light-emitting element ink 1001 according to one or more embodiments includes an element solvent 103, light-emitting elements 30, and photodegradable thickeners 500. Because the light-emitting elements 30 are the same as those described above, the element solvent 103 and the photodegradable thickeners 500 will be described in more detail herein below.

The element solvent 103 may store the light-emitting elements 30 in a dispersed state and may include a material that does not react with the light-emitting elements 30. The element solvent 103 may include a material having a viscosity that allows the element solvent 103 to be ejected through a nozzle of an inkjet printing device. The element solvent 103 to be described in the following embodiment may be different from the element solvent 100 described above with reference to FIGS. 8 through 24. For example, the element solvent 103 may be, but is not limited to, an organic solvent such as acetone, water, alcohol, toluene, propylene glycol (PG), and/or propylene glycol methyl acetate (PGMA).

The photodegradable thickeners 500 may be dispersed in the element solvent 103 together with the light-emitting elements 30. As described above, the light-emitting element ink 1001 may have a high viscosity when stored in a container in order to keep the light-emitting elements 30 dispersed and may have a low viscosity when ejected through a nozzle. According to one or more embodiments, the photodegradable thickeners 500 may form intermolecular hydrogen bonding. Each of the photodegradable thickeners 500 may include a functional group that can form a hydrogen bond, and the light-emitting element ink 1001 may, when no shear stress is applied, have a high viscosity due to the intermolecular hydrogen bonds formed by the photodegradable thickeners 500. The light-emitting elements 30 may remain dispersed for a long time in the light-emitting element ink 1001 having a high viscosity.

In one or more embodiments, while the light-emitting element ink 1001 is ejected through the nozzle or flows in an inkjet head of the inkjet printing device, shear stress may be applied to the element solvent 103. The shear stress may have a stronger intensity than the intermolecular hydrogen bonds of the photodegradable thickeners 500, and the hydrogen bonds may be broken. Accordingly, the light-emitting element ink 1001 may have a low viscosity and may be smoothly ejected through the nozzle.

However, during the process of manufacturing the display device 10, a process of removing the element solvent 103 and the photodegradable thickeners 500 by irradiating heat or light to the light-emitting element ink 1001 may be performed after the light-emitting elements 30 are placed between the electrodes 21 and 22. The light-emitting element ink 1001 sprayed on the electrodes 21 and 22 may be in a state in which no shear stress has been applied and may have a high viscosity due to the intermolecular hydrogen bonds of the photodegradable thickeners 500. Accordingly, the element solvent 103 and the photodegradable thickeners 500 may not be smoothly removed but may remain as foreign substances on the electrodes 21 and 22 or the light-emitting elements 30. In one or more embodiments, because the light-emitting element ink 1001 has a high viscosity, the intensity of a dielectrophoretic force acting on the light-emitting elements 30 due to an electric field formed on the electrodes 21 and 22 may not be sufficient. Further, high-temperature heat treatment may be required to remove the element solvent 103 and the photodegradable thickeners 500 having a high viscosity, and as they are removed, the initial alignment state of the light-emitting elements 30 may be changed by an attractive force due to a fluid flow or an attractive force between the photodegradable thickeners 500 and the light-emitting elements 30.

Each photodegradable thickener 500 according to one or more embodiments may include a functional group which can form an intermolecular hydrogen bond and a photodegradable functional group in which a bond is decomposed by light irradiation. When light is irradiated to the light-emitting element ink 1001 after the light-emitting elements 30 are placed between the electrodes 21 and 22 or while an electric field is generated, a bond of the photodegradable functional group of each photodegradable thickener 500 may be broken into monomers having a small molecular weight. The light-emitting element ink 1001 may have a low viscosity even when no shear stress is applied due to the decomposition of the photodegradable thickeners 500.

Accordingly, the light-emitting elements 30 can be smoothly aligned by an electric field formed on the electrodes 21 and 22, and the element solvent 103 and the photodegradable thickeners 500 can be completely removed even at a relatively low temperature A photodegradable thickener 500 according to one or more embodiments may include a first functional group, which can form an intermolecular hydrogen bond, and a photodegradable functional group, in which an intramolecular bond may be decomposed by light irradiation. In some embodiments, the photodegradable thickener 500 may be a polymer formed by polymerization of a monomer including a first functional group and a photodegradable functional group and may be represented by Formula 2 below:

Formula 2

$$-\left[\left[\mathrm{HP1}\right]_m \mathrm{CP}\right]_l- .$$

In Formula 2, 'HP1' is a third functional group, 'CP' is a photodegradable functional group, m is an integer of 1 to 3, and I is an integer of 10 to 100. The photodegradable thickener 500 having the structure of Formula 2 may have a chain structure in which the third functional group and the photodegradable functional group are repeated.

The third functional group may include a functional group that can form an intermolecular hydrogen bond. For example, the third functional group may include a hydroxyl group (—OH) or an amine group (—$NH_2$). The photodegradable thickener 500 including the third functional group may form an intermolecular hydrogen bond. The photodegradable thickeners 500 dispersed in the element solvent 103 may form a network structure between polymer chains. Because the photodegradable thickeners 500 form a network structure, the light-emitting element 1001 may have a high viscosity.

In one or more embodiments, in some embodiments, the third functional group may be a polymerizable group that can form a hydrogen bond as well as a polymer chain. For example, the third functional group may be any one of an amine group (—NH—), an amino group (—CONH—), a urea group (—NHCONH—), and/or a urethane group (—NHCOO—). As a functional group capable of a polymerization reaction, the third functional group may form a main chain of a polymer chain and may also form an intramolecular hydrogen bond. The photodegradable thickeners 500 may form a network structure through intramolecular hydrogen bonding between main chains of polymer chains.

When the third functional group is a functional group capable of a polymerization reaction, the photodegradable functional group may be directly bonded to the third functional group as shown in Formula 2. However, the disclosure is not limited thereto. When the photodegradable thickener 500 further includes other functional groups, at least one functional group may be further bonded between the third functional group and the photodegradable functional group.

The photodegradable functional group may include a functional group in which a bond may be decomposed by light irradiation. After the light-emitting elements 30 are placed between the electrodes 21 and 22, or while an electric field is generated on the electrodes 21 and 22, some bonds of the photodegradable functional group of the photodegradable thickener 500 may be decomposed by light irradiation. Accordingly, the photodegradable thickener 500 may be decomposed into a plurality of fragments having a small molecular weight, and thus may have a low viscosity even when shear stress is not applied to the light-emitting element ink 1001.

In one or more embodiments, the photodegradable functional group may include any one of a cyclobutyl group, a maleic imide dimer, an acrylate dimer, and/or a carbonyl group. Bonds of the above functional groups may be decomposed by irradiated light as shown in Chemical Reaction Formulae 1 through 4 above to form fragments having a small molecular weight.

The structure of the photodegradable thickener 500 is not limited to Formula 2 above. The photodegradable thickener 500 may further include a functional group for adjusting the molecular weight and a polymerizable group for forming a polymer chain. In one or more embodiments, the photodegradable thickener 500 may be a polymer formed by polymerization of a monomer including another functional group or polymerizable group, in addition to the third functional group and the photodegradable functional group, and may be represented by Formulae 3 through 5 below:

Formula 3

$$-[-[HP1-R_6-]_m HP-CP-]_l-$$

Formula 4

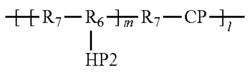

Formula 5

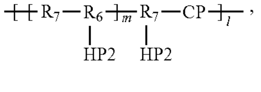

In Formulae 3 through 5, 'HP1' and 'HP2' are third functional groups, 'CP' is a photodegradable functional group, '$R_6$' is a functional group for molecular weight control, '$R_7$' is a polymerizable group, m is an integer of 1 to 3, and I is an integer of 10 to 100. The photodegradable thickener 500 may have a chain structure in which a monomer including a plurality of functional groups, a photodegradable functional group, and a polymerizable group as shown in Formulae 3 through 5 is repeated.

As shown in Formula 3, the photodegradable thickener 500 may further include the functional group $R_6$ capable of adjusting the viscosity of the light-emitting element ink 1001 through molecular weight control. In some embodiments, $R_6$ may be any one of a C1-C5 alkyl group, a C2-C5 alkenyl group, a C2-C5 alkynyl group, a C1-C5 alkyl ether group, and/or a C2-C5 alkenyl ether group. The third functional group may include a functional group capable of forming a hydrogen bond and capable of a polymerization reaction as described above. The third functional group may be directly bonded to $R_6$, and the photodegradable functional group may be directly bonded to the third functional group. However, the disclosure is not limited thereto, and the photodegradable functional group may also be directly bonded to $R_6$. The photodegradable thickener 500 can control the molecular weight by adjusting the number of carbon atoms, n and/or I.

The third functional group may not necessarily be a functional group capable of a polymerization reaction. As shown in Formulae 4 and 5, the third functional group may include only a functional group that can form a hydrogen bond, and the photodegradable thickener 500 may include the polymerizable group $R_7$ capable of a polymerization reaction. In one or more embodiments, the third functional group 'HP2' may be a hydroxyl group (—OH) or an amine group (—$NH_2$), and $R_7$ may be any one of an acryl group, a methacryl group, an ester group, and/or a carbonate group. However, the disclosure is not limited thereto.

The photodegradable thickener 500 may form a polymer chain through a polymerization reaction of the polymerizable group $R_7$, and the third functional group may be bonded to the polymerizable group. In the photodegradable thickener 500, the polymerizable group and the photodegradable functional group may form a main chain of the polymer chain, and the third functional group may form a side chain. The photodegradable thickeners 500 may form a network structure through intermolecular hydrogen bonding between side chains of polymer chains.

In some embodiments, the photodegradable thickener 500 may be represented by Chemical Formulae 7 through 11 below:

Formula 7

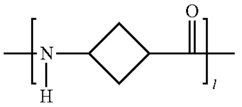

Formula 8

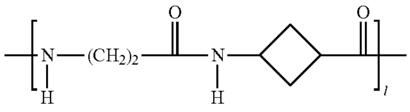

Formula 9

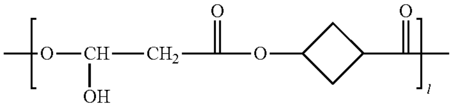

Formula 10

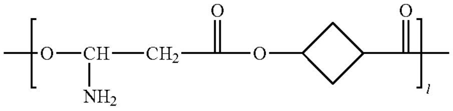

-continued

Formula 11

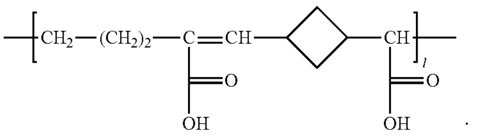

In Chemical Formulae 7 through 11, I is an integer of 10 to 100.

Each of Chemical Formulae 7 through 11 includes a third functional group, which can form an intermolecular hydrogen bond, and a photodegradable functional group in which a bond may be decomposed by light irradiation. In one or more embodiments, the photodegradable thickener 500 may include a functional group capable of adjusting the molecular weight and/or a polymerizable group capable of a polymerization reaction.

Figure 26:
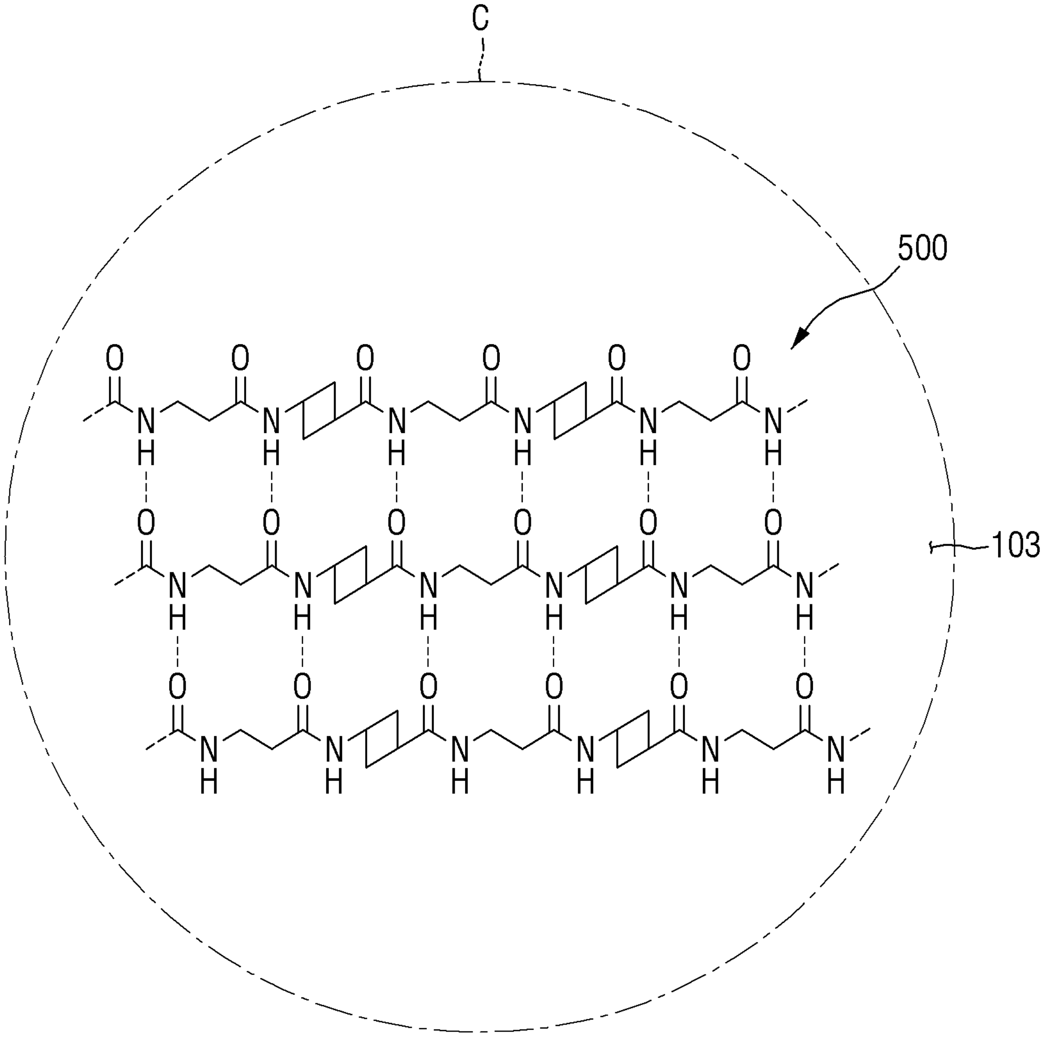
FIG. 26 is a schematic view illustrating the arrangement of photodegradable thickeners in a state in which shear stress has not been applied to the light-emitting element ink according to one or more embodiments.
Figure 27:
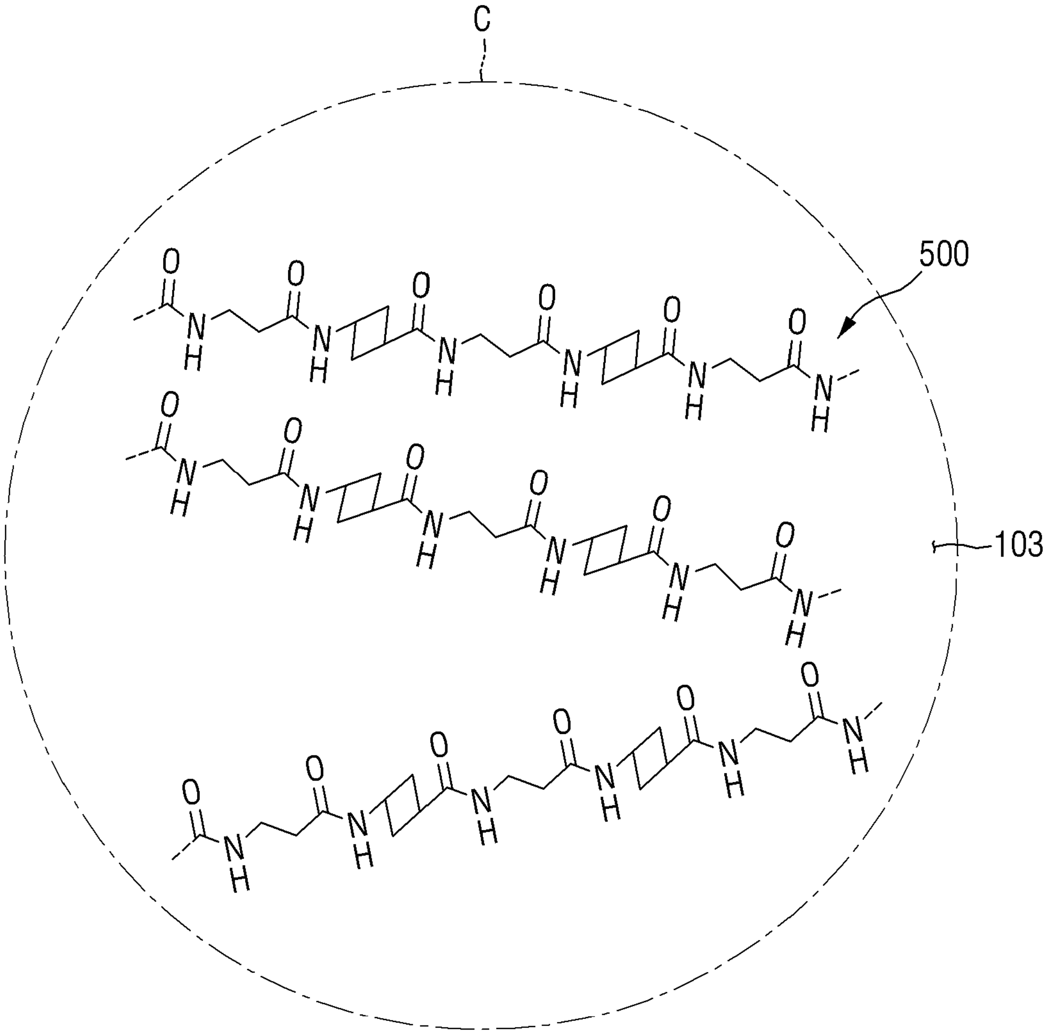
FIG. 27 is a schematic view illustrating the arrangement of the photodegradable thickeners in a state in which shear stress has been applied to the light-emitting element ink according to one or more embodiments.

FIG. 26 is a schematic view illustrating the arrangement of the photodegradable thickeners in a state in which shear stress has not been applied to the light-emitting element ink according to the embodiments. FIG. 27 is a schematic view illustrating the arrangement of the photodegradable thickeners in a state in which shear stress has been applied to the light-emitting element ink according to the embodiments.

A case where each of the photodegradable thickeners 500 is Chemical Formula 8 will be described with reference to FIGS. 26 and 27. In each of the photodegradable thickeners 500, the third functional group may be an amide group (—CONH—) capable of forming a hydrogen bond and capable of a polymerization reaction, the photodegradable functional group may include a cyclobutyl group, and an ethylene group (—$CH_2CH_2$—) may be included as a functional group for molecular weight control.

When shear stress is not applied, the photodegradable thickeners 500 may form a three-dimensional (3D) network structure in the light-emitting element ink 1001 because their third functional groups form intermolecular hydrogen bonds. As the photodegradable thickeners 500 form a network structure, the light-emitting element ink 1001 may have a high viscosity.

For example, the light-emitting element ink 1001 may have a viscosity of 30 to 70 cP when shear stress is not applied. However, the disclosure is not limited thereto. In Chemical Formula 8 above, I may be appropriately adjusted according to the viscosity range required (or desired) for the light-emitting element ink 1000. As I increases, the molecular weight and polymer chain length of the photodegradable thickeners 500 and the network structure formed by the photodegradable thickeners 500 may increase, and the light-emitting element ink 1001 may have a greater viscosity. When the light-emitting element ink 1001 including the photodegradable thickeners 500 is stored in a container, it can keep the light-emitting elements 30 dispersed for a long time.

In contrast, the photodegradable thickeners 500 may not form a network structure when the light-emitting element ink 1001 is ejected through a nozzle of an inkjet printing device and/or when shear stress is applied. When the light-emitting element ink 1001 flows in an inkjet head of the inkjet printing device or is ejected from the nozzle, shear stress due to the flow of the fluid may be applied. The shear stress may have a stronger intensity than the intermolecular hydrogen bonds formed by the photodegradable thickeners 500, and the photodegradable thickeners 500 may maintain an individually dispersed state without forming a 3D structure. Accordingly, the light-emitting element ink 1001 may have a low viscosity and thus can be smoothly ejected through the nozzle.

According to one or more embodiments, the light-emitting element ink 1001 may have a viscosity of 5 to 15 cP or 7 to 13 cP, for example, about 10 cP when shear stress is applied. However, the disclosure is not limited thereto, and the viscosity of the light-emitting element ink 1001 can be variously suitably changed within a range in which it can be ejected from the nozzle of the inkjet head. As described above, the molecular weight and polymer chain length of the photodegradable thickeners 500 may vary according to the n value of Chemical Formula 2, and the viscosity of the light-emitting element ink 1001 can be adjusted to be within a desired or suitable range.

Figure 28:
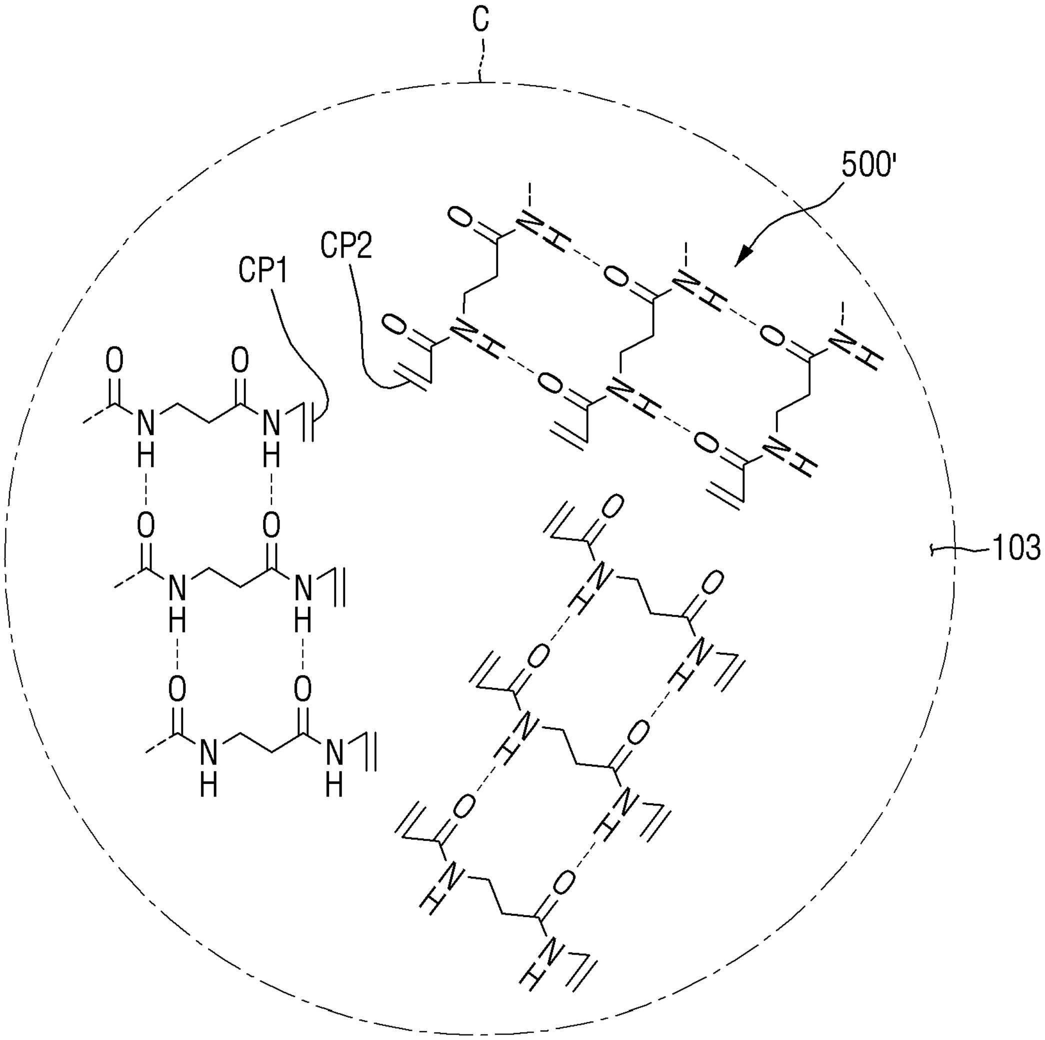
FIG. 28 is a schematic view illustrating the photodegradable thickeners when light is irradiated to the light-emitting element ink according to one or more embodiments.

FIG. 28 is a schematic view illustrating the photodegradable thickeners when light is irradiated to the light-emitting element ink according to the embodiment.

Referring to FIG. 28, each photodegradable thickener 500 may form a plurality of fragment molecules 500' having a small molecular weight as the photodegradable functional group is decomposed. When light is irradiated, Chemical Formula 8 may be separated into a plurality of fragments as shown in Chemical Reaction Formula 6 below:

Chemical Reaction Formula 6

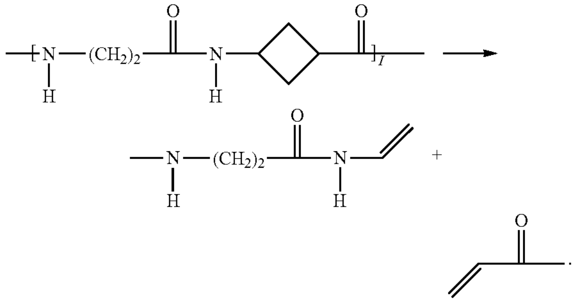

As a bond of the photodegradable functional group is decomposed, the photodegradable functional group may remain as functional group fragments CP1 and CP2 (see FIG. 28) in the fragment molecules 500', respectively. When light is irradiated to the light-emitting element ink 1001, polymer chains of the photodegradable thickeners 500 may be decomposed. Thus, even if shear stress is not applied, a network structure between the photodegradable thickeners 500 may not be formed, and the light-emitting element ink 1001 may have a low viscosity. Because the light-emitting element ink 1001 has a low viscosity after being sprayed on the electrodes 21 and 22, the light-emitting elements 30 can be smoothly aligned and placed on the electrodes 21 and 22 by a dielectrophoretic force. In one or more embodiments, the initial alignment positions of the light-emitting elements 30 may not be changed in the process of removing the element solvent 103 and the photodegradable thickeners 500, and the element solvent 103 and the photodegradable thickeners 500 can be completely removed at a relatively low temperature.

According to one or more embodiments, the viscosity of the light-emitting element ink 1001 including the photodegradable thickeners 500 may change during the process of manufacturing the display device 10. The light-emitting element ink 1001 may have a suitable viscosity in each of an operation of storing the light-emitting element ink 1001, an operation of ejecting the light-emitting element ink 1001 through a nozzle of an inkjet head, an operation of aligning the light-emitting elements 30, and an operation of removing the element solvent 103 and the photodegradable thickeners 500. In one or more embodiments, the light-emitting element ink 1001 may have a high viscosity in the operation of storing the light-emitting element ink 1001, thereby preventing or reducing precipitation of the light-emitting elements 30. The light-emitting element ink 1001 may have a low viscosity in the operation of ejecting the light-emitting element ink 1001 through the nozzle, the operation of aligning the light-emitting elements 30, and the operation of removing the element solvent 103, thereby facilitating an inkjet printing process and an alignment process of the light-emitting elements 30. Furthermore, the light-emitting elements 30 can have a high degree of alignment between the electrodes 21 and 22 in the process of manufacturing the display device 10 including the light-emitting elements 30, and the product reliability of the display device 10 can be improved.

Because each photodegradable thickener 500 according to the embodiment includes the third functional group and the photodegradable functional group, its molecular structure in the element solvent 103 may change according to application of shear stress and/or irradiation of light. Because the light-emitting element ink 1001 includes the photodegradable thickeners 500 in addition to the solvent 100 and the light-emitting elements 30, it may have a suitable viscosity according to the process of manufacturing the display device 10.

A method for manufacturing the display device 10 according to one or more embodiments will now be described.

Figure 29:
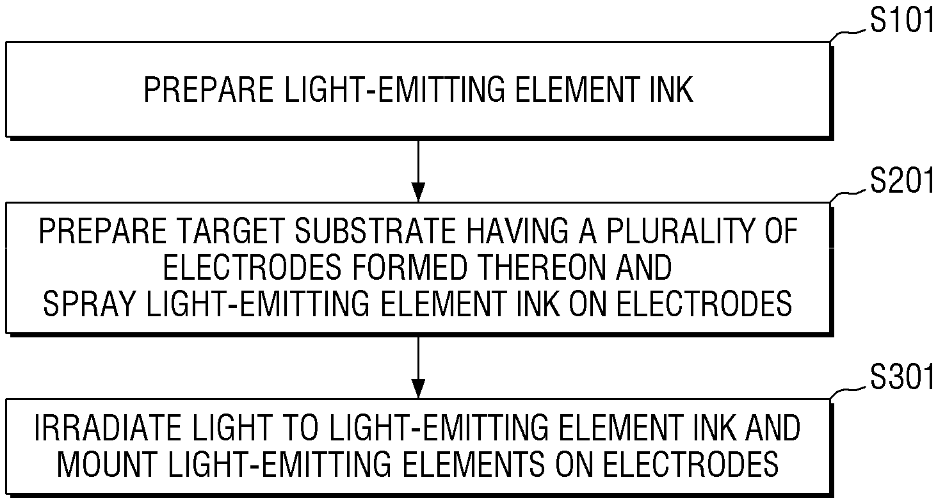
FIG. 29 is a flowchart illustrating a method for manufacturing a display device according to one or more embodiments.

FIG. 29 is a flowchart illustrating a method for manufacturing a display device according to one or more embodiments.

Referring to FIG. 29, the method for manufacturing the display device 10 according to one or more embodiments may include preparing a light-emitting element ink 1000 including a solvent 100, light-emitting elements 30 and photodegradable thickeners 500 (operation S101), preparing a target substrate having electrodes 21 and 22 formed thereon and spraying the light-emitting element ink 1001 on the electrodes 21 and 22 (operation S201), and irradiating light to the light-emitting element ink 1001 and mounting the light-emitting elements 30 on the first electrode 21 and the second electrode 22 (operation S301).

The light-emitting element ink 1001 may have a low viscosity in the spraying of the light-emitting element ink 1001 on the electrodes 21 and 22 because shear stress is applied. Thus, a smooth ejection process may be performed. However, the light-emitting element ink 1001 sprayed on the electrodes 21 and 22 is in a state in which shear stress is not applied. Thus, the light-emitting element ink 1001 may have a high viscosity because the photodegradable thickeners 500 form a 3D network structure.

According to one or more embodiments, the process of manufacturing the display device 10 may include decomposing each photodegradable thickener 500 into a plurality of fragment molecules 500' by irradiating light to the light-emitting element ink 1001 in the process of mounting the light-emitting elements 30 on the electrodes 21 and 22. When the light-emitting elements 30 are mounted on the electrodes 21 and 22, light may be irradiated so that the light-emitting element ink 1001 has a low viscosity. Accordingly, the light-emitting elements 30 can be smoothly aligned between the electrodes 21 and 22, and the element solvent 103 and the photodegradable thickeners 500 can be completely removed in a subsequent process.

Figure 30:
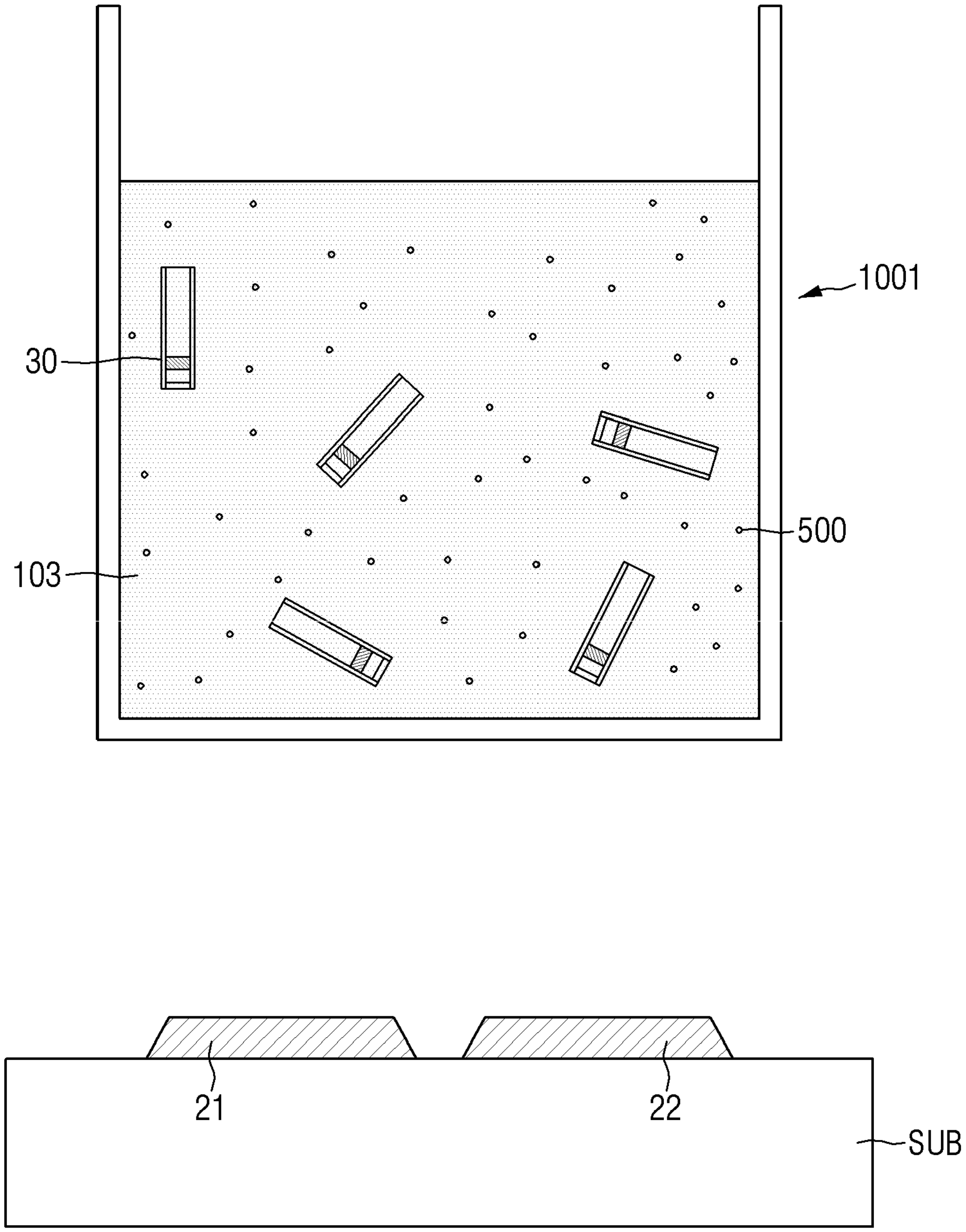
FIGS. 30 through 32 are cross-sectional views illustrating one or more acts in a process of manufacturing a display device according to one or more embodiments.
Figure 31:
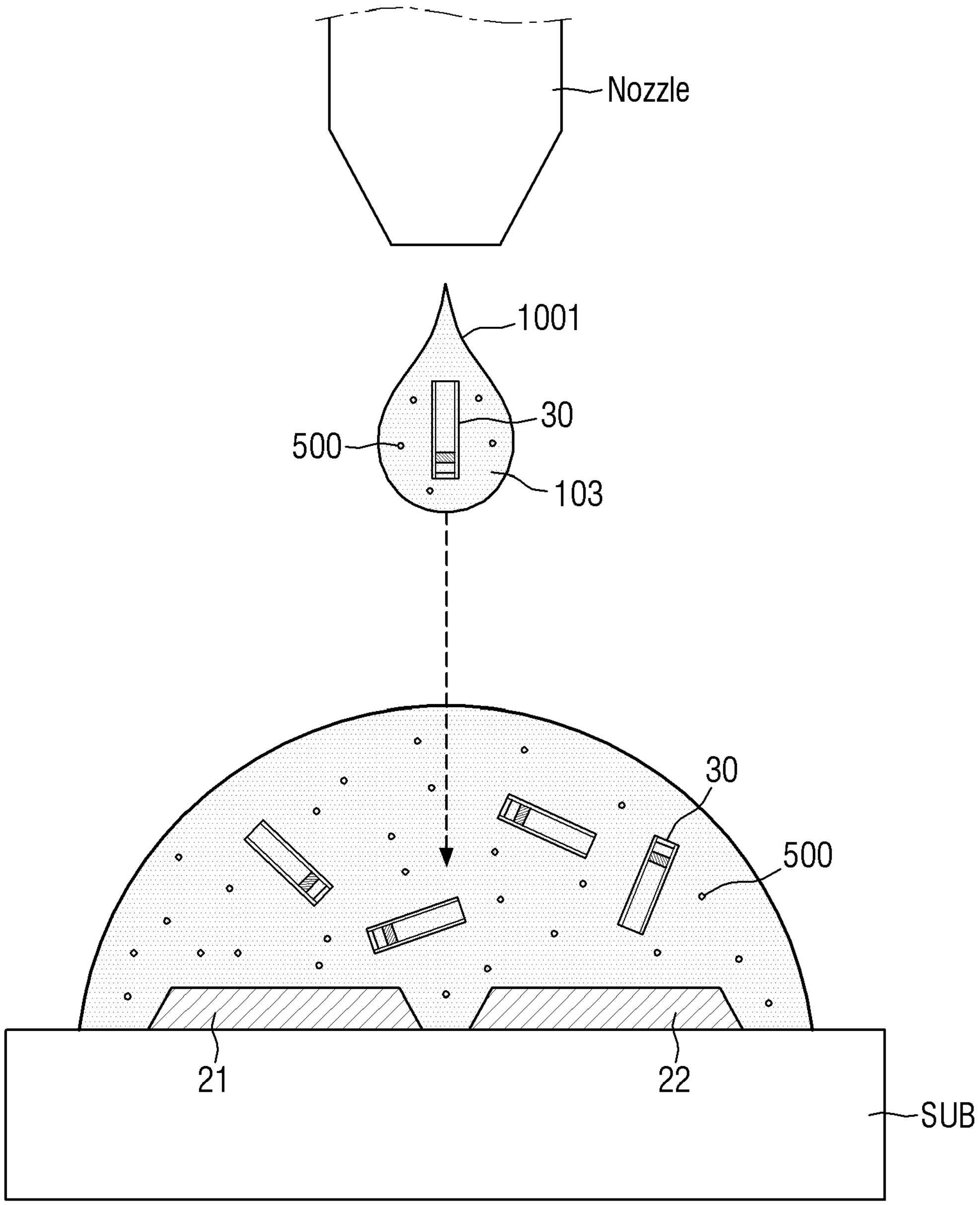
Figure 32:
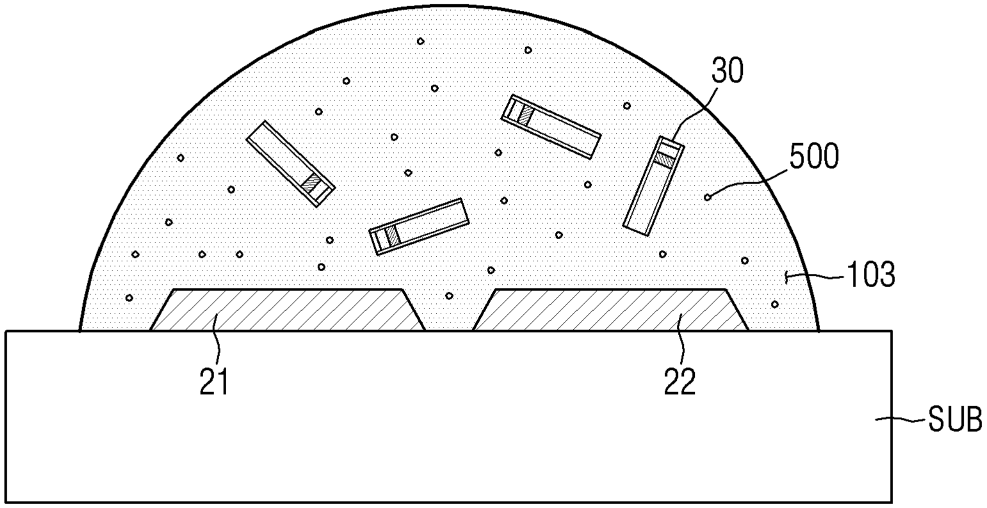

FIGS. 30 through 32 are cross-sectional views illustrating an operation in a process of manufacturing a display device according to one or more embodiments.

First, referring to FIG. 30, a light-emitting element ink 1001 including light-emitting elements 30, an element solvent 103 and photodegradable thickeners 500, and a target substrate SUB having a first electrode 21 and a second electrode 22 thereon are prepared. Although a pair of electrodes are on the target substrate SUB in the drawing, more electrode pairs may be provided on the target substrate SUB. The target substrate SUB may include a plurality of circuit elements thereon in addition to the first substrate 11 of the display device 10 described above, but these will not be illustrated below for ease of description.

The light-emitting element ink 1001 may include the element solvent 103, and the light-emitting elements 30 and the photodegradable thickeners 500 dispersed in the element solvent 103. The light-emitting element ink 1001 stored in a container may be in a state in which there is no fluid flow and a state in which shear stress is not applied. The photodegradable thickeners 500 may form a 3D network structure in the element solvent 103 as their third functional groups form intermolecular hydrogen bonds. The light-emitting element ink 1001 may have a high viscosity of, for example, 30 to 70 cp, and may keep the light-emitting elements 30 dispersed for a long time.

Next, referring to FIGS. 31 and 32, the light-emitting element ink 1001 is sprayed on the first electrode 21 and the second electrode 22 positioned on the target substrate SUB. In one or more embodiments, the light-emitting element ink 1001 may be sprayed on the electrodes 21 and 22 through a printing process using an inkjet printing device. The light-emitting element ink 1001 may be sprayed through a nozzle of an inkjet head included in the inkjet printing device. The light-emitting element ink 1001 may flow along an internal flow path provided in the inkjet head and may be ejected onto the target substrate SUB through the nozzle.

The light-emitting element ink 1001 flowing along the internal flow path may be in a state in which there is a fluid flow and a state in which shear stress is applied. In the light-emitting element ink 1001 to which the shear stress is applied, third functional groups of the photodegradable thickeners 500 may not be able to form intermolecular hydrogen bonds. The photodegradable thickeners 500 may have their respective chains dispersed in the element solvent 103 without forming a 3D network structure, and the light-emitting element ink 1001 may have a low viscosity of, for example, 5 to 15 cp or about 10 cp. The light-emitting element ink 1001 having a viscosity within the above range can be smoothly ejected from the nozzle of the inkjet head, and a nozzle clogging phenomenon due to the viscosity of the solution can be prevented or reduced.

As illustrated in FIG. 32, the light-emitting element ink 1001 may be mounted on the electrodes 21 and 22 on the target substrate SUB. The light-emitting elements 30 may extend in one direction and may be dispersed in the light-emitting element ink 1001 with their extending direction having random orientation directions.

When the light-emitting element ink 1001 including the light-emitting elements 30 is sprayed on the target substrate SUB, an electric field EL is generated on the target substrate SUB by transmitting an alignment signal to the electrodes 21 and 22. The light-emitting elements 30 dispersed in the element solvent 103 may be subjected to a dielectrophoretic force applied by the electric field EL and may be placed on the electrodes 21 and 22 as their orientation directions and positions change.

However, the light-emitting element ink 1001 sprayed on the target substrate SUB is in a state in which shear stress is not applied because there is no fluid flow, and the photodegradable thickeners 500 may form a 3D network structure by forming intermolecular hydrogen bonds. The light-emitting element ink 1001 may have a high viscosity, and the light-emitting elements 30 may not be located at a desired position on the electrodes 21 and 22 even when subjected to the dielectrophoretic force applied by the electric field EL.

Figure 33:
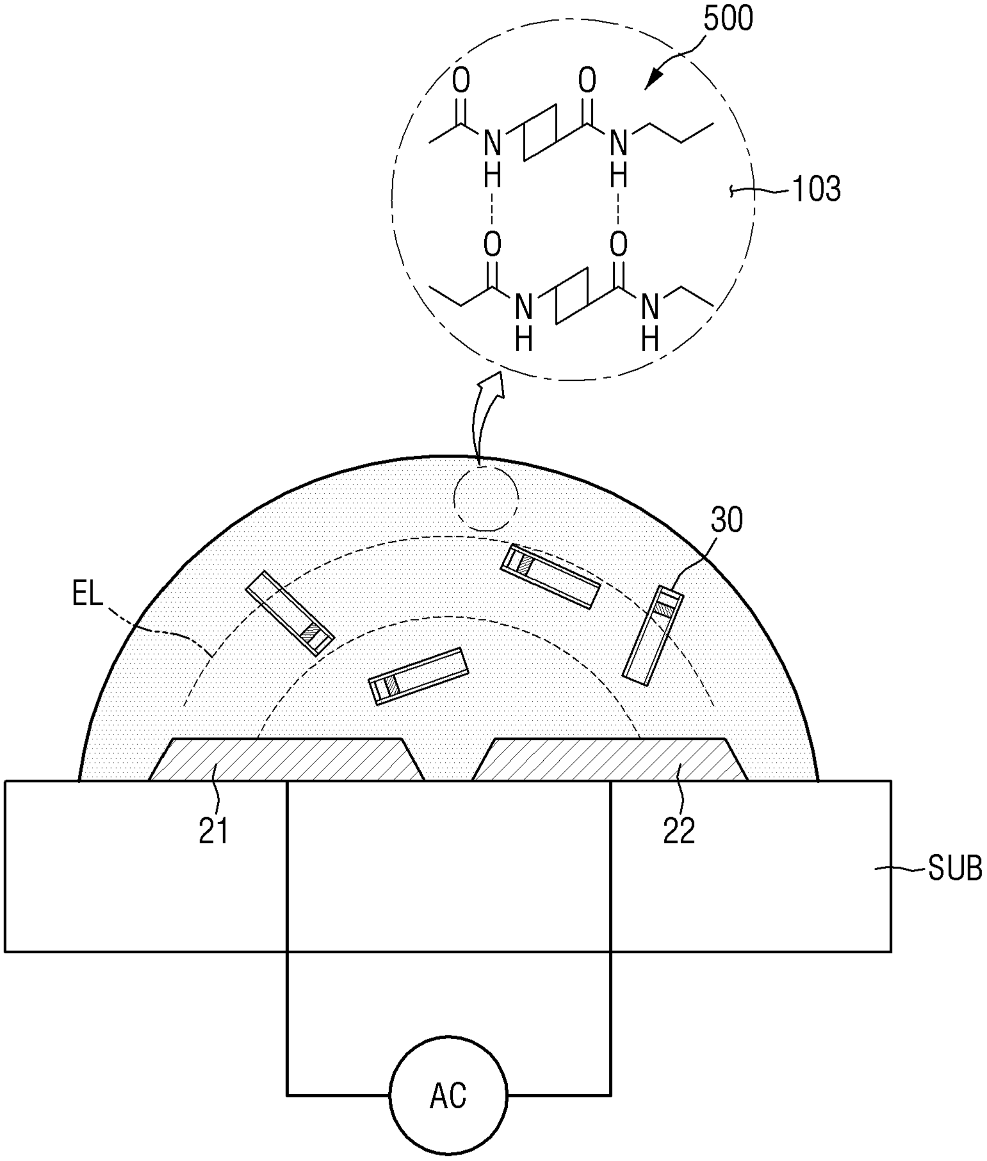
FIGS. 33 through 35 are schematic views illustrating a process of placing light-emitting elements on electrodes during a process of manufacturing a display device according to one or more embodiments.
Figure 34:
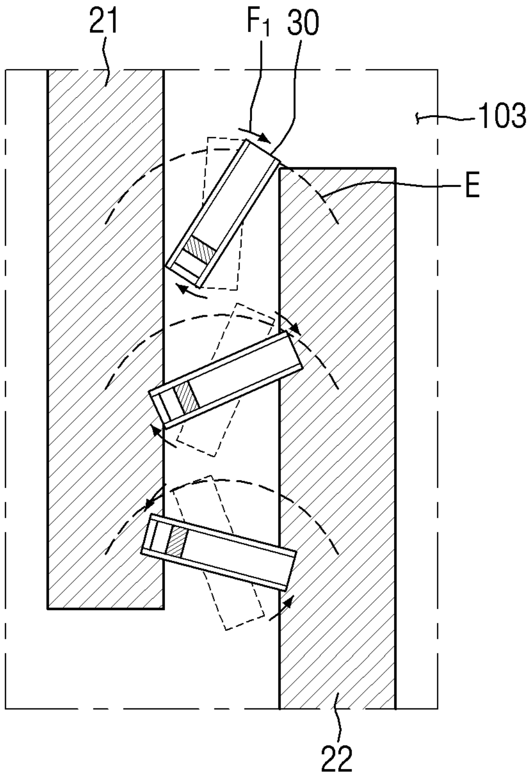
Figure 35:
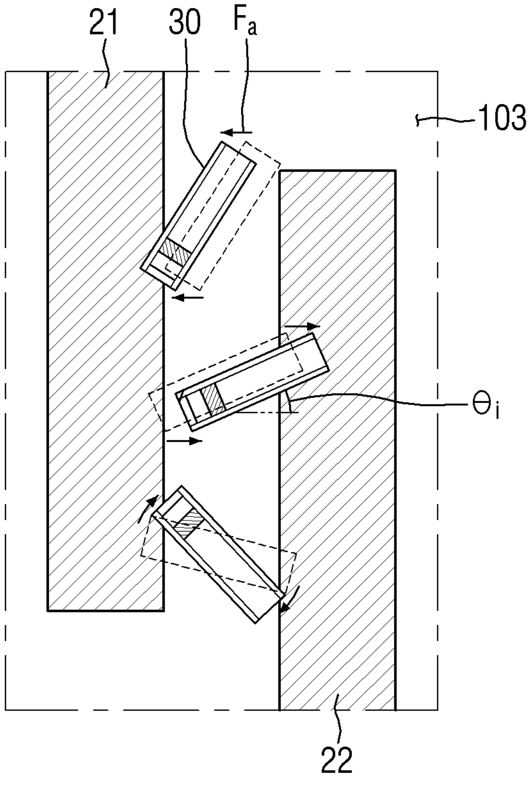

FIGS. 33 through 35 are schematic views illustrating a process of placing light-emitting elements on electrodes during a process of manufacturing a display device. FIG. 35 illustrates a process of removing the element solvent 103 and the photodegradable thickeners 500 after the light-emitting elements 30 are placed on the electrodes 21 and 22.

First, referring to FIGS. 33 and 34, when an electric field EL is generated on the target substrate SUB in a state in which a 3D network structure has been formed by the photodegradable thickeners 500, the light-emitting elements 30 may be subjected to a dielectrophoretic force $F_1$. In some embodiments, when the electric field EL generated on the target substrate SUB is parallel (e.g., substantially parallel) to an upper surface of the target substrate SUB, the light-emitting elements 30 may be aligned and placed on the first electrode 21 and the second electrode 22 such that their extending direction is parallel (e.g., substantially parallel) to the target substrate SUB. The light-emitting elements 30 may be moved by the dielectrophoretic force $F_1$ from their initially dispersed positions (indicated by dotted lines in FIG. 34) toward the electrodes 21 and 22. However, the light-emitting elements 30 may experience a resistive force acting in a direction opposite to the dielectrophoretic force $F_1$ in the light-emitting element ink 1001 having a high viscosity and may not be mounted at a desired position on the electrodes 21 and 22. The dielectrophoretic force $F_1$ applied to the light-emitting elements 30 may not be sufficient for both ends of the light-emitting elements 30 to be placed on the first electrode 21 and the second electrode 22, and the light-emitting elements 30 may be placed such that their extending direction is inclined with respect to an upper surface of the electrodes 21 and 22.

In addition, when the element solvent 103 and the photodegradable thickeners 500 are removed in a subsequent process, the orientation direction or alignment state of the light-emitting elements 30 may change, or the element solvent 103 may not be completely removed due to the viscosity of the light-emitting element ink 1001.

Referring to FIG. 35, when the element solvent 103 and the photodegradable thickeners 500 are removed after the light-emitting elements 30 are placed on the electrodes 21 and 22, the initial alignment state (indicated by dotted lines in FIG. 35) of the light-emitting elements 30 may be changed by an attractive force due to a fluid flow or an attractive force Fa (see FIG. 35) between the photodegradable thickeners 500 and the light-emitting elements 30. Accordingly, as described above, an acute angle Θi' formed by the direction in which the light-emitting elements 30 finally placed on the electrodes 21 and 22 extend and a direction perpendicular (e.g., substantially perpendicular) to the direction in which the electrodes 21 and 22 extend may have a large value.

In addition, in the light-emitting element ink 1001 having a high viscosity, the element solvent 103 and the photodegradable thickeners 500 may not be completely removed but may remain as foreign substances in a subsequent process. The foreign substances remaining on the electrodes 21 and 22 and the light-emitting elements 30 may cause a contact failure with the light-emitting elements 30 in a subsequent process of forming contact electrodes 26. If a high-temperature heat treatment process is performed to completely remove them, the light-emitting elements 30 and circuit elements included in the target substrate SUB can be damaged.

The method for manufacturing the display device 10 according to one or more embodiments may include placing the light-emitting elements 30 on the electrodes 21 and 22 and irradiating light to the light-emitting element ink 1001 after the placing of the light-emitting elements 30. When light is irradiated to the light-emitting element ink 1001, a photodegradable functional group of each photodegradable thickener 500 may be decomposed to form a plurality of fragment molecules 500'. The light-emitting element ink 1001 may have a low viscosity without the photodegradable thickeners 500 forming a 3D network structure even in a state in which shear stress is not applied. Accordingly, the light-emitting elements 30 may be subjected to a dielectrophoretic force sufficient to place the light-emitting elements 30 at a desired position on the electrodes 21 and 22, and in a subsequent process, the element solvent 103 and the photodegradable thickeners 500 can be completely removed through a relatively low-temperature heat treatment process.

Figure 36:
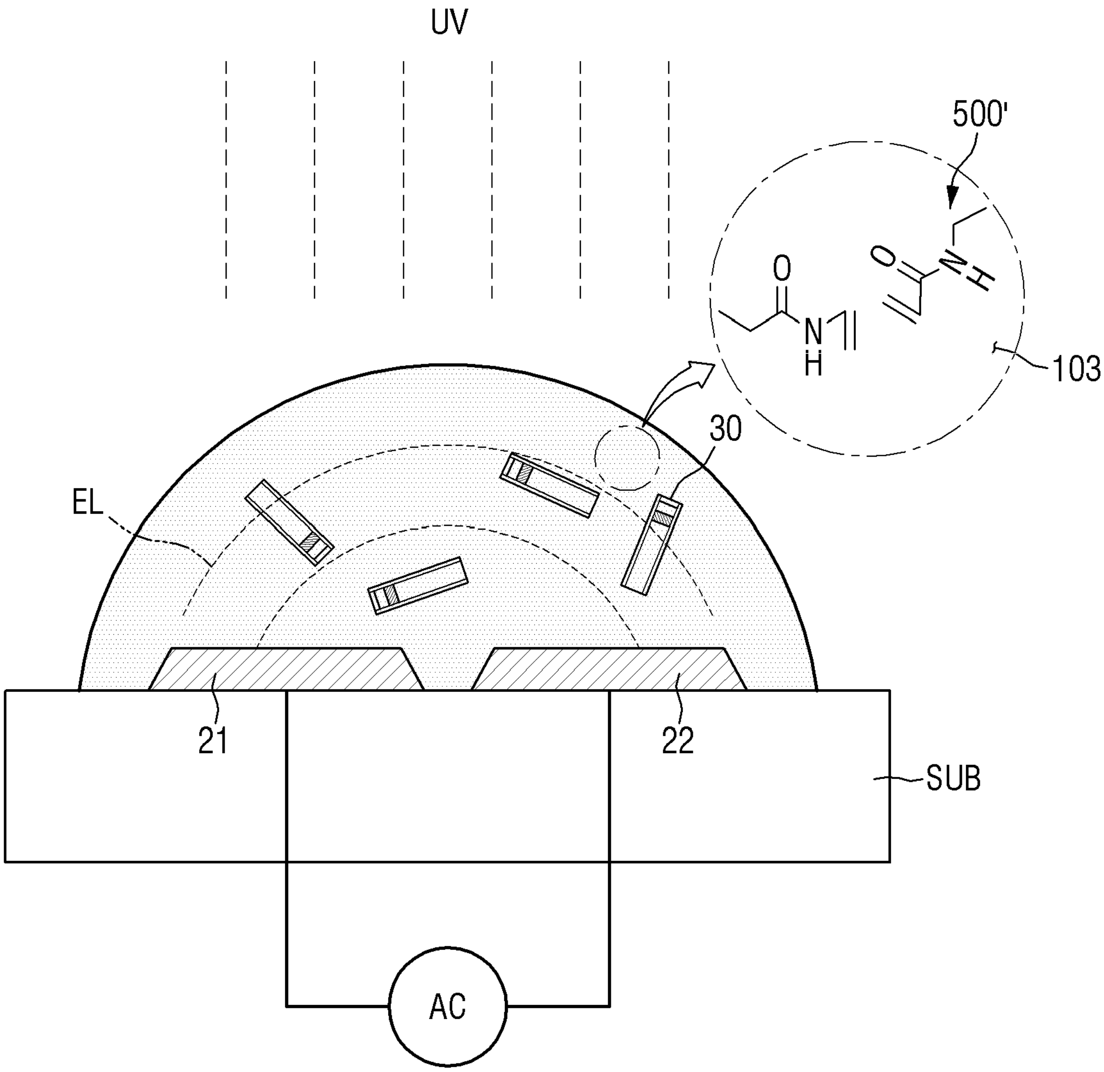
FIGS. 36 through 38 are schematic views illustrating a process of placing light-emitting elements on electrodes during the process of manufacturing the display device according to embodiments.
Figure 37:
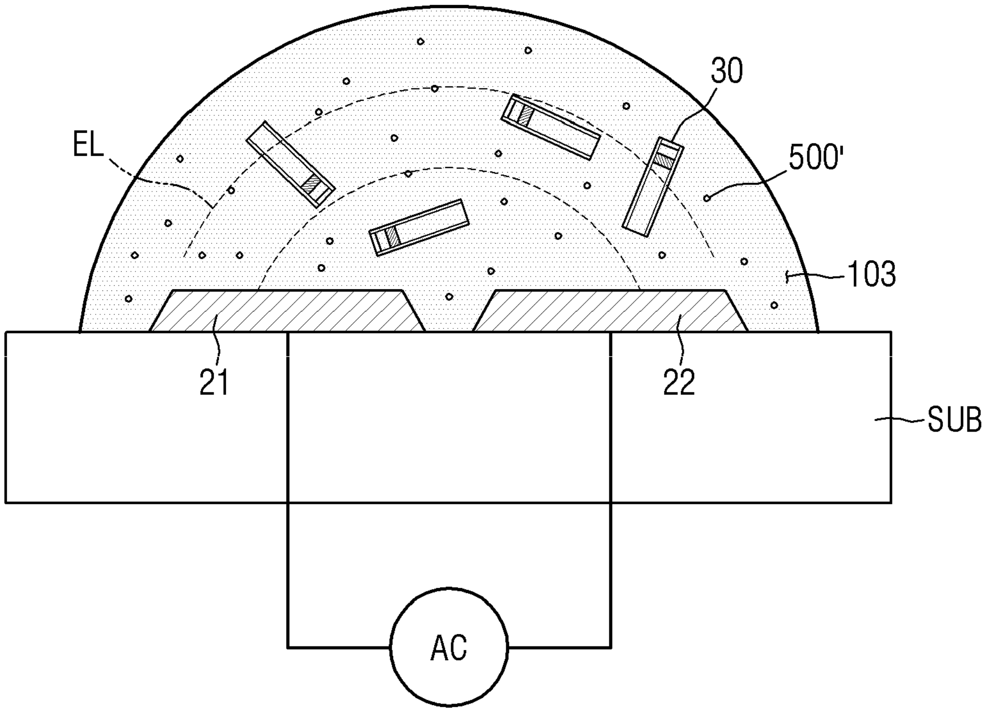
Figure 38:
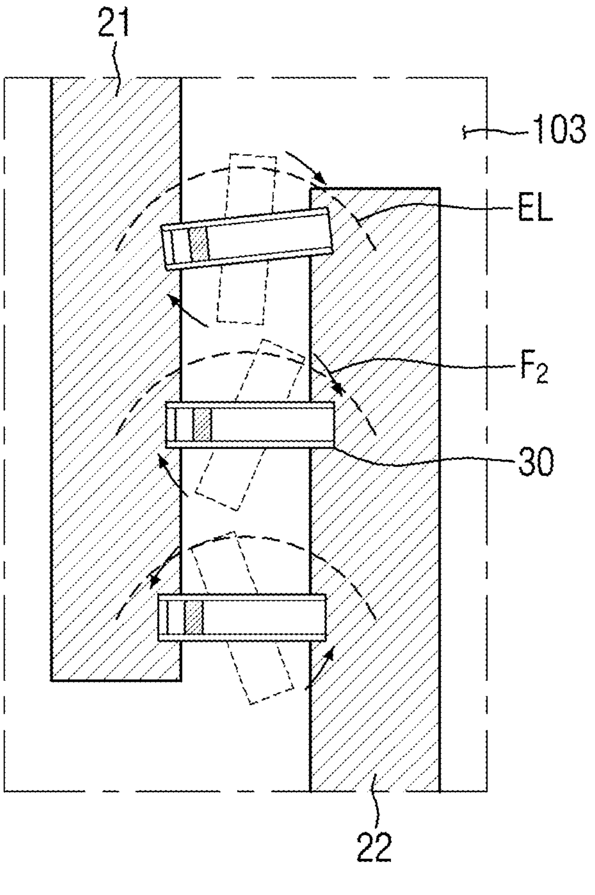

FIGS. 36 through 38 are schematic views illustrating a process of placing light-emitting elements on electrodes during the process of manufacturing the display device according to one or more embodiments. FIG. 36 illustrates an operation of irradiating light to the light-emitting element ink 1001, and FIGS. 37 and 38 illustrate an operation of placing the light-emitting elements 30 by generating an electric field on the target substrate SUB.

First, referring to FIG. 36, the process of manufacturing the display device 10 according to one or more embodiments may include irradiating light UV to the light-emitting element ink 1001 sprayed on the target substrate SUB. When the light UV is irradiated to the light-emitting element ink 1001, a bond of the photodegradable functional group of each photodegradable thickener 500 may be decomposed to form a plurality of fragment molecules 500'. The fragment molecules 500' may have a smaller molecular weight than the photodegradable thickeners 500, and the light-emitting element ink 1001 may have a low viscosity even if intermolecular hydrogen bonds are formed. When an electric field EL is generated on the target substrate SUB in a subsequent process, the light-emitting elements 30 may be placed on the electrodes 21 and 22 in a state in which they are dispersed in the light-emitting element ink 1001 having a low viscosity.

Next, referring to FIGS. 37 and 38, the light-emitting elements 30 are placed on the electrodes 21 and 22 by generating the electric field EL on the target substrate SUB. Because the light-emitting element ink 1001 has a low viscosity, the light-emitting elements 30 may be subjected to a dielectrophoretic force $F_2$ sufficient to place the light-emitting elements 30 at a desired position. Both ends of the light-emitting elements 30 may be placed on the first electrode 21 and the second electrode 22, respectively, as the positions and orientation directions of the light-emitting elements 30 are changed from initially dispersed positions (indicated by dotted lines in FIG. 38). The light-emitting elements 30 may be placed on each electrode 21 or 22 with a relatively uniform (e.g., substantially uniform) degree of alignment. The 'degree of alignment' of the light-emitting elements 30 may refer to a deviation between the orientation directions and mounted positions of the light-emitting elements 30 aligned on the target substrate SUB. For example, when the deviation between the orientation directions and mounted positions of the light-emitting elements 30 is large, it may be understood that the degree of alignment of the light-emitting elements 30 is low. When the deviation between the orientation directions and mounted positions of the light-emitting elements 30 is small, it may be understood that the degree of alignment of the light-emitting elements 30 is high.

Next, the element solvent 103 and the photodegradable thickeners 500 and/or the fragment molecules 500' of the light-emitting element ink 1001 are removed.

As described above, the process of removing the element solvent 103 and the photodegradable thickeners 500 and/or the fragment molecules 500' may be performed through any suitable heat treatment process. The photodegradable thickeners 500 may form the fragment molecules 500' having a small molecular weight as bonds of their photodegradable functional groups are decomposed and can be completely removed even through a relatively low-temperature heat treatment process. In one or more embodiments, the heat treatment process may be performed in a temperature range of 200 to 400° C. or about 300° C. When a heat treatment process is performed within the above range, it is possible to completely remove the element solvent 103 and the photodegradable thickeners 500 and the fragment molecules 500' while preventing or reducing the damage to the light-emitting elements 30 and the circuit elements.

The light-emitting elements 30 may be placed on the electrodes 21 and 22 with a high degree of alignment in a state in which they are dispersed in the light-emitting element ink 1001 having a low viscosity. Even if the element solvent 103 and the photodegradable thickeners 500 and the fragment molecules 500' are removed through a heat treatment process, the light-emitting elements 30 may maintain their initial alignment state in the light-emitting element ink 1001. Accordingly, as described above, the acute angle Θi formed by the direction in which the light-emitting elements 30 finally placed on the electrodes 21 and 22 extend and the direction perpendicular (e.g., substantially perpendicular) to the direction in which the electrodes 21 and 22 extend may have a very small value.

Next, a plurality of insulating layers and the contact electrodes 26 may be formed on the light-emitting elements 30 and the electrodes 21 and 22 to manufacture the display device 10. Through the above process, the display device 10 including the light-emitting elements 30 may be manufactured. According to one or more embodiments, the display device 10 having the light-emitting elements 30 on the electrodes 21 and 22 may be manufactured using the light-emitting element ink 1001 including the light-emitting element 30 and the photodegradable thickeners 500. The process of manufacturing the display device 10 may include a process of spraying the light-emitting element ink 1001 on the target substrate SUB and irradiating light to the light-emitting element ink 1001. The light-emitting element ink 1001 may have a viscosity required or desired for each process, and the light-emitting elements 30 may be placed on the electrodes 21 and 22 with a high degree of alignment. Through the process of manufacturing the display device 10 according to one or more embodiments, the display device 10 having improved product reliability by including the light-emitting elements 30 can be manufactured.

Figure 39:
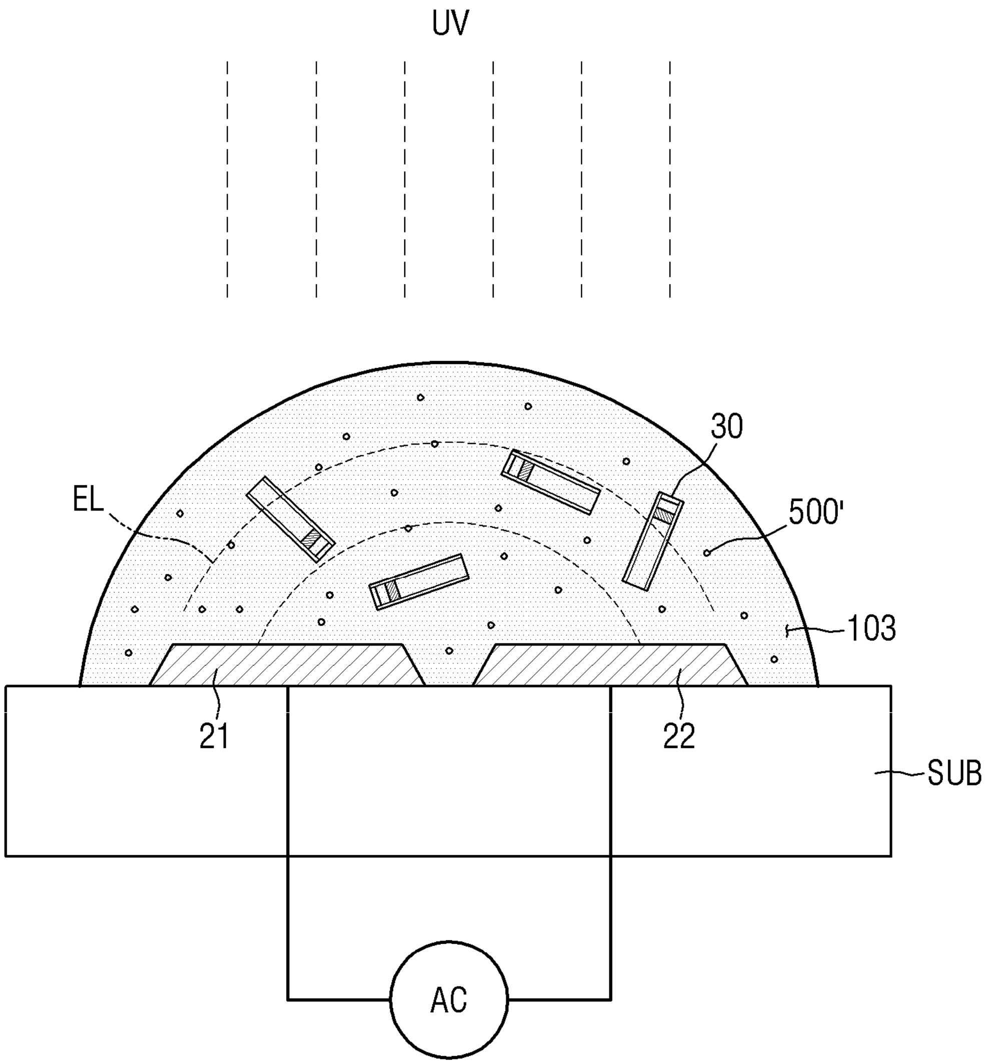
FIG. 39 is a cross-sectional view illustrating one or more acts of a method for manufacturing a display device according to one or more embodiments.

FIG. 39 is a cross-sectional view illustrating a part of a method for manufacturing a display device according to one or more embodiments.

As described above, an operation of decomposing the photodegradable thickener 500 into a plurality of fragment molecules 500' by irradiating light UV to a light-emitting element ink 1001 and an operation of mounting light-emitting elements 30 on electrodes 21 and 22 by generating an electric field EL may be simultaneously (or concurrently) performed in one process.

Referring to FIG. 39, an alignment signal may be transmitted through the electrodes 21 and 22 while the light UV is irradiated to the light-emitting element ink 1001 sprayed on the electrodes 21 and 22. Accordingly, the photodegradable thickeners 500 may be decomposed into the fragment molecules 500', thereby reducing the viscosity of the light-emitting element ink 1001. At the same time, the light-emitting elements 30 may be mounted on the electrodes 21 and 22 by an electric field EL generated by transmitting the alignment signal to the electrodes 21 and 22. Because the process of mounting the light-emitting elements 30 is performed during the process of irradiating the light UV to the light-emitting element ink 1001, the process time can be shortened.

In one or more embodiments, although not illustrated in the drawing, after the light-emitting elements 30 are mounted, a process of removing an element solvent 103 and the photodegradable thickeners 500 may be performed successively. In one or more embodiments, when the operation of decomposing the photodegradable thickeners 500 is performed through a heat treatment process, the light-emitting elements 30 may be mounted on the electrodes 21 and 22 by transmitting an alignment signal to the electrodes 21 and 22 in the heat treatment process. Accordingly, the efficiency of the process of manufacturing the display device 10 can be improved.

In concluding the detailed description, those skilled in the art will appreciate that many variations and modifications can be made to the present embodiments without substantially departing from the principles of the present disclosure. Therefore, the disclosed embodiments of the present disclosure are used in a generic and descriptive sense only and not for purposes of limitation.

The invention claimed is:

1. A light-emitting element solvent dispersing semiconductor crystals, the light-emitting element solvent comprising:

a photodegradable functional group in which at least one chemical bond is capable of being decomposed by irradiated light and a first functional group and a second functional group different from each other and bonded to the photodegradable functional group, wherein the at least one chemical bond of the photodegradable functional group is capable of being decomposed by the irradiated light to form at least one photodegraded fragment, wherein the first functional group and the second functional group are each independently represented by Chemical Formula 1, and wherein the light-emitting element solvent is any one of compounds represented by Chemical Formulae 2 through 5:

Chemical Formula 1

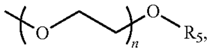

wherein n is an integer of 1 to 5, a sum of an n value of the first functional group and an n value of the second functional group is in a range of 2 to 6, and $R_5$ is any one selected from a C1-C5 alkyl group, a C2-C5 alkenyl group, a C2-C5 alkynyl group, a C1-C5 alkyl ether group, and a C2-C5 alkenyl ether group, and Chemical Formula 2

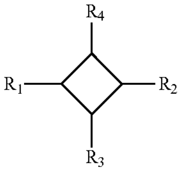

Chemical Formula 3

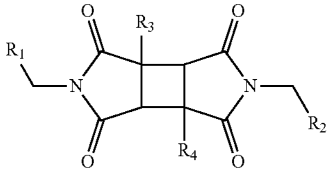

Chemical Formula 4

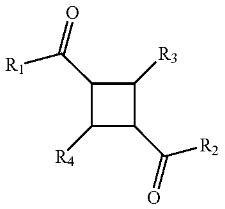

Chemical Formula 5

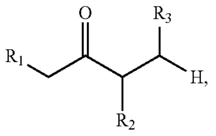

and wherein $R_1$ and $R_2$ are represented by Chemical Formula 1, a sum of an n value in Chemical Formula 1 of $R_1$ and an n value in Chemical Formula 1 of $R_2$ is in a range of 2 to 6, and $R_3$ and $R_4$ are each independently any one selected from a C1-C10 alkyl group, a C2-C10 alkenyl group, a C2-C10 alkynyl group, a C1-C10 alkyl ether group, and a C2-C10 alkenyl ether group.

2. The light-emitting element solvent of claim 1, being a compound represented by Chemical Formula 6:

Chemical Formula 6

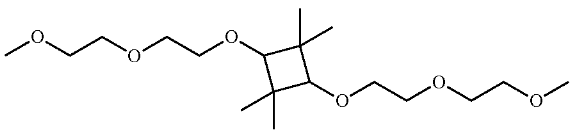

3. The light-emitting element solvent of claim 1, wherein a first element solvent is represented by Chemical Formulae 2 through 5, and when the first element solvent irradiated with the light, the first element solvent forms a second element solvent comprising the at least one photodegraded fragment.

4. The light-emitting element solvent of claim 3, wherein the at least one photodegraded fragment is bonded to one selected from the first functional group and the second functional group.

5. The light-emitting element solvent of claim 3, wherein a molecular weight of the second element solvent is 50% or less of a molecular weight of the first element solvent.

6. The light-emitting element solvent of claim 5, wherein the first element solvent has a viscosity of 7 to 15 cp, and the second element solvent has a viscosity of 5 cp or less.

7. A light-emitting element ink comprising:

a light-emitting element comprising a semiconductor crystal and an insulating film around an outer peripheral surface of the semiconductor crystal; and a light-emitting element solvent in which one or more light-emitting elements are dispersed, wherein the light-emitting element solvent comprises:

a photodegradable functional group in which at least one chemical bond is capable of being decomposed by irradiated light; and a first functional group and a second functional group bonded to the photodegradable functional group and each independently represented by Chemical Formula 1, and the light-emitting element solvent is any one of compounds represented by Chemical Formulae 2 through 5:

Chemical Formula 1

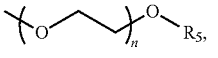

wherein n is an integer of 1 to 5, a sum of an n value of the first functional group and an n value of the second functional group is in a range of 2 to 6, and $R_5$ is any one selected from a C1-C5 alkyl group, a C2-C5 alkenyl group, a C2-C5 alkynyl group, a C1-C5 alkyl ether group, and a C2-C5 alkenyl ether group, and Chemical Formula 2

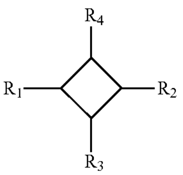

Chemical Formula 3

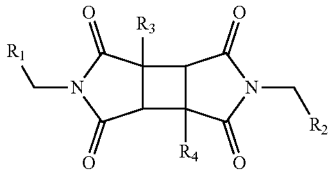

-continued

Chemical Formula 4

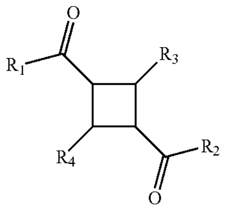

Chemical Formula 5

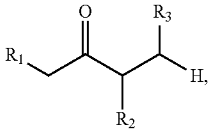

wherein $R_1$ and $R_2$ are represented by Chemical Formula 1, a sum of an n value in Chemical Formula 1 of $R_1$ and an n value in Chemical Formula 1 of $R_2$ is in a range of 2 to 6, and $R_3$ and $R_4$ are each independently any one selected from a C1-C10 alkyl group, a C2-C10 alkenyl group, a C2-C10 alkynyl group, a C1-C10 alkyl ether group, and a C2-C10 alkenyl ether group.

8. The light-emitting element ink of claim 7, wherein the light-emitting element solvent is a compound represented by Chemical Formula 6:

Chemical Formula 6

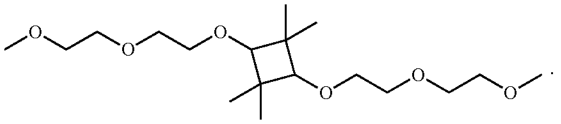

9. The light-emitting element ink of claim 7, wherein the at least one chemical bond of the photodegradable functional group of the light-emitting element solvent is capable of being decomposed by the irradiated light to form at least one photodegraded fragment, and the at least one photodegraded fragment is bonded to at least one of the first functional group or the second functional group.

10. The light-emitting element ink of claim 9, wherein a viscosity of the light-emitting element solvent is reduced as the at least one chemical bond of the photodegradable functional group is decomposed by the irradiated light.

11. The light-emitting element ink of claim 10, wherein the semiconductor crystal comprises:

a first semiconductor layer doped with a first conductivity type;

a second semiconductor layer doped with a second conductivity type having a different polarity from the first conductivity type; and an active layer between the first semiconductor layer and the second semiconductor layer.

* * * * *